(12) United States Patent
Lee et al.

(10) Patent No.: US 11,996,497 B2
(45) Date of Patent: May 28, 2024

(54) PIXEL AND DISPLAY DEVICE INCLUDING THE SAME

(71) Applicant: Samsung Display Co., Ltd., Yongin-si (KR)

(72) Inventors: Hyun Wook Lee, Yongin-si (KR); Ki Bum Kim, Yongin-si (KR); Jin Taek Kim, Yongin-si (KR); Seung Min Lee, Yongin-si (KR); Kwang Taek Hong, Yongin-si (KR); Jung Eun Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 533 days.

(21) Appl. No.: 17/156,253

(22) Filed: Jan. 22, 2021

(65) Prior Publication Data
US 2021/0359167 A1 Nov. 18, 2021

(30) Foreign Application Priority Data
May 13, 2020 (KR) .................. 10-2020-0057362

(51) Int. Cl.
*H01L 33/38* (2010.01)
*H01L 27/15* (2006.01)

(52) U.S. Cl.
CPC .......... *H01L 33/387* (2013.01); *H01L 27/156* (2013.01)

(58) Field of Classification Search
CPC . H01L 27/156; H01L 25/167; H01L 25/0753; H01L 33/62; H01L 33/387; H01L 24/32; H01L 27/124; H10K 59/122; H10K 59/173
See application file for complete search history.

(56) References Cited

U.S. PATENT DOCUMENTS

| 10,249,603 | B2 | 4/2019 | Cho et al. |
| 2018/0012876 | A1 | 1/2018 | Kim et al. |
| 2022/0005979 | A1* | 1/2022 | Kang ..................... H01L 27/156 |
| 2022/0278253 | A1* | 9/2022 | Yang ....................... H01L 33/62 |
| 2023/0033767 | A1* | 2/2023 | Yang ....................... H01L 33/20 |

FOREIGN PATENT DOCUMENTS

| KR | 10-2018-0007025 A | 1/2018 |
| KR | 10-1987196 B1 | 6/2019 |

* cited by examiner

*Primary Examiner* — Latanya N Crawford Eason
(74) *Attorney, Agent, or Firm* — Lewis Roca Rothgerber Christie LLP

(57) ABSTRACT

A pixel includes a first electrode; a second electrode surrounding at least a portion of the first electrode; a plurality of light emitting elements between the first electrode and the second electrode; a first contact electrode on the first electrode, the first contact electrode electrically connecting the first electrode and the plurality of light emitting elements; a second contact electrode on the second electrode, the second contact electrode electrically connecting the second electrode and the plurality of light emitting elements; and an intermediate electrode on the first electrode and the second electrode, the intermediate electrode comprising a first area overlapping the first electrode and a second area overlapping the second electrode, the first area and the second area being integrally connected to each other.

20 Claims, 26 Drawing Sheets

PIXEL AND DISPLAY DEVICE INCLUDING THE SAME

CROSS-REFERENCE TO RELATED APPLICATION

This application claims priority to and the benefit of Korean patent application 10-2020-0057362 filed on May 13, 2020, in the Korean Intellectual Property Office, the entire disclosure of which is incorporated herein by reference.

BACKGROUND

1. Field

The present disclosure generally relates to a pixel and a display device including the same.

2. Related Art

With the increased interest in information displays and the high demand for portable information media, display devices have been in high demand, and commercialization of display devices has been intensified.

SUMMARY

One or more embodiments of the present disclosure provide a pixel having a light emitting unit constituting a plurality of serial stages.

One or more embodiments of the present disclosure also provide a pixel capable of improving light output efficiency of light emitting elements and a display device including the pixel.

In accordance with one or more example embodiments of the present disclosure, there is provided a pixel including: a first electrode; a second electrode surrounding at least a portion of the first electrode; a plurality of light emitting elements between the first electrode and the second electrode; a first contact electrode on the first electrode, the first contact electrode electrically connecting the first electrode and the plurality of light emitting elements; a second contact electrode on the second electrode, the second contact electrode electrically connecting the second electrode and the plurality of light emitting elements; and an intermediate electrode on the first electrode and the second electrode, the intermediate electrode including a first area overlapping the first electrode and a second area overlapping the second electrode, the first area and the second area being integrally connected to each other.

The first contact electrode, the second contact electrode, and the intermediate electrode may be spaced from each other. The intermediate electrode may be provided at a same layer as the first and second contact electrodes or may be provided in a layer different from that of the first and second contact electrodes.

The first electrode may have a quadrangular shape including a first side, a second side, a third side and a fourth side. The second electrode may include a (2-1)th electrode adjacent to the first side of the first electrode, a (2-2)th electrode adjacent to the second side of the first electrode, a (2-3)th electrode adjacent to the third side of the first electrode, and a (2-4)th electrode adjacent to the fourth side of the first electrode.

The second electrode may have a quadrangular ring shape and surrounds the first to fourth sides of the first electrode and has at least an opening.

The (2-1)th electrode and the (2-4)th electrode may be spaced from each other.

The (2-2)th electrode and the (2-3)th electrode may be spaced from each other.

The (2-1)th electrode and the (2-2)th electrode may be spaced from each other, the (2-3)th electrode and the (2-4)th electrode may be spaced from each other, the (2-1)th electrode and the (2-4)th electrode may be connected to each other, and the (2-2)th electrode and the (2-3)th electrode may be connected to each other.

The intermediate electrode may include a first intermediate electrode, a second intermediate electrode, and a third intermediate electrode that are spaced from each other. Each of the first intermediate electrode, the second intermediate electrode, and the third intermediate electrode may overlap with one area of the first electrode and one area of the second electrode.

The first intermediate electrode may include a first area corresponding to the first side of the first electrode and a second area corresponding to the (2-2)th electrode, the second intermediate electrode may include a first area corresponding to the second side of the first electrode and a second area corresponding to the (2-3)th electrode, and the third intermediate electrode may include a first area corresponding to the third side of the first electrode and a second area corresponding to the (2-4)th electrode.

In a plan view, the first intermediate electrode may overlap with each of the first side of the first electrode, a first corner part at which the first side and the second side of the first electrode are in contact with each other, and the (2-2)th electrode. In a plan view, the second intermediate electrode may overlap with each of the second side of the first electrode, a second corner part at which the second side and the third side of the first electrode are in contact with each other, and the (2-3)th electrode. In a plan view, the third intermediate electrode may overlap with each of the third side of the first electrode, a third corner part at which the third side and the fourth side of the first electrode are in contact with each other, and the (2-4)th electrode.

The first contact electrode may overlap with the fourth side of the first electrode, and the second contact electrode may overlap with the (2-1)th electrode.

The pixel may further include an insulating layer over the first and second electrodes. The insulating layer may include a first opening exposing one area of the first electrode, which corresponds to the fourth side of the first electrode, and a second opening exposing one area of the (2-1)th electrode.

The insulating layer may cover an other area of the first electrode, which corresponds to each of the first to third sides of the first electrode, the (2-2)th electrode, the (2-3)th electrode, and the (2-4)th electrode.

The light emitting elements may include: a plurality of first light emitting elements located between the first side of the first electrode and the (2-1)th electrode; a plurality of second light emitting elements located between the second side of the first electrode and the (2-2)th electrode; a plurality of third light emitting elements located between the third side of the first electrode and the (2-3)th electrode; and a plurality of fourth light emitting elements located between the fourth side of the first electrode and the (2-4)th electrode.

The first light emitting elements may constitute a first serial stage connected in parallel between the first side of the first electrode and the (2-1)th electrode, the second light emitting elements may constitute a second serial stage connected in parallel between the second side of the first electrode and the (2-2)th electrode, the third light emitting elements may constitute a third serial stage connected in parallel between the third side of the first electrode and the (2-3)th electrode, and the fourth light emitting elements may constitute a fourth serial stage connected in parallel between the fourth side of the first electrode and the (2-4)th electrode.

In a plan view, the plurality of light emitting elements may be placed along a periphery of the first electrode between the first electrode and the second electrode.

The first electrode may have a hexagonal shape including a first side, a second side, a third side, a fourth side, a fifth side, and a sixth side. The second electrode may include: a (2-1)th electrode adjacent to the first side of the first electrode; a (2-2)th electrode adjacent to the second side of the first electrode; a (2-3)th electrode adjacent to the third side of the first electrode; a (2-4)th electrode adjacent to the fourth side of the first electrode; a (2-5)th electrode adjacent to the fifth side of the first electrode; and a (2-6)th electrode adjacent to the sixth side of the first electrode.

The light emitting elements may include: at least one first light emitting element between the first side of the first electrode and the (2-1)th electrode; at least one second light emitting element between the second side of the first electrode and the (2-2)th electrode; at least one third light emitting element between the third side of the first electrode and the (2-3)th electrode; at least one fourth light emitting element between the fourth side of the first electrode and the (2-4)th electrode; at least one fifth light emitting element between the fifth side of the first electrode and the (2-5)th electrode; and at least one sixth light emitting element between the sixth side of the first electrode and the (2-6)th electrode.

In accordance with another aspect of the present disclosure, there is provided a display device including: a substrate including a plurality of pixel areas; and a pixel in each of the pixel areas, the pixel including: a first electrode on the substrate and a second electrode surrounding at least a portion of the first electrode; a plurality of light emitting elements between the first electrode and the second electrode; a first contact electrode on the first electrode, the first contact electrode electrically connecting the first electrode and the light emitting elements; a second contact electrode on the second electrode, the second contact electrode electrically connecting the second electrode and the light emitting elements; and an intermediate electrode on the first and second electrodes, the intermediate electrode including a first area overlapping the first electrode and a second area overlapping the second electrode, the first area and the second area being integrally connected to each other, and the first contact electrode, the second contact electrode, and the intermediate electrode being provided at a same layer.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
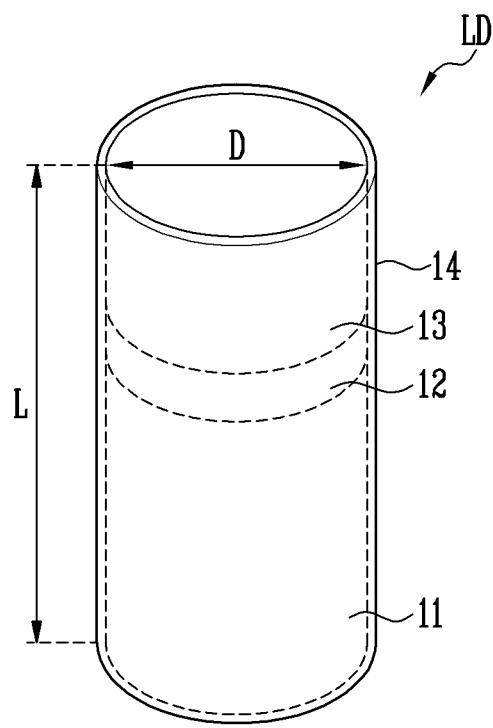
FIG. 1 is a perspective view schematically illustrating a light emitting element in accordance with one or more example embodiments of the present disclosure.

The present disclosure may apply various changes and different shape, therefore only illustrate in details with particular examples. However, the examples do not limit to certain shapes but apply to all the change and equivalent material and replacement. The drawings included are illustrated a fashion where the figures are expanded for the better understanding.

Like numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

In this disclosure, it will be understood that, when an element (for example, a first element) is "(operatively or communicatively) coupled with/to" or "connected to" another element (for example, a second element), the element may be directly coupled with/to another element, and there may be an intervening element (for example, a third element) between the element and another element. To the contrary, it will be understood that, when an element (for example, a first element) is "directly coupled with/to" or "directly connected to" another element (for example, a second element), there is no intervening element (for example, a third element) between the element and another element.

Hereinafter, example embodiments of the present disclosure and items required for those skilled in the art to easily understand the content of the present disclosure will be described in detail with reference to the accompanying drawings. In the following description, singular forms in the present disclosure are intended to include the plural forms as well, unless the context clearly indicates otherwise.

Figure 2:
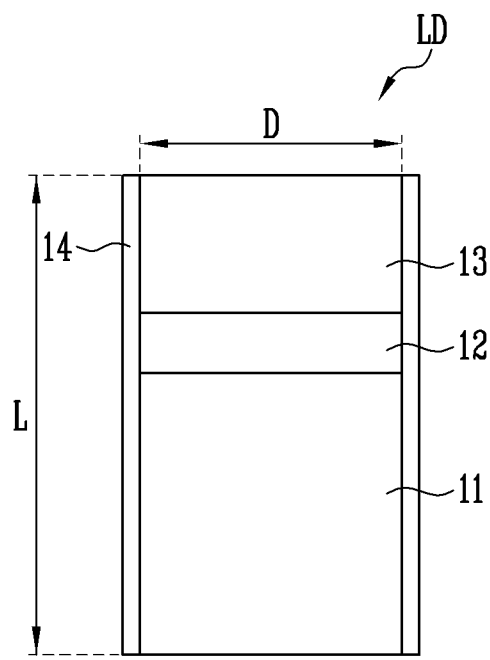
FIG. 2 is a sectional view of the light emitting element shown in FIG. 1.
Figure 3:
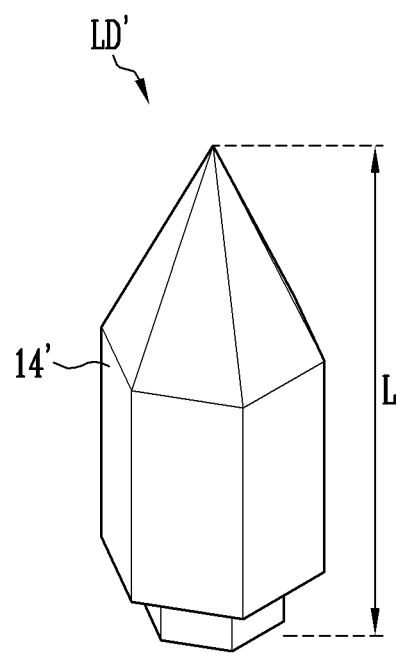
FIG. 3 is a perspective view schematically illustrating a light emitting element in accordance with another example embodiment of the present disclosure.
Figure 4:
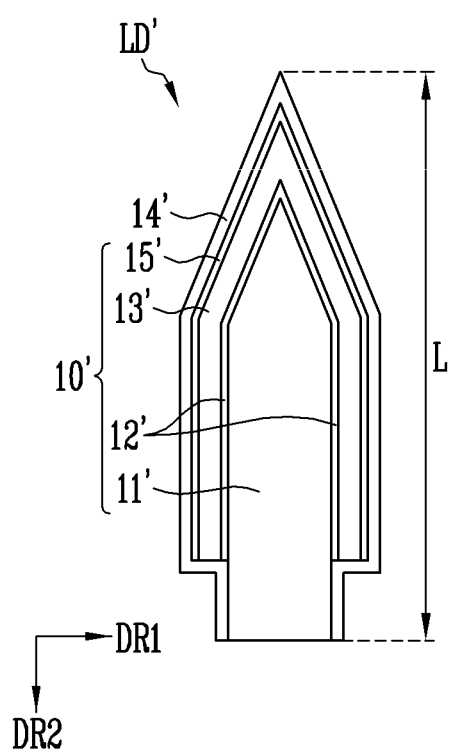
FIG. 4 is a sectional view of the light emitting element shown in FIG. 3.

FIG. 1 is a perspective view schematically illustrating a light emitting element in accordance with one or more example embodiments of the present disclosure. FIG. 2 is a sectional view of the light emitting element shown in FIG. 1. FIG. 3 is a perspective view schematically illustrating a light emitting element in accordance with another example embodiment of the present disclosure. FIG. 4 is a sectional view of the light emitting element shown in FIG. 3.

In one or more example embodiments of the present disclosure, kinds and/or shapes of the light emitting elements are not limited to the embodiments shown in FIGS. 1-4.

Referring to FIGS. 1-4, each light emitting element LD may include a first semiconductor layer 11, a second semiconductor layer 13, and an active layer 12 interposed between the first and second semiconductor layers 11 and 13. In some example embodiments, the light emitting element LD may implement a light emitting stack structure in which the first semiconductor layer 11, the active layer 12, and the second semiconductor layer 13 are sequentially stacked.

The light emitting element LD may be provided in a shape extending in one direction. When assuming that an extending direction of the light emitting element LD is a length direction, the light emitting element LD may include one end portion (or lower end portion) and the other end portion (or upper end portion) along the extending direction. Any one of the first and second semiconductor layers 11 and 13 may be disposed at the one end portion (or lower end portion) of the light emitting element LD, and the other one of the first and second semiconductor layers 11 and 13 may be disposed at the other end portion (or upper end portion) of the light emitting element LD. In one or more example embodiments, the first semiconductor layer 11 may be disposed at the one end portion (or lower end portion) of the light emitting element LD, and the second semiconductor layer 13 may be disposed at the other end portion (or upper end portion) of the light emitting element LD.

The light emitting element LD may be provided in various shapes. In one or more example embodiments, the light emitting element LD may have a rod-like shape or a bar-like shape, which is long in its length direction (i.e., its aspect ratio is greater than 1). In some embodiments of the present disclosure, a length L of the light emitting element LD in the length direction may be greater than a diameter D (or a width of a cross-section) of the light emitting element LD. The light emitting element LD may include, for example, a light emitting diode (LED) fabricated small enough to have a diameter D and/or a length L to a degree of a nano-scale to a micro-scale.

The diameter D of the light emitting element LD may be about 0.5 μm to 500 μm, and the length L of the light emitting element LD may be about 1 μm to 10 μm. However, the diameter D and the length L of the light emitting element LD are not limited thereto, and the size of the light emitting element LD may be modified to be suitable for requirements (or design conditions) of a lighting device or a self-luminescent display device, to which the light emitting element LD is applied.

The first semiconductor layer 11 may include, for example, at least one n-type semiconductor layer. For example, the first semiconductor layer 11 may include any one semiconductor material from among InAlGaN, GaN, AlGaN, InGaN, AlN, and InN, and may include an n-type semiconductor layer doped with a first conductive dopant (or n-type dopant) such as Si, Ge, or Sn. However, the material constituting the first semiconductor layer 11 is not limited thereto. In some embodiments, the first semiconductor layer 11 may be configured with various materials. In some embodiments of the present disclosure, the first semiconductor layer 11 may include a gallium nitride (GaN) semiconductor material doped with the first conductive dopant (or n-type dopant). The first semiconductor layer 11 may include an upper surface in contact with the active layer 12 and a lower surface exposed to the outside along the length L direction of the light emitting element LD. The lower surface of the first semiconductor layer 11 may be the one end portion (or lower end portion) of the light emitting element LD.

The active layer 12 is formed on the first semiconductor layer 11, and may be formed in a single or multiple quantum well structure. In one or more example embodiments, when the active layer 12 is formed in the multiple quantum well structure, a barrier layer (not shown), a strain reinforcing layer, and a well layer, which constitute one unit, may be periodically and repeatedly stacked in the active layer 12. The strain reinforcing layer may have a lattice constant smaller than that of the barrier layer, to further reinforce strain, e.g., compressive strain applied to the well layer. However, the structure of the active layer 12 is not limited to the above-described embodiment.

The active layer 12 may emit light having a wavelength of 400 nm to 900 nm, and may use a double hetero structure. In some embodiments of the present disclosure, a clad layer (not shown) doped with a conductive dopant may be formed on the top and/or the bottom of the active layer 12 along the length L direction of the light emitting element LD. In some example embodiments, the clad layer may be formed as an AlGaN layer or InAlGaN layer. In some embodiments, a material such as AlGaN or AlInGaN may be used to form the active layer 12. In some embodiments, the active layer 12 may be configured with various materials. The active layer 12 may include a first surface in contact with the first semiconductor layer 11 and a second surface in contact with the second semiconductor layer 13.

When an electric field having a voltage (e.g., a set or predetermined voltage) or more is applied between the end portions of the light emitting element LD, the light emitting element LD emits light as electron-hole pairs are combined in the active layer 12. The light emission of the light emitting element LD is controlled by using such a principle, so that the light emitting element LD can be used as a light source (or light emitting source) for various light emitting apparatuses, including a pixel of a display device.

The second semiconductor layer 13 is formed on the second surface of the active layer 12, and may include a semiconductor layer having a type different from that of the first semiconductor layer 11. For example, the second semiconductor layer 13 may include at least one p-type semiconductor material. For example, the second semiconductor layer 13 may include at least one semiconductor material from among InAlGaN, GaN, AlGaN, InGaN, AlN, and InN, and may include a p-type semiconductor layer doped with a second conductive dopant (or p-type dopant) such as Mg. However, the material constituting the second semiconductor layer 13 is not limited thereto. In some embodiments, the second semiconductor layer 13 may be configured with various materials. In some embodiments of the present disclosure, the second semiconductor layer 13 may include a gallium nitride (GaN) semiconductor material doped with the second conductive dopant (or p-type dopant). The second semiconductor layer 13 may include a lower surface in contact with the second surface of the active layer 12 and an upper surface exposed to the outside along the length L direction of the light emitting element LD. The upper surface of the second semiconductor layer 13 may be the other end portion (or upper end portion) of the light emitting element LD.

In some embodiments of the present disclosure, the first semiconductor layer 11 and the second semiconductor layer 13 may have different thicknesses in the length L direction of the light emitting element LD. For example, the first semiconductor layer 11 may have a thickness relatively thicker than that of the second semiconductor layer 13 along the length L direction of the light emitting element LD. Accordingly, the active layer 12 of the light emitting element LD may be located more adjacent to the upper surface of the second semiconductor layer 13 than the lower surface of the first semiconductor layer 11.

Although it is illustrated that each of the first semiconductor layer 11 and the second semiconductor layer 13 is configured with one layer, the present disclosure is not limited thereto. In some embodiments of the present disclosure, each of the first semiconductor layer 11 and the second semiconductor layer 13 may further include at least one layer, e.g., a clad layer and/or a Tensile Strain Barrier Reducing (TSBR) layer according to the material of the active layer 12. The TSBR layer may be a strain reducing layer disposed between semiconductor layers having different lattice structures to perform a buffering function for reducing a lattice constant difference. The TSBR may be configured with a p-type semiconductor layer such as p-GAlnP, p-AlInP or p-AlGaInP, but the present disclosure is not limited thereto.

In some embodiments, the light emitting element LD may further include an additional electrode (not shown) (hereinafter, referred to as a 'first additional electrode') disposed on the top of the second semiconductor layer 13, in addition to the first semiconductor layer 11, the active layer 12, and the second semiconductor layer 13, which are described above. In some other embodiments, the light emitting element LD may further include another additional electrode (not shown) (hereinafter, referred to as a 'second additional electrode') disposed at one end (e.g., a lower end) of the first semiconductor layer 11.

Each of the first and second additional electrodes may be an ohmic contact electrode, but the present disclosure is not limited thereto. In some embodiments, each of the first and second additional electrodes may be a Schottky contact electrode. The first and second additional electrodes may include a conductive material (or substance). For example, the first and second additional electrodes may include an opaque metal using one or mixture of chromium (Cr), titanium (Ti), aluminum (Al), gold (Au), nickel (Ni), and any oxide or alloy thereof, but the present disclosure is not limited thereto. In some embodiments, the first and second additional electrodes may include a transparent conductive oxide such as indium tin oxide (ITO), indium zinc oxide (IZO), zinc oxide (ZnO), indium gallium zinc oxide (ITZO), or indium tin zinc oxide (ITZO).

Materials respectively included in the first and second additional electrodes may be identical to or different from each other. The first and second additional electrodes may be substantially transparent or translucent. Accordingly, light generated in the light emitting element LD can be emitted to the outside of the light emitting element LD by passing through the first and second additional electrodes. In some embodiments, when light generated in the light emitting element LD does not pass through the first and second additional electrodes and is emitted to the outside of the light emitting element LD through an area except both the end portions of the light emitting element LD, the first and second additional electrodes may include an opaque metal.

In some embodiments of the present disclosure, the light emitting element LD may further include an insulative film 14. However, in some embodiments, the insulative film 14 may be omitted, and may be provided to cover only portions of the first semiconductor layer 11, the active layer 12, and the second semiconductor layer 13.

The insulative film 14 can prevent an electrical short circuit that may occur when the active layer 12 is in contact with a conductive material except the first semiconductor layer 11 and the second semiconductor layer 13. Also, the insulative film 14 reduces or minimizes a surface defect of the light emitting element LD, thereby improving the lifespan and light emission efficiency of the light emitting element LD. Also, when a plurality of light emitting elements LD are densely disposed, the insulative film 14 can prevent an unwanted short circuit that may occur between the light emitting elements LD. Whether the insulative film is provided is not limited as long as the active layer 12 can prevent occurrence of a short circuit with external conductive material.

The insulative film 14 may be provided in a shape entirely surrounding the outer periphery (or outer circumference) of the light emitting stack structure including the first semiconductor layer 11, the active layer 12, and the second semiconductor layer 13.

Although a case where the insulative film 14 is provided in a shape entirely surrounding the outer periphery (or outer circumference) of each of the first semiconductor layer 11, the active layer 12, and the second semiconductor layer 13 is described in the above-described embodiment, the present disclosure is not limited thereto. In some embodiments, when the light emitting element LD includes the first additional electrode, the insulative film 14 may entirely surround the outer periphery (or outer circumference) of each of the first semiconductor layer 11, the active layer 12, the second semiconductor layer 13, and the first additional electrode. In some other embodiments, the insulative film 14 may not entirely surround the outer periphery (or outer circumference) of the first additional electrode, or may surround only a portion of the outer periphery (or outer circumference) of the first additional electrode and may not surround the of the outer periphery (or outer circumference) of the first additional electrode. In some embodiments, when the first additional electrode is disposed at the other end portion (or upper end portion) of the light emitting element LD and the second additional electrode is disposed at one end portion (or the lower end portion) of the light emitting element LD, the insulative film 14 may expose at least one area of each of the first and second additional electrodes.

The insulative film 14 may include a transparent insulating material. For example, the insulative film 14 may include at least one insulating material selected from the group consisting of silicon oxide (SiOx), silicon nitride (SiNx), silicon oxynitride (SiON), aluminum oxide (AlOx), titanium dioxide ($TiO_2$), and the like. However, the present disclosure is not limited thereto, and various materials having insulating properties may be used as the material of the insulative film 14.

In some embodiments, the light emitting element LD' may include a light emitting pattern 10' having a core-shell structure as shown in FIGS. 3 and 4. The first semiconductor layer 11' may be located at a core, i.e., the middle (or center) of the light emitting element LD', the active layer 12' may be provided and/or formed in a shape surrounding the outer periphery (or outer circumference) of the first semiconductor layer 11' in the length L direction of the light emitting element LD', and the second semiconductor layer 13' may be provided and/or formed in a shape surrounding the active layer 12' in the length L direction of the light emitting element LD'. Also, the light emitting element LD' may further include an additional electrode (not shown) surrounding at least one side of the second semiconductor layer 13'. In some embodiments, the light emitting element LD' may further include an insulative film which is provided on the outer periphery (or outer circumference) of the light emitting pattern 10' having the core-shell structure and includes a transparent insulating material. The light emitting element LD' including the light emitting pattern 10' having the core-shell structure may be manufactured through a growth process.

The above-described light emitting element LD or LD' may be used as a light emitting source for various display devices. The light emitting element LD or LD' may be fabricated through a surface treatment process. For example, when a plurality of light emitting elements LD or LD' are mixed in a liquid solution (or solvent) to be supplied to each pixel area (e.g., a light emitting area of each pixel or a light emitting area of each sub-pixel), each light emitting element LD or LD' may be surface-treated such that the light emitting elements LD or LD' are not unequally condensed in the solution but equally dispersed in the solution.

A light emitting unit (or light emitting apparatus) including the above-described light emitting element LD or LD' may be used in various types of devices that require a light source, including a display device. When a plurality of light emitting elements LD or LD' are disposed in a light emitting area of each pixel of a display panel, the light emitting elements LD or LD' may be used as a light source of the pixel. However, the application field of the light emitting element LD or LD' is not limited to the above-described example. For example, the light emitting element LD or LD' may be used for other types of devices that require a light source, such as a lighting device.

Figure 5:
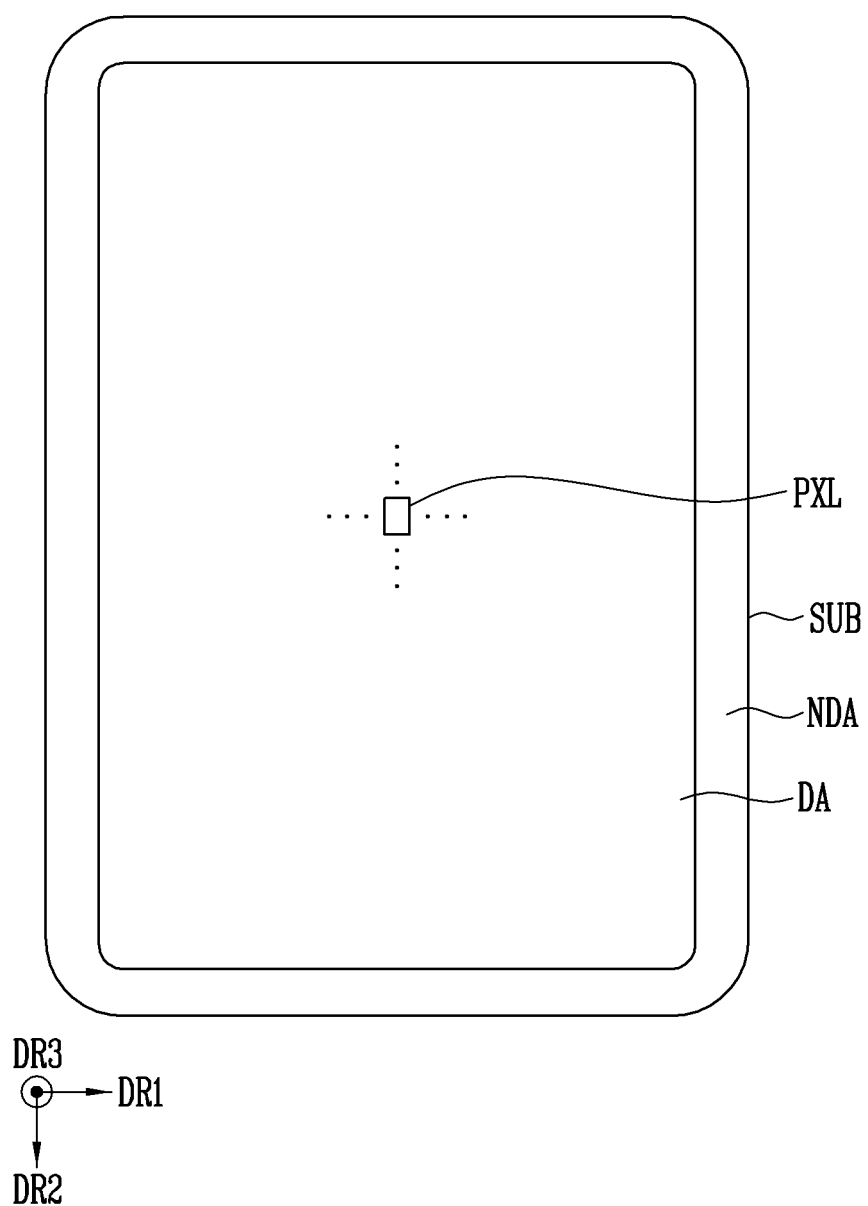
FIG. 5 illustrates a display device in accordance with one or more example embodiments of the present disclosure, and particularly, is a schematic plan view of a display device using, as a light source, any one light emitting element from among the light emitting elements shown in FIGS. 1-4.

FIG. 5 illustrates a display device in accordance with one or more example embodiments of the present disclosure, and particularly, is a schematic plan view of a display device using, as a light source, any one light emitting element from among the light emitting elements shown in FIGS. 1-4.

In FIG. 5, for convenience, a structure of the display device is briefly illustrated based on a display area DA in which an image is displayed.

Referring to FIGS. 1-5, the display device in accordance with one or more example embodiments of the present disclosure may include a substrate SUB, a plurality of pixels PXL that are provided on the substrate SUB, each pixel PXL including at least one light emitting element LD, a driving unit provided on the substrate SUB to drive the pixels PXL, and a line unit to connect the pixels PXL and the driving unit.

The present disclosure may be applied as long as the display device is an electronic device in which a display surface is applied to at least one surface thereof, such as a smartphone, a television, a tablet personal computer (PC), a mobile phone, a video phone, an electronic book reader, a desktop PC, a laptop PC, a netbook computer, a workstation, a server, a personal digital assistant (PDA), a portable multimedia player (PMP), an MP3 player, a medical device, a camera, or a wearable device.

The display device may be classified into a passive matrix type display device and an active matrix type display device according to a method of driving the light emitting element LD. In some example embodiments, when the display device is implemented as the active matrix type display device, each of the pixels PXL may include a driving transistor for controlling an amount of current supplied to the light emitting element LD, a switching transistor for transferring a data signal to the driving transistor, and the like.

The display device may be provided in various shapes. In some example embodiments, the display device may be provided in a rectangular plate shape having two pairs of sides parallel to each other, but the present disclosure is not limited thereto. When the display device is provided in the rectangular plate shape, any one pair of sides from among the two pairs of sides may be provided longer than the other pair of sides. For convenience, a case where the display device is provided in a rectangular shape having a pair of long sides and a pair of short sides is illustrated. An extending direction of the long sides is represented as a second direction DR2, an extending direction of the short sides is represented as a first direction DR1, and a direction perpendicular to the extending directions of the long sides and the short sides is represented as a third direction DR3. In the display device provided in the rectangular plate shape, a corner portion at which one long side and one short side are in contact with (or meet) each other may have a round shape.

The substrate SUB may include the display area DA and a non-display area NDA.

The display area DA may be an area in which the pixels PXL for displaying an image are provided. The non-display area NDA may be an area in which the driving unit for driving the pixels PXL and a portion of the line unit which connects the pixels PXL and the driving unit are provided. For convenience, only one pixel PXL is illustrated in FIG. 5, but a plurality of pixels PXL may be substantially provided in the display area DA of the substrate SUB.

The non-display area NDA may be provided at least one side of the display area DA. The non-display area NDA may surround the display area DA along the edge or periphery (or circumference) of the display area DA. The non-display area NDA may be provided with the line unit connected to the pixels PXL, and the driving unit which is connected to the line part and drives the pixels PXL.

The line unit may electrically connect the driving unit and the pixels PXL. The line unit may be a fan-out line which provides a signal to each pixel PXL and is connected to signal lines, e.g., a scan line, a data line, an emission control line, and the like, which are connected to each pixel PXL. Also, the line unit may be a fan-out line connected to signal lines, e.g., a control line, a sensing line, and the like, which are connected to each pixel PXL, so as to compensate for an electrical characteristic change of each pixel PXL in real time.

The substrate SUB may include a transparent insulating material to enable light to be transmitted therethrough. The substrate SUB may be a rigid substrate or a flexible substrate.

One area on the substrate SUB may be provided as the display area DA such that the pixels PXL are disposed therein, and the other area on the substrate SUB may be provided as the non-display area NDA. In some example embodiments, the substrate SUB may include the display area DA including pixel areas in which the respective pixels PXL are disposed and the non-display area NDA disposed at the periphery of the display area DA (or adjacent to the display area DA).

Each of the pixels PXL may be provided in the display area DA. In some example embodiments of the present disclosure, the pixels PXL may be arranged in a stripe or an RGBG arrangement structure in the display area DA, but the present disclosure is not limited thereto. The RGBG arrangement structure may be referred to as an RGBG matrix structure (e.g., a PENTILE® matrix structure or an RGBG structure (e.g., a PENTILE® structure). PENTILE® is a registered trademark of Samsung Display Co., Ltd., Republic of Korea.

Each pixel PXL may include at least one light emitting element LD driven by a corresponding scan signal and a corresponding data signal. The light emitting element LD may have a size small to a degree of a nano-scale to a micro-scale, and may be connected in parallel to light emitting elements disposed adjacent thereto. However, the present disclosure is not limited thereto. The light emitting element LD may constitute a light source of each pixel PXL.

Each pixel PXL may include at least one light source, e.g., the light emitting element LD driven by a signal (e.g., a set or predetermined signal, e.g., a scan signal and/or a data signal) and/or a power source (e.g., a set or predetermined power source, e.g., a first driving power source and/or a second driving power source). However, in the example embodiments of the present disclosure, the kind of the light emitting element LD which can be used as the light source of the pixel PXL is not limited thereto.

The driving unit provides a signal (e.g., a set or predetermined signal) and a power source (e.g., a set or predetermined power source) to each pixel PXL through the line unit, and accordingly, the driving of the pixel PXL can be controlled. The driving unit may include a scan driver, an emission driver, a data driver, and a timing controller.

Figure 6A:
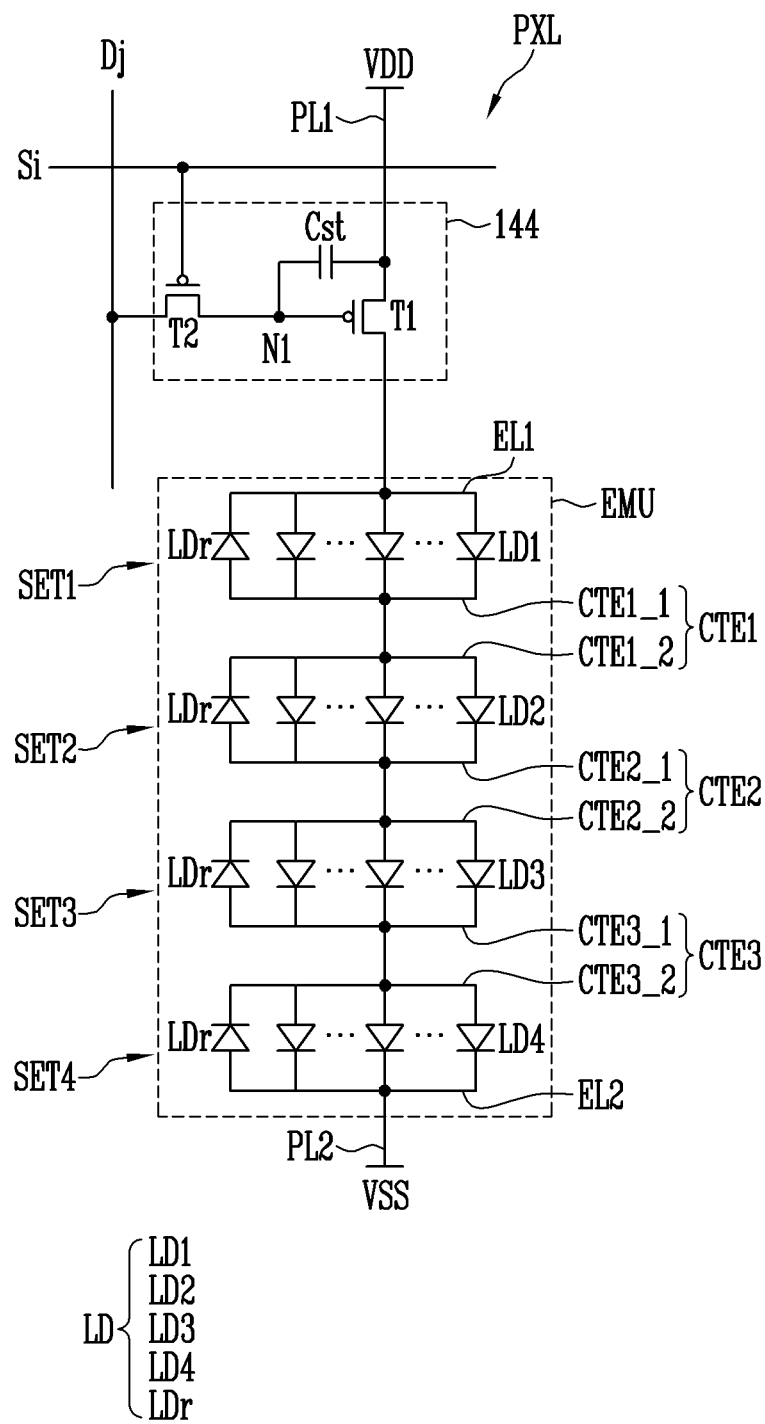
FIGS. 6A-6C are circuit diagrams illustrating various example embodiments of an electrical connection relationship between components included in one pixel shown in FIG. 5.
Figure 6B:
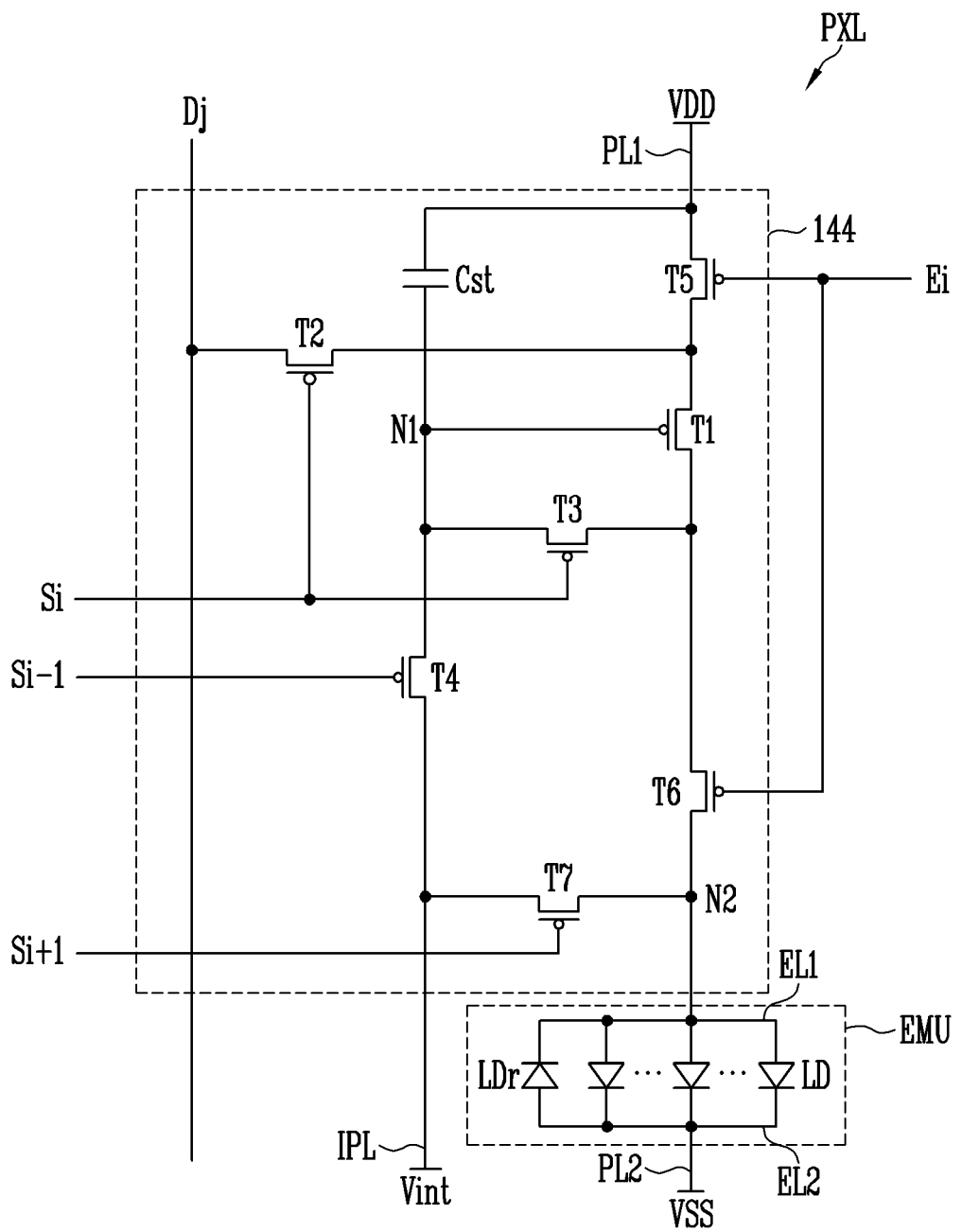
Figure 6C:
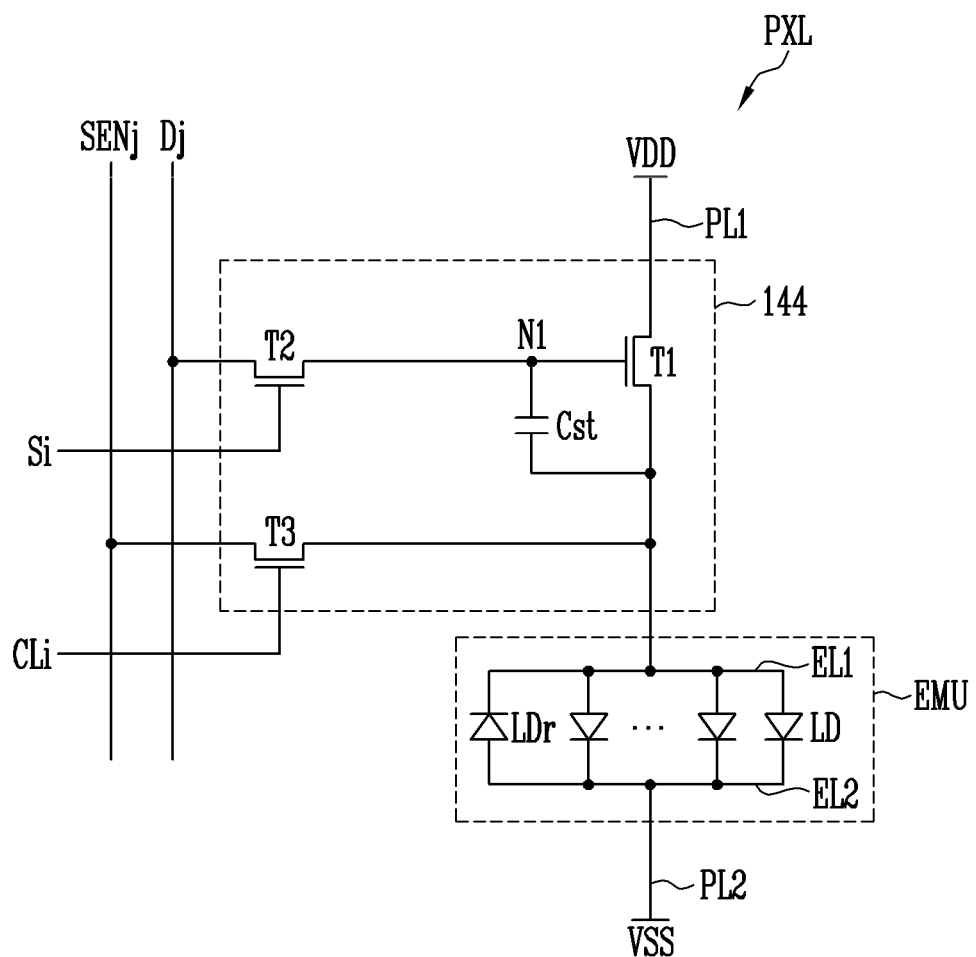

FIGS. 6A-6C are circuit diagrams illustrating various embodiments of an electrical connection relationship between components included in one pixel shown in FIG. 5.

For example, FIGS. 6A-6C illustrate different embodiments of an electrical connection relationship between components included in the pixel PXL applicable to an active display device. However, the kinds of the components included in the pixel PXL to which the embodiments of the present disclosure are applicable are not limited thereto.

In FIGS. 6A to 6C, the pixel PXL comprehensively includes not only components included in each of the pixels shown in FIG. 5 but also an area in which the components are provided.

Referring to FIGS. 1-6C, one pixel PXL (hereinafter, referred to as a 'pixel') may include a light emitting unit EMU which generates light with a luminance corresponding to a data signal. Also, the pixel PXL may selectively further include a pixel circuit 144 for driving the light emitting unit EMU.

The light emitting unit EMU may include a plurality of light emitting elements LD connected in parallel between a first power line PL1 to which a voltage of a first driving power source VDD is applied and a second power line PL2 to which a voltage of a second driving power source VSS is applied. For example, the light emitting unit EMU may include a first electrode EL1 (or "first alignment electrode") connected to the first driving power source VDD via the pixel circuit 144 and the first power line PL1, a second electrode EL2 (or "second alignment electrode") connected to the second driving power source VSS through the second power line PL2, and a plurality of light emitting elements LD connected in parallel in the same direction between the first and second electrodes EL1 and EL2. In some embodiments of the present disclosure, the first electrode EL1 may be an anode electrode, and the second electrode EL2 may be a cathode electrode.

Each of the light emitting elements LD included in the light emitting unit EMU may include one end portion connected to the first driving power source VDD through the first electrode EL1 and the other end portion connected to the second driving power source VSS through the second electrode EL2. The first driving power source VDD and the second driving power source VSS may have different potentials. For example, the first driving power source VDD may be set as a high-potential power source, and the second driving power source VSS may be set as a low-potential power source.

The light emitting elements LD connected in parallel in the same direction between the first electrode EL1 and the second electrode EL2, to which voltages having difference potentials are supplied, may form effective light sources, respectively. The effective light sources may constitute the light emitting unit EMU of the pixel PXL.

Each of the light emitting elements LD of the light emitting unit EMU may emit light with a luminance corresponding to a driving current supplied through a corresponding pixel circuit 144. For example, the pixel circuit 144 may supply, to the light emitting unit EMU, a driving current corresponding to a grayscale value of corresponding frame data during each frame period. The driving current supplied to the light emitting unit EMU may be divided to flow through each of the light emitting elements LD that are connected in parallel. Accordingly, the light emitting unit EMU can emit light with a luminance corresponding to the driving current while each light emitting element LD is emitting light with a luminance corresponding to a current flowing therethrough.

In some embodiments, the light emitting unit EMU may further include at least one ineffective light source, e.g., a reverse light emitting element LDr, in addition to the light emitting elements LD connected in forward direction and forming the respective effective light sources. The reverse light emitting element LDr is connected in parallel together with the light emitting elements LD forming the effective light sources between the first and second electrodes EL1 and EL2, and may be connected between the first and second electrodes EL1 and EL2 in a direction opposite (e.g., a reverse direction) to that in which the light emitting elements LD are connected. Although a driving voltage (e.g., a set or predetermined driving voltage, e.g., a forward driving voltage) is applied between the first and second electrodes EL1 and EL2, the reverse light emitting element LDr maintains an inactive state (e.g., reverse biased state), and accordingly, no current substantially flows through the reverse light emitting element LDr.

The pixel circuit 144 may be connected to a scan line Si and a data line Dj of a corresponding pixel PXL. In an example, when assuming that a pixel PXL is disposed in an ith (i is a natural number) row and a jth (j is a natural number) column of the display area DA, the pixel circuit 144 of the pixel PXL may be connected to an ith scan line Si and a jth data line Dj of the display area DA. In some embodiments, the pixel circuit 144 may include first and second transistors T1 and T2 and a storage capacitor Cst. However, the structure of the pixel circuit 144 is not limited to the embodiments shown in FIGS. 6A-6C.

First, referring to FIG. 6A, the pixel circuit 144 may include first and second transistors T1 and T2 and a storage capacitor Cst.

A first terminal of the second transistor T2 (e.g., a switching transistor) may be connected to the jth data line Dj, and a second terminal of the second transistor T2 may be connected to a first node N1. The first terminal and the second terminal of the second transistor T2 are different terminals. For example, when the first terminal is a source electrode, the second terminal may be a drain terminal. In some embodiments, a gate electrode of the second transistor T2 may be connected to the ith scan line Si. The second transistor T2 is turned on when a scan signal having a voltage (e.g., a low level voltage) at which the second transistor T2 can be turned on is supplied from the ith scan line Si, to electrically connect the jth data line Dj and the first node N1. A data signal of a corresponding frame is supplied to the jth data line Dj. Accordingly, the data signal is transferred to the first node N1. The data signal transferred to the first node N1 is charged in the storage capacitor Cst (e.g., the storage capacitor may be charged to a voltage corresponding to data signal).

A first terminal of the first transistor T1 (e.g., a driving transistor) may be connected to the first driving power source VDD, and a second terminal of the first transistor T1 may be electrically connected to a first electrode EL1 of each of the light emitting elements LD. A gate electrode of the first transistor T1 may be connected to the first node N1. The first transistor T1 controls an amount of driving current supplied to the light emitting elements LD, corresponding to a voltage of the first node N1.

One electrode of the storage capacitor Cst may be connected to the first driving power source VDD, and the other electrode of the storage capacitor Cst may be connected to the first node N1. The storage capacitor Cst charges to a voltage corresponding to the data signal supplied to the first node N1, and maintains the charged voltage until a data signal of a next frame is supplied.

In FIG. 6A, the pixel circuit 144 has been illustrated, which includes the second transistor T2 for transferring a data signal to the inside of the pixel PXL, the storage capacitor Cst for storing a charge corresponding to the data signal, and the first transistor T1 for supplying a driving current corresponding to the data signal to the light emitting elements LD.

However, the present disclosure is not limited thereto, and the structure of the pixel circuit 144 may be variously modified and embodied. In some example embodiments, the pixel circuit 144 may further include at least one transistor element, such as, a transistor element for compensating for a threshold voltage of the first transistor T1, a transistor element for initializing the first node N1, and/or a transistor element for controlling an emission time of the light emitting elements LD, or other circuit elements, such as, a boosting capacitor for boosting the voltage of the first node N1.

Although a case where all the transistors, e.g., the first and second transistors T1 and T2 included in the pixel circuit 144 are implemented with a P-type transistor is illustrated in FIG. 6A, the present disclosure is not limited thereto. For example, at least one of the first and second transistors T1 and T2 included in the pixel circuit 144 may be implemented with an N-type transistor.

In some embodiments, the pixel circuit 144 may be further connected to at least another scan line. For example, when a pixel PXL is disposed in an ith row of the display area DA, the pixel circuit 144 of the corresponding pixel PXL may be further connected to an (i−1)th scan line Si−1 (e.g., a previous scan line) and/or an (i+1)th scan line Si+1 (e.g., a next scan line) as shown in FIG. 6B. Also, in some embodiments, the pixel circuit 144 may be further connected to a third power source in addition to the first and second driving power sources VDD and VSS. For example, the pixel circuit 144 may also be connected to an initialization power source Vint. The pixel circuit 144 may include first to seventh transistors T1 to T7 and a storage capacitor Cst.

A first terminal, e.g., a source electrode of the first transistor T1 (e.g., a driving transistor), may be connected to the first driving power source VDD via the fifth transistor T5, and a second terminal, e.g., a drain electrode of the first transistor T1, may be connected to one end portions of light emitting elements LD via the sixth transistor T6. A gate electrode of the first transistor T1 may be connected to a first node N1. The first transistor T1 controls an amount of driving current flowing between the first driving power source VDD and the second driving power source VSS via the light emitting elements LD, corresponding to a voltage of the first node N1.

The second transistor T2 (e.g., a switching transistor) may be connected between the jth data line Dj connected to the pixel PXL and the first terminal of the first transistor T1. In some embodiments, a gate electrode of the second transistor T2 may be connected to the ith scan line Si connected to the pixel PXL. The second transistor T2 may be turned on when a scan signal having a gate-on voltage (e.g., a low level voltage) is supplied from the ith scan line Si, to electrically connect the jth data line Dj to the first terminal of the first transistor T1. Therefore, when the second transistor T2 is turned on, a data signal supplied from the jth data line Dj is transferred to the first transistor T1.

The third transistor T3 may be connected between the second terminal of the first transistor T1 and the first node N1. A gate electrode of the third transistor T3 may be connected to the ith scan line Si. The third transistor T3 may be turned on when a scan signal having a gate-on voltage is supplied from the ith scan line Si, to electrically connect the second terminal of the first transistor T1 and the first node N1 to each other.

The fourth transistor T4 may be connected between the first node N1 and an initialization power line IPL to which the initialization power source Vint is applied. A gate electrode of the fourth transistor T4 may be connected to a previous scan line, e.g., the (i−1)th scan line Si−1. The fourth transistor T4 may be turned on when a scan signal having a gate-on voltage (e.g., a low level voltage) is supplied to the (i−1)th scan line Si−1, to transfer a voltage of the initialization power source Vint to the first node N1. The initialization power source Vint may have a voltage equal to or less than the lowest voltage of the data signal.

The fifth transistor T5 may be connected between the first driving power source VDD and the first transistor T1. A gate electrode of the fifth transistor T5 may be connected to a corresponding emission control line, e.g., an ith emission control line Ei. The fifth transistor T5 may be turned off when an emission control signal having a gate-off voltage (e.g., a high level voltage) is supplied to the ith emission control line Ei, and may be turned on in other cases.

The sixth transistor T6 may be connected between the first transistor T1 and the one end portions of the light emitting elements LD (e.g., the first electrode EL1 of the light emitting unit EMU). A gate electrode of the sixth transistor T6 may be connected to the ith emission control line Ei. The sixth transistor T6 may be turned off when an emission control signal having a gate-off voltage (e.g., a high level voltage) is supplied to the ith emission control line Ei, and may be turned on in other cases.

The seventh transistor T7 may be connected between the one end portions of the light emitting elements LD (e.g., the first electrode EL1 of the light emitting unit EMU) and the initialization power line IPL. A gate electrode of the seventh transistor T7 may be connected to any one of scan lines of a next row, e.g., the (i+1)th scan line Si+1. The seventh transistor T7 may be turned on when a scan signal having a gate-on voltage (e.g., a low level voltage) is supplied to the (i+1)th scan line Si+1, to supply the voltage of the initialization power source Vint to the one end portions of the light emitting elements LD (e.g., the first electrode EL1 of the light emitting unit EMU).

The storage capacitor Cst may be connected between the first driving power source VDD and the first node N1. The storage capacitor Cst may charge to a voltage (or store a charge) corresponding to a data signal supplied to the first node N1 and a threshold voltage of the first transistor T1 in each frame period.

Although a case where all the transistors, e.g., the first to seventh transistors T1 to T7 included in the pixel circuit 144 are implemented with a P-type transistor is illustrated in FIG. 6B, the present disclosure is not limited thereto. For example, at least one of the first to seventh transistors T1 to T7 may be replaced with an N-type transistor.

In one or more example embodiments of the present disclosure, the configuration of the pixel circuit 144 is not limited to the embodiments shown in FIGS. 6A and 6B. For example, the pixel circuit 144 may be configured as illustrated in the embodiment shown in FIG. 6C.

As shown in FIG. 6C, the pixel circuit 144 may be further connected to a control line CLi and a sensing line SENj. In an example, the pixel circuit 144 may be connected to an ith control line CLi and a jth sensing lien SENj of the display area DA. The pixel circuit 144 may further include a third transistor T3 in addition to the first and second transistors T1 and T2 shown in FIG. 6A.

The third transistor T3 may be connected between the first transistor T1 and the jth sensing line SENj. For example, one electrode of the third transistor T3 may be connected to the first terminal (e.g., the source electrode) of the first transistor T1 connected to the first electrode EL1 of the light emitting unit EMU, and the other electrode of the third transistor T3 may be connected to the jth sensing line SENj. When the jth sensing line SENj is omitted, the other electrode of the third transistor T3 may be connected to the jth data line Dj.

In some embodiments, the gate electrode of the third transistor T3 may be connected to the ith control line CLi. When the ith control line CLi is omitted, the gate electrode of the third transistor T3 may be connected to the ith scan line Si. The third transistor T3 may be turned on by a control signal having a gate-on voltage (e.g., a high level voltage), which is supplied to the ith control line CLi during a sensing period (e.g., a set or predetermined sensing period), to electrically connect the jth sensing line SENj and the source electrode of the first transistor T1.

In some embodiments, the sensing period may be a period in which characteristic information (e.g., a threshold voltage of the first transistor T1, etc.) of each of the pixels PXL arranged in the display area DA may be determined. During the sensing period, a reference voltage (e.g., a set or predetermined reference voltage) at which the first transistor T1 can be turned on may be supplied to the first node N1 through the jth data line Dj and the second transistor T2, or the first transistor T1 may be turned on as each pixel PXL is connected to a current source or the like. The first transistor T1 may be connected to the jth sensing line SENj via the third transistor T3 when the third transistor T3 is turned on in response to a control signal having a gate-on voltage being supplied to the gate electrode of the third transistor T3. Accordingly, characteristic information of each pixel PXL, including the threshold voltage of the first transistor T1, etc., can be extracted through the jth sensing line SENj. The extracted characteristic information may be used to convert image data such that a characteristic deviation between the pixels PXL is compensated.

Although an embodiment in which all the first to third transistors T1 to T3 are N-type transistors is illustrated in FIG. 6C, the present disclosure is not limited thereto. For example, at least one of the first to third transistors T1 to T3 may be replaced with a P-type transistor. Also, although an embodiment in which the light emitting unit EMU is connected between the pixel circuit 144 and the second driving power source VSS is illustrated in FIG. 6C, the light emitting unit EMU may be connected between the first driving power source VDD and the pixel circuit 144.

Although an embodiment in which all the light emitting elements LD constituting each light emitting unit EMU are all connected in parallel is illustrated in FIGS. 6B and 6C, the present disclosure is not limited thereto. In some embodiments, the light emitting unit EMU may be configured to include at least one serial stage including a plurality of light emitting elements LD connected in parallel to each other. For example, the light emitting unit EMU may be configured in a serial/parallel hybrid structure as shown in FIG. 6A.

Referring to FIG. 6A, the light emitting unit EMU may include first to fourth serial stages SET1 to SET4 sequentially connected between the first and second driving power sources VDD and VSS. Each of the first to fourth serial stages SET1 to SET4 may include an electrode pair of the corresponding serial stage, and a plurality of light emitting elements LD connected in parallel in the same direction between the two electrodes EL1 and CTE1_1 of the first stage SET1, CTE1_2 and CTE2_1 of the second serial stage SET2, CTE2_2 and CTE3_1 of the third serial stage SET3, or CTE3_2 and EL2 of the fourth serial stage SET4.

The first serial stage SET1 may include a first electrode EL1 and a (1-1)th intermediate electrode CTE1_1, and may also include at least one first light emitting element LD1 connected between the first electrode EL1 and the (1-1)th intermediate electrode CTE1_1. Also, the first serial stage SET1 may include a reverse light emitting element LDr connected in parallel to the first light emitting element LD1 in the opposite direction between the first electrode EL1 and the (1-1)th intermediate electrode CTE1_1.

The second serial stage SET2 may include a (1-2)th intermediate electrode CTE1_2 and a (2-1)th intermediate electrode CTE2_1, and may also include at least one second light emitting element LD2 connected between the (1-2)th intermediate electrode CTE1_2 and the (2-1)th intermediate electrode CTE2_1. Also, the second serial stage SET2 may include a reverse light emitting element LDr connected to the second light emitting element LD2 in the opposite direction between the (1-2)th intermediate electrode CTE1_2 and the (2-1)th intermediate electrode CTE2_1.

The (1-1)th intermediate electrode CTE1_1 of the first serial stage SET1 and the (1-2)th intermediate electrode CTE1_2 of the second serial stage SET2 may be integrally provided to be connected to each other. For example, the (1-1)th intermediate electrode CTE1_1 and the (1-2)th intermediate electrode CTE1_2 may constitute a first intermediate electrode CTE1 which electrically connects the first serial stage SET1 and the second serial stage SET2, which are consecutive. When the (1-1)th intermediate electrode CTE1_1 and the (1-2)th intermediate electrode CTE1_2 are integrally provided, the (1-1)th intermediate electrode CTE1_1 and the (1-2)th intermediate electrode CTE1_2 may be different areas of the first intermediate electrode CTE1.

The third serial stage SET3 may include a (2-2)th intermediate electrode CTE2_2 and a (3-1)th intermediate electrode CTE3_1, and may also include at least one third light emitting element LD3 connected between the (2-2)th intermediate electrode CTE2_2 and the (3-1)th intermediate electrode CTE3_1. Also, the third serial stage SET3 may include a reverse light emitting element LDr connected to the third light emitting element LD3 in the opposite direction between the (2-2)th intermediate electrode CTE2_2 and the (3-1)th intermediate electrode CTE3_1.

The (2-1)th intermediate electrode CTE2_1 of the second serial stage SET2 and the (2-2)th intermediate electrode CTE2_2 of the third serial stage SET3 may be integrally provided to be connected to each other. For example, the (2-1)th intermediate electrode CTE2_1 and the (2-2)th intermediate electrode CTE2_2 may constitute a second intermediate electrode CTE2 which electrically connects the second serial stage SET2 and the third serial stage SET3, which are consecutive. When the (2-1)th intermediate electrode CTE2_1 and the (2-2)th intermediate electrode CTE2_2 are integrally provided, the (2-1)th intermediate electrode CTE2_1 and the (2-2)th intermediate electrode CTE2_2 may be different areas of the second intermediate electrode CTE2.

The fourth serial stage SET4 may include a (3-2)th intermediate electrode CTE3_2 and a second electrode EL2, and may also include at least one fourth light emitting element LD4 connected between the (3-2)th intermediate electrode CTE3_2 and the second electrode EL2. Also, the fourth serial stage SET4 may include a reverse light emitting element LDr connected to the fourth light emitting element LD4 in the opposite direction between the (3-2)th intermediate electrode CTE3_2 and the second electrode EL2.

The (3-1)th intermediate electrode CTE3_1 of the third serial stage SET3 and the (3-2)th intermediate electrode CTE3_2 of the fourth serial stage SET4 may be integrally provided to be connected to each other. For example, the (3-1)th intermediate electrode CTE3_1 and the (3-2)th intermediate electrode CTE3_2 may constitute a third intermediate electrode CTE3 which electrically connects the third serial stage SET3 and the fourth serial stage SET4, which are consecutive. When the (3-1)th intermediate electrode CTE3_1 and the (3-2)th intermediate electrode CTE3_2 are integrally provided, the (3-1)th intermediate electrode CTE3_1 and the (3-2)th intermediate electrode CTE3_2 may be different areas of the third intermediate electrode CTE3.

In the above-described embodiment, the first electrode EL1 of the first serial stage SET1 may be an anode electrode of a light emitting unit EMU of each pixel PXL, and the second electrode EL2 of the fourth serial stage SET4 may be a cathode electrode of the light emitting unit EMU.

As described above, the light emitting unit EMU of the pixel PXL, which includes the light emitting elements LD connected in a serial/parallel hybrid structure, can easily control driving current/voltage conditions to be suitable for specifications of a product to which the light emitting unit EMU is applied.

For example, the light emitting unit EMU of the pixel PXL, which includes the light emitting elements LD connected in the serial/parallel hybrid structure, can decrease a driving current, as compared with the light emitting unit EMU including the light emitting elements LD connected in parallel. The light emitting unit EMU of the pixel PXL, which includes the light emitting elements LD connected in the serial/parallel hybrid structure, can decrease a driving voltage applied to both ends of the light emitting unit EMU, as compared with the light emitting unit EMU including the light emitting elements LD all connected in series.

The structure of a pixel PXL applied to the present disclosure is not limited to the embodiments shown in FIGS. 6A-6C, and the corresponding pixel PXL may have various structures. For example, each pixel PXL may be configured in a passive type light emitting display device, etc. The pixel circuit 144 may be omitted, and both end portions of the light emitting elements LD included in the light emitting unit EMU may be directly connected to the ith scan line Si, the jth data line Dj, the first power line PL1 to which the first driving power source VDD is applied, the second power line PL2 to which the second driving power source VSS is applied, and/or a control line (e.g., a set or predetermined control line).

Figure 7:
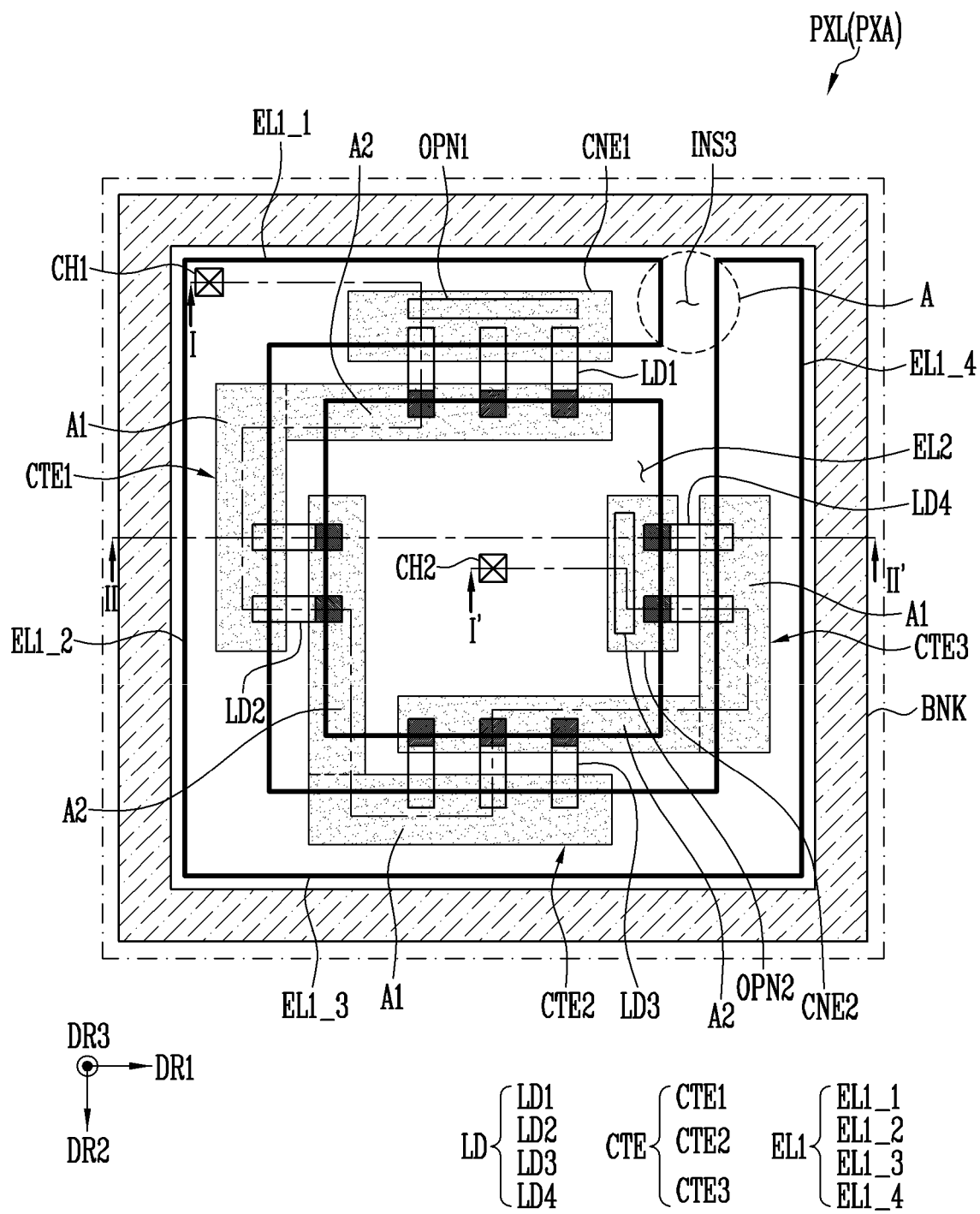
FIG. 7 is a plan view schematically illustrating one pixel from among pixels shown in FIG. 5.
Figure 8A:
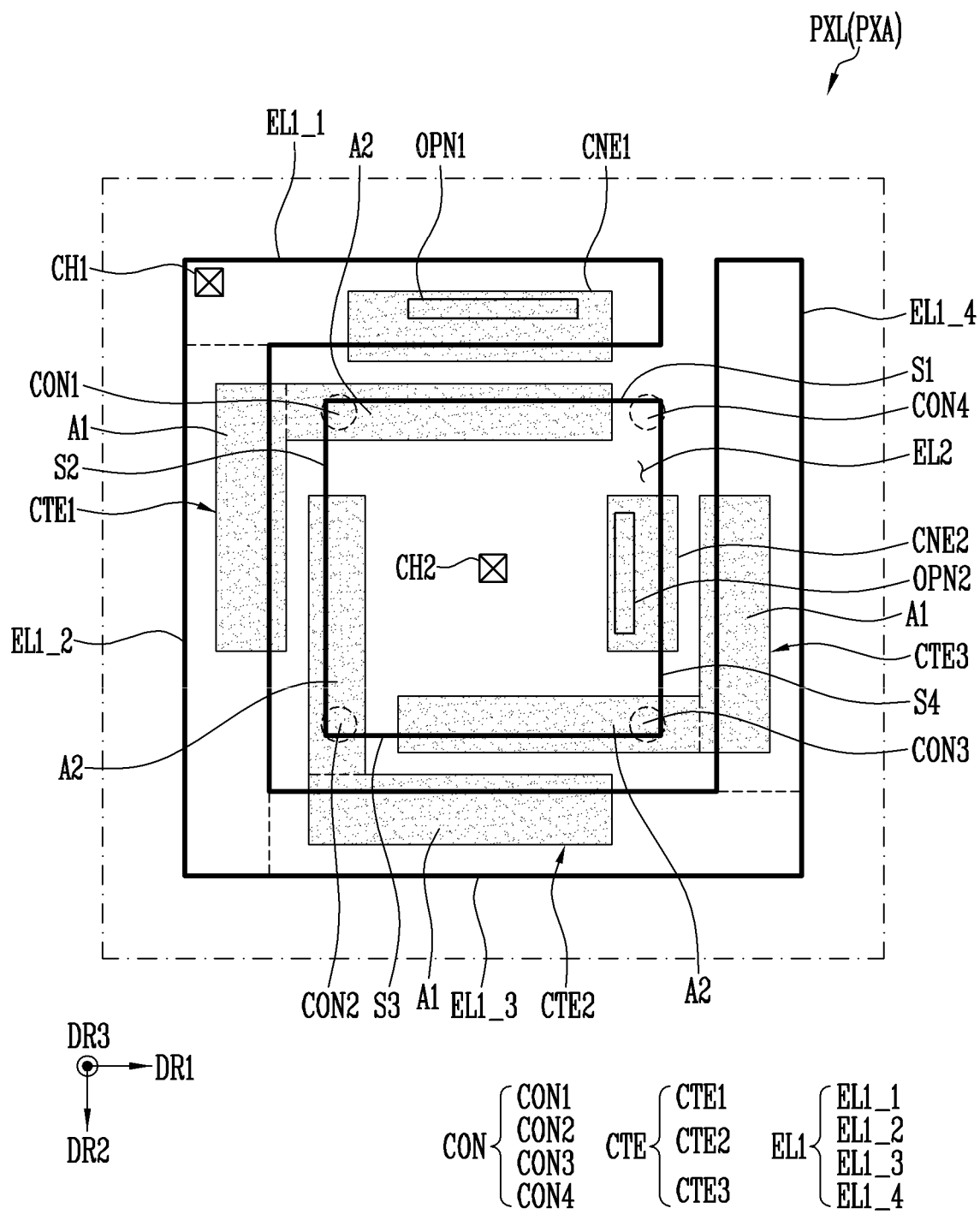
FIG. 8A is a plan view illustrating only first to fourth electrodes, an intermediate electrode, and a first insulating layer, which are shown in FIG. 7.
Figure 8B:
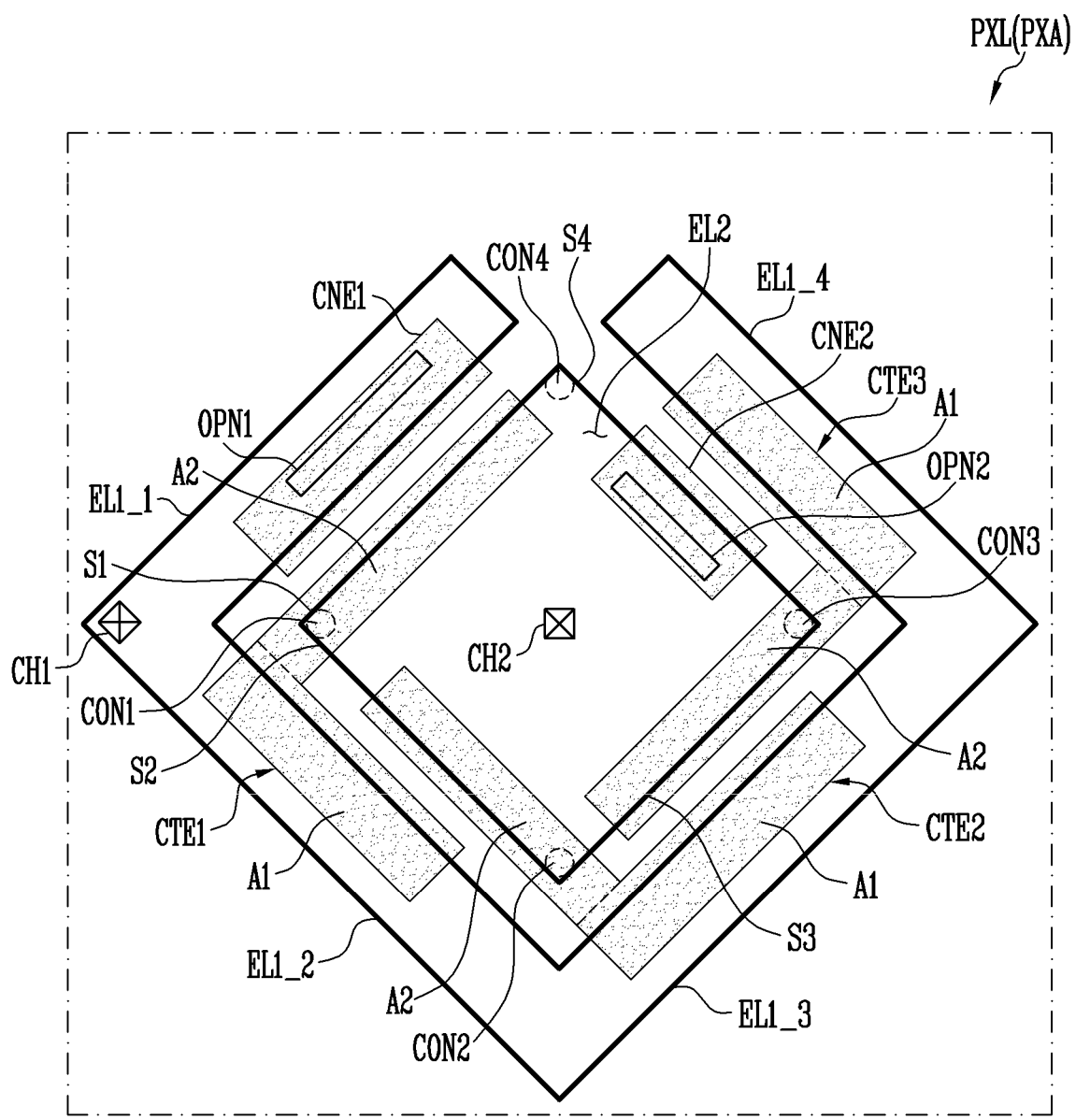
FIG. 8B is a schematic plan view illustrating another example embodiment of the first and second electrodes shown in FIG. 8A.
Figure 9:
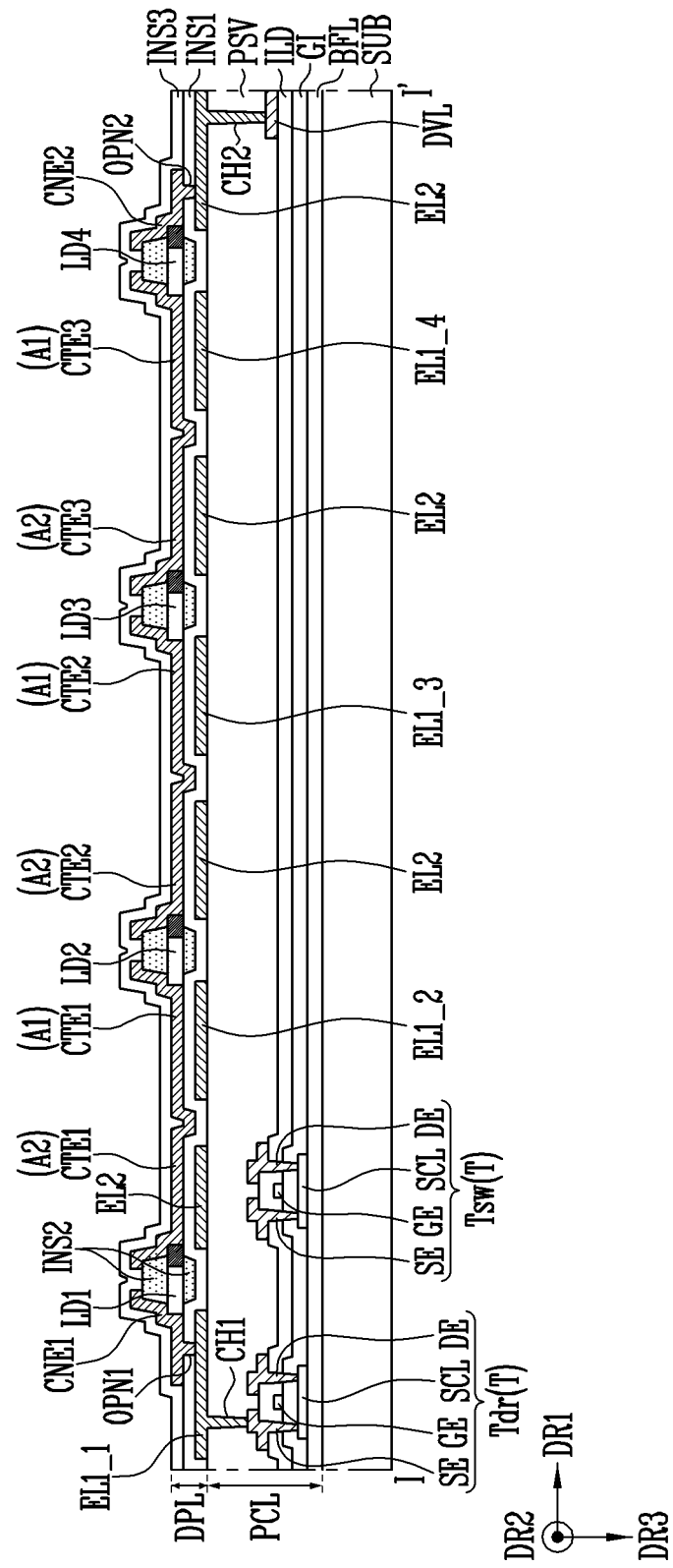
FIG. 9 is a sectional view taken along the line I-I' shown in FIG. 7.
Figure 10:
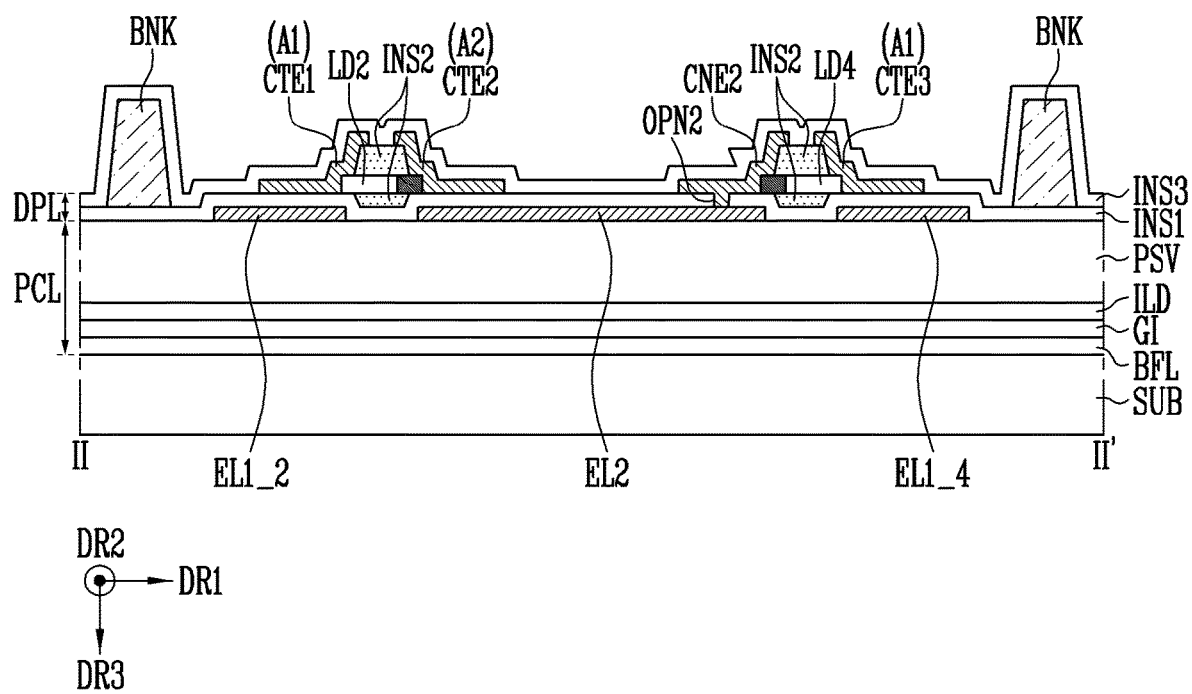
FIG. 10 is a sectional view taken along the line II-II' shown in FIG. 7.
Figure 11:
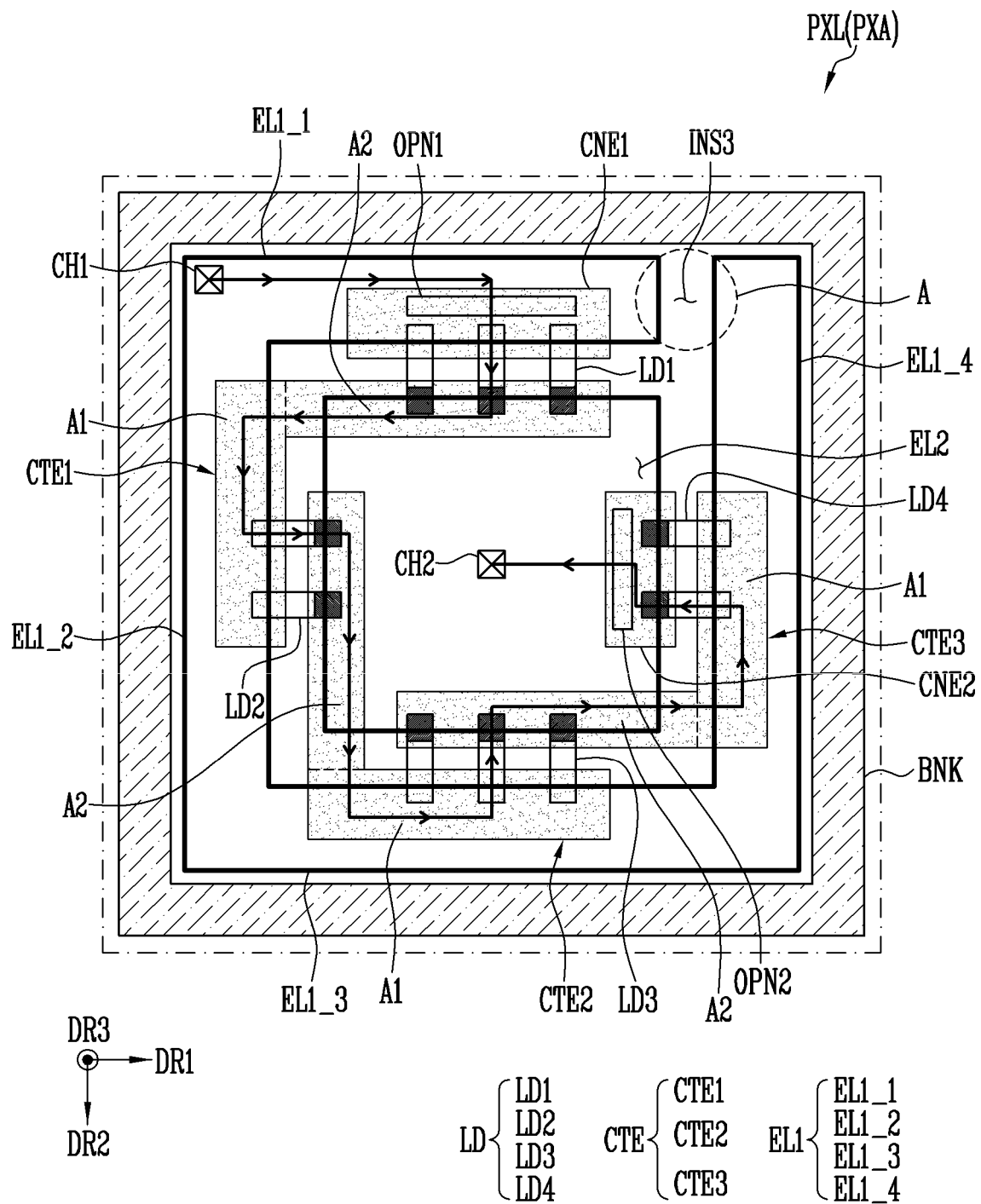
FIG. 11 is a plan view illustrating a driving current flowing through a pixel in accordance with one or more example embodiments of the present disclosure, and illustrates a driving current flowing through, for example, the pixel shown in FIG. 7.
Figure 12:
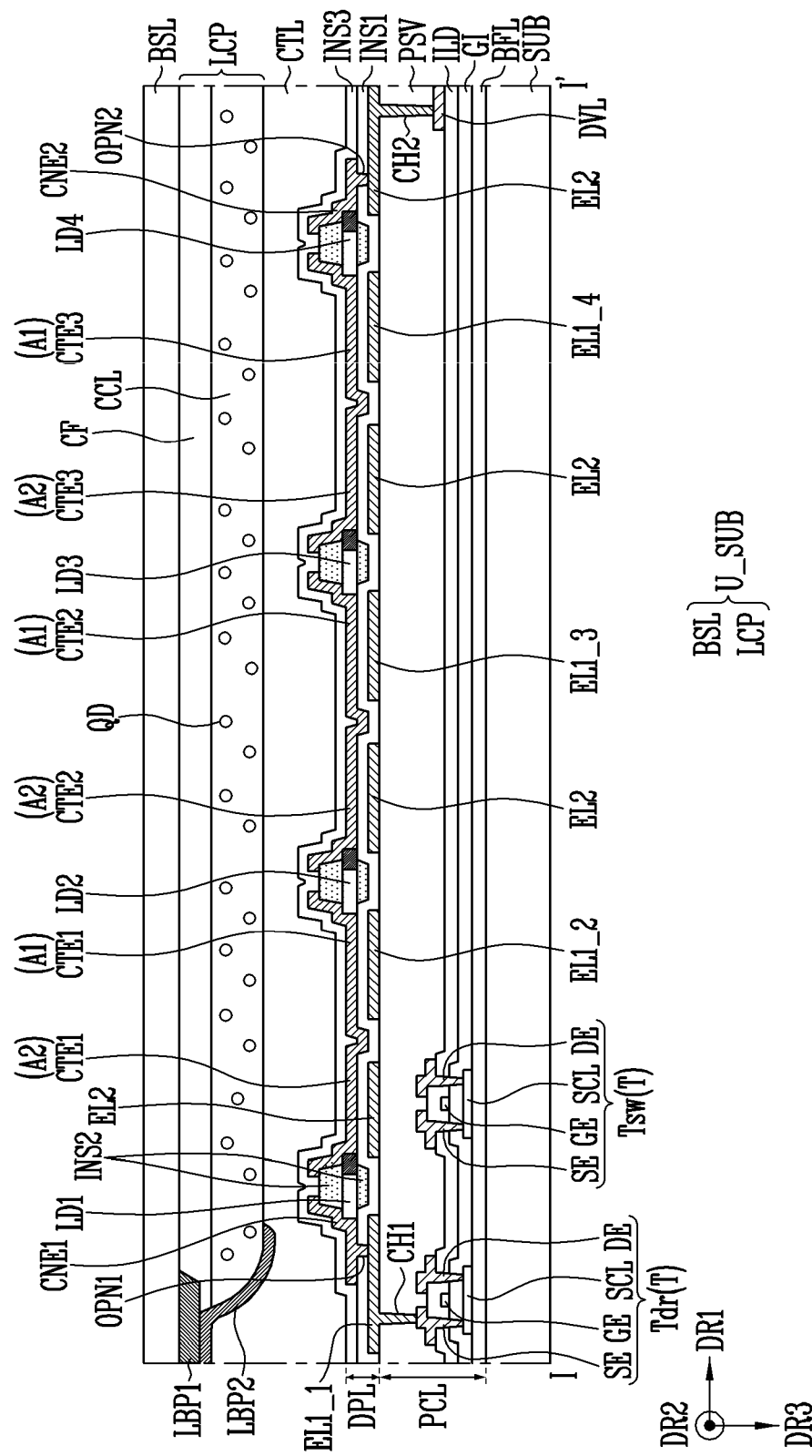
FIG. 12 schematically illustrates a state in which the pixel shown in FIG. 7 is joined with an upper substrate, and is a sectional view corresponding to the line I-I' shown in FIG. 7.
Figure 13:
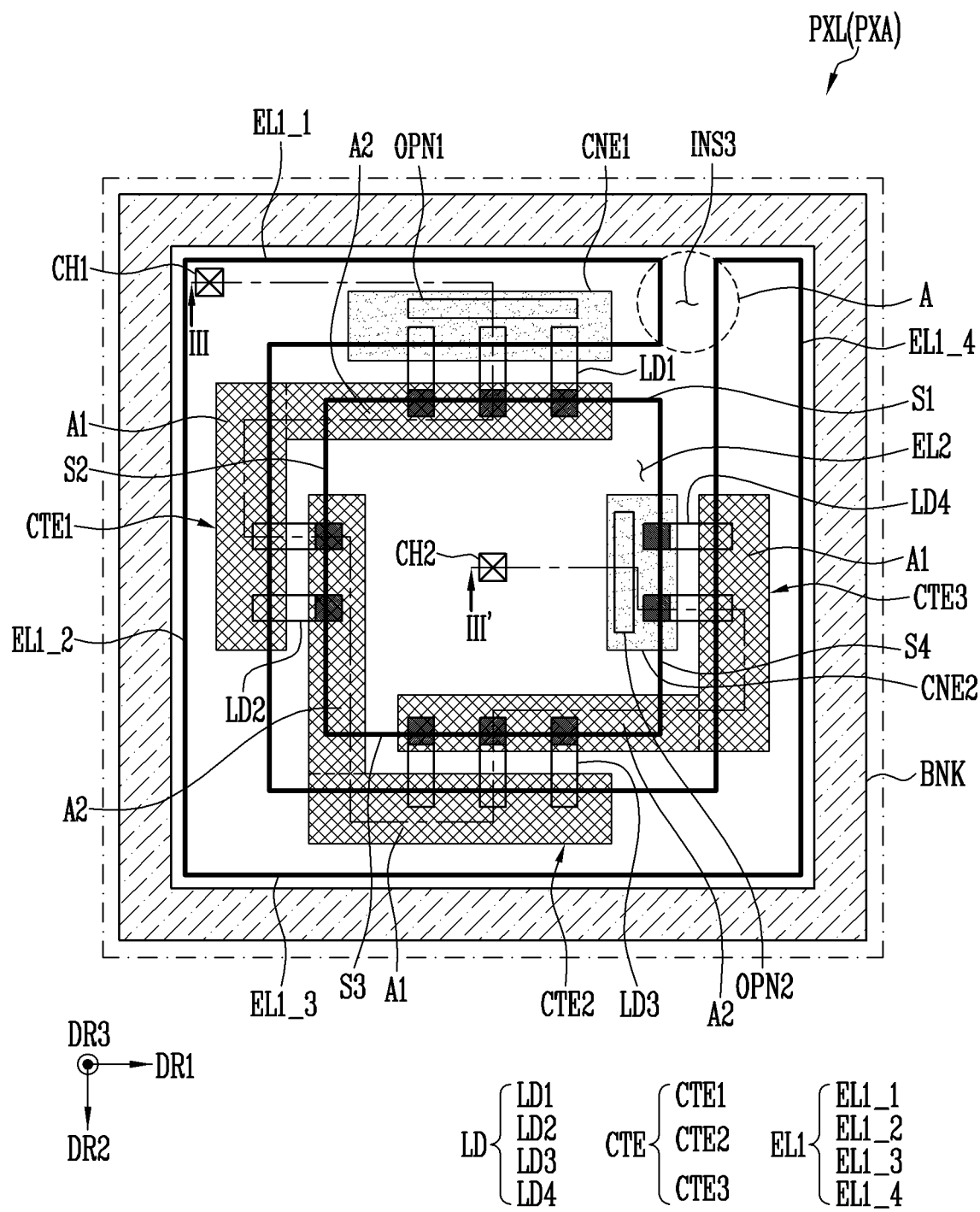
FIG. 13 is a schematic plan view illustrating another example embodiment of the first to third intermediate electrodes in the pixel shown in FIG. 7.
Figure 14:
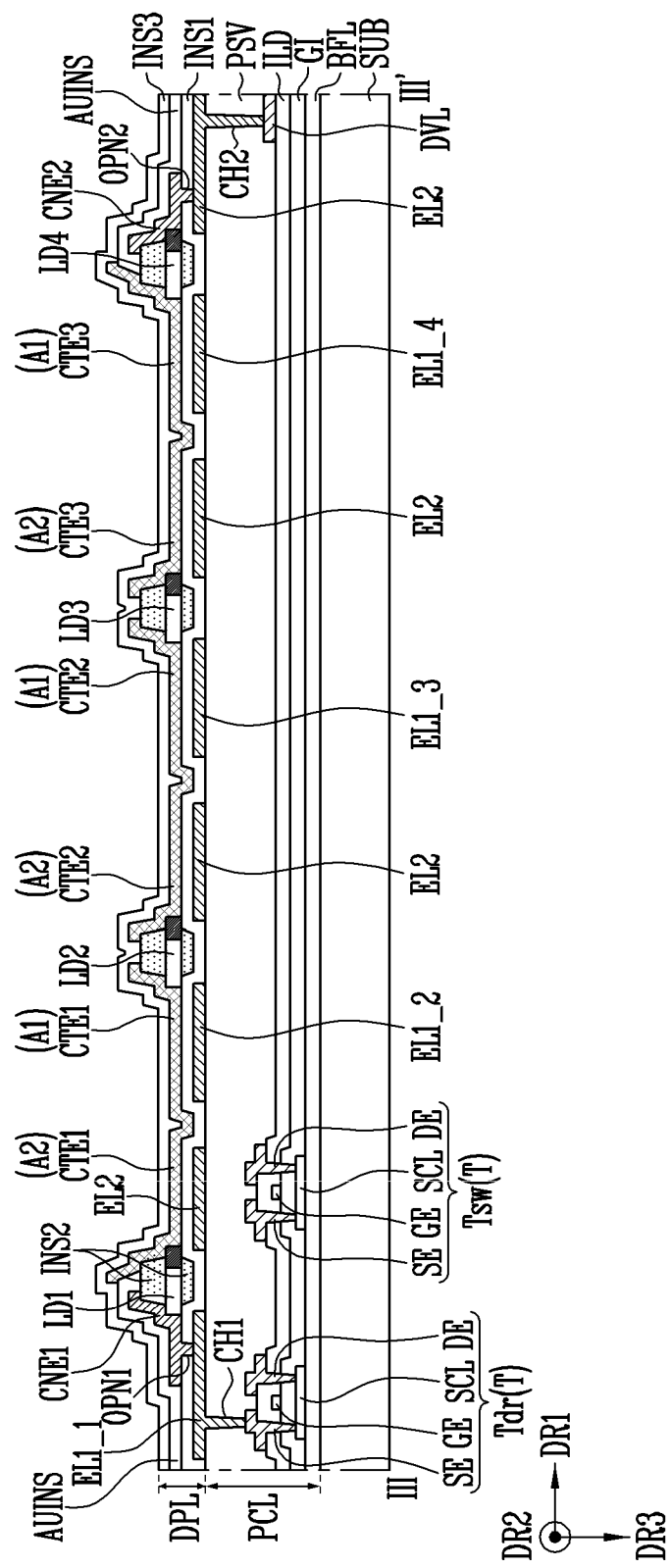
FIG. 14 is a sectional view taken along the line III-III' shown in FIG. 13.

FIG. 7 is a plan view schematically illustrating one pixel from among the pixels shown in FIG. 5. FIG. 8A is a plan view illustrating only first to fourth electrodes, an intermediate electrode, and a first insulating layer, which are shown in FIG. 7. FIG. 8B is a schematic plan view illustrating another embodiment of the first and second electrodes shown in FIG. 8A. FIG. 9 is a sectional view taken along the line I-I' shown in FIG. 7. FIG. 10 is a sectional view taken along the line II-II' shown in FIG. 7. FIG. 11 is a plan view illustrating a driving current flowing through a pixel in accordance with one or more example embodiments of the present disclosure, and illustrates a driving current flowing through, for example, the pixel shown in FIG. 7. FIG. 12 schematically illustrates a state in which the pixel shown in FIG. 7 is joined with an upper substrate, and is a sectional view corresponding to the line I-I' shown in FIG. 7. FIG. 13 is a schematic plan view illustrating another embodiment of the first to third intermediate electrodes in the pixel shown in FIG. 7. FIG. 14 is a sectional view taken along the line III-III' shown in FIG. 13.

The pixel shown in FIG. 7 may be the pixel shown in FIG. 6A.

In FIG. 7, illustration of a transistor connected to light emitting elements and signal lines connected to the transistors is omitted for convenience.

In FIGS. 7-14, the one pixel PXL is simplified and illustrated, such as a case where each electrode is illustrated as an electrode of a single layer and a case where each insulating layer is illustrated as a single-layered insulating layer. However, the present disclosure is not limited thereto.

In one or more embodiments of the present disclosure, the term "being formed and/or provided in the same layer" may mean being formed in the same process, and the term "being formed and/or provided in different layers" may mean being formed in different processes.

In one or more embodiments of the present disclosure, the term "connection" between two components may include both electrical connection and physical connection.

In one or more embodiments of the present disclosure, for convenience of description, a lateral direction (or horizontal direction) on a plane is represented as a first direction DR1, a longitudinal direction (or vertical direction) on a plane is represented as a second direction DR2, and a thickness direction of a substrate SUB on a section is represented as a third direction DR3. The first to third directions DR1, DR2, and DR3 may mean directions indicated by the first to third directions DR1, DR2, and DR3.

Referring to FIGS. 1-6A and 7-14, the display device in accordance with one or more embodiments of the present disclosure may include a plurality of pixels PXL provided on the substrate SUB.

The substrate SUB may include a transparent insulating material to enable light to be transmitted therethrough. The substrate SUB may be a rigid substrate or a flexible substrate.

The rigid substrate may include, for example, one of a glass substrate, a quartz substrate, a glass ceramic substrate, and a crystalline glass substrate.

The flexible substrate may be one of a film substrate and a plastic substrate, which include a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, the material constituting the substrate SUB may be variously changed. The material applied to the substrate SUB may have resistance (or heat resistance) against high processing temperature in a fabricating process of the display device.

The substrate SUB may include a display area DA including at least one pixel area PXA in which the pixel is disposed and a non-display area NDA disposed at (or adjacent to) the periphery of the display area DA. For example, the non-display area NDA may surround the display area DA along the edge or periphery of the display area DA.

The pixels PXL may be arranged in a matrix form and/or a stripe form along a plurality of pixel rows extending in the first direction DR1 in the display area DA on the substrate SUB and a plurality of pixel columns extending in the second direction DR2 different from, e.g., crossing the first direction DR1, but the present disclosure is not limited thereto. In some embodiments, the pixels PXL may be provided in various arrangement forms in the display area DA on the substrate SUB.

The pixel area PXA in which each pixel PXL is disposed (or provided) may include an emission area in which light is emitted and a peripheral area adjacent to the emission area (or surrounding the periphery of the emission area). In one or more example embodiments of the present disclosure, the peripheral area may include a non-emission area in which no light is emitted.

A line unit electrically connected to the pixels PXL may be located on the substrate SUB. The line unit may include a plurality of signal lines for transferring a signal (e.g., a set or predetermined signal or a predetermined voltage) to each pixel PXL. The signal lines may include an ith scan line Si for transferring a scan signal to each pixel PXL, a jth data line Dj for transferring a data signal to each pixel PXL, and a power line PL1 and DVL for transferring a driving power source to each pixel PXL. In some embodiments, the line unit may further include an emission control line for transferring an emission control signal to each pixel PXL. In some other embodiments, the line unit may further include a sensing line and a control line, which are connected to each pixel PXL.

Each pixel PXL may include a pixel circuit layer PCL which is provided on the substrate SUB and includes a pixel circuit 144, and a display element layer DPL including a plurality of light emitting elements LD. The light emitting elements LD may be located in the pixel area PXA of each pixel PXL.

For convenience, the pixel circuit layer PCL will be first described, and the display element layer DPL will be then described.

The pixel circuit layer PCL may include a buffer layer BFL, the pixel circuit 144, and a passivation layer PSV.

The buffer layer BFL may prevent an impurity from being diffused into transistors T (e.g., the switching transistor Tsw and the driving transistor Tdr) included in the pixel circuit 144. The buffer layer BFL may be an inorganic insulating layer including an inorganic material. The buffer layer BFL may include, for example, at least one of silicon nitride (SiNx), silicon oxide (SiOx), silicon oxynitride (SiON), and metal oxide such as aluminum oxide (AlOx). The buffer layer BFL may be provided in a single layer, but may be provided in a multi-layer including at least two layers. When the buffer layer BFL is provided in the multi-layer, the layers may be formed of the same material or may be formed of different materials. The buffer layer BFL may be omitted according to the material and process conditions of the substrate SUB.

The pixel circuit 144 may include at least one transistor T and a storage capacitor Cst. The transistor T may include a driving transistor Tdr for controlling a driving current of the light emitting elements LD and a switching transistor Tsw connected to the driving transistor Tdr. However, the present disclosure is not limited thereto, and the pixel circuit 144 may include circuit elements for performing another function, in addition to the driving transistor Tdr and the switching transistor Tsw. In the following embodiment, when the driving transistor Tdr and the switching transistor Tsw are inclusively designated, the transistors are referred to as transistors T. The driving transistor Tdr may be the first transistor T1 described with reference to FIG. 6A, and the switching transistor Tsw may be the second transistor T2 described with reference to FIG. 6A.

Each of the driving transistor Tdr and the switching transistor Tsw may include a semiconductor pattern SCL, a gate electrode GE, a first terminal SE, and a second terminal DE. The first terminal SE may be any one of a source electrode and a drain electrode, and the second terminal DE may be the other one of the source electrode and the drain electrode. In one or more example embodiments, when the first terminal SE is the source electrode, the second terminal DE may be the drain electrode.

The semiconductor pattern SCL may be provided and/or formed on the buffer layer BFL. The semiconductor pattern SCL may include a first contact region in contact with the first terminal SE and a second contact region in contact with the second terminal DE. A region between the first contact region and the second contact region may be a channel region. The channel region may overlap with the gate electrode GE of the corresponding transistor T. The transistor semiconductor pattern SCL may be made of poly-silicon, amorphous silicon, oxide semiconductor, etc. The channel region is a semiconductor pattern undoped with an impurity, and may be an intrinsic semiconductor. Each of the first contact region and the second contact region may be a semiconductor pattern doped with the impurity.

A gate insulating layer GI may be provided and/or formed over the semiconductor pattern SCL. The gate insulating layer GI may be an inorganic insulating layer including an inorganic material. In some embodiments, the gate insulating layer GI may include the same material as the buffer layer BFL or include at least one selected from the materials exemplified as the material constituting the buffer layer BFL. In some embodiments, the gate insulating layer GI may be an organic insulating layer including an organic material. The gate insulating layer GI may be provided in a single layer, but may also be provided in a multi-layer including at least two layers.

The gate electrode GE may be provided and/or formed on the gate insulating layer GI to correspond to the channel region of the semiconductor pattern SCL. The gate electrode GE may be provided on the gate insulating layer GI to overlap with the channel region of the semiconductor pattern SCL. The gate electrode GE may be formed in a single layer including one selected from the group consisting of copper (Cu), molybdenum (Mo), tungsten (W), aluminum neodymium (AlNd), titanium (Ti), aluminum (Al), silver (Ag), and any alloy thereof or a mixture thereof, or be formed in a double or multi-layered structure including molybdenum (Mo), titanium (Ti), copper (Cu), aluminum (Al) or silver (Ag), which is a low-resistance material so as to decrease wiring resistance.

An interlayer insulating layer ILD may be provided and/or formed over the gate electrode GE. The interlayer insulating layer ILD may include the same material as the gate insulating layer GI or include at least one selected from the materials exemplified as the material constituting the gate insulating layer GI.

The first terminal SE and the second terminal DE may be provided and/or formed on the interlayer insulating layer ILD, and may be respectively in contact with the first contact region and the second contact region of the semiconductor pattern SLC through contact holes sequentially penetrating the gate insulating layer GI and the interlayer insulating layer ILD. Each of the first and second terminals SE and DE may include the same material as the gate electrode GE or include at least one selected from the materials exemplified as the material constituting the gate electrode GE.

Although it has been described that the first and second terminals SE and DE of each of the driving transistor Tdr and the switching transistor Tsw are separate electrodes electrically connected to the semiconductor pattern SCL through contact holes sequentially penetrating the gate insulating layer GI and the interlayer insulating layer ILD, the present disclosure is not limited thereto. In some embodiments, the first terminal SE of each of the driving transistor Tdr and the switching transistor Tsw may be the first contact region adjacent to the channel region of the corresponding semiconductor pattern SCL, and the second terminal DE of each of the driving transistor Tdr and the switching transistor Tsw may be the second contact region adjacent to the channel region of the corresponding semiconductor pattern SCL. The first terminal SE of the driving transistor Tdr may be electrically connected to the light emitting elements LD of the corresponding pixel PXL through a separate connection connector such as a bridge electrode.

In some embodiments of the present disclosure, the transistors T included in the pixel circuit 144 may be implemented with a low temperature poly-silicon (LTPS) thin film transistor, but the present disclosure is not limited thereto. In some embodiments, the transistors T included in the pixel circuit 144 may be implemented with an oxide semiconductor thin film transistor. Also, a case where the transistors T is implemented with a thin film transistor having a top gate structure has been described as an example, but the present disclosure is not limited thereto. The structure of the transistors T may be variously modified.

In one or more embodiments, the storage capacitor Cst may include a lower electrode provided on any one insulating layer among the insulating layers included in the pixel circuit layer PCL and an upper electrode provided on another insulating layer to form a capacitance by overlapping with the lower electrode.

The pixel circuit layer PCL may include a driving voltage line DVL provided and/or formed on the interlayer insulating layer ILD. The driving voltage line DVL may be the second power line PL2 described with reference to FIG. 6A. Also, the pixel circuit layer PCL may further include a first power line PL1 connected to the first driving power source VDD. The first power line PL1 may be provided in the same layer as the driving voltage line DVL or may be provided in a layer different from that of the driving voltage line DVL. In one or more embodiments of the present disclosure, it has been described that the driving voltage line DVL is provided in the same layer as the first and second terminals SE and DE of the driving transistor Tdr (and the switching transistor Tsw), but the present disclosure is not limited thereto. In some embodiments, the driving voltage line DVL may be provided in the same layer as any one conductive layer from among conductive layers provided in the pixel circuit layer PCL. For example, the position of the driving voltage line DVL in the pixel circuit layer PCL may be variously changed.

The first power line PL1 may be electrically connected to a partial component, e.g., a first electrode EL1 of the display element layer DPL, and the driving voltage line DVL may be electrically connected to another component, e.g., a second electrode EL2 of the display element layer DPL. The first power line PL1 and the driving voltage line DVL may transfer an alignment signal (or alignment voltage) to the first and second electrodes EL1 and EL2 to align light emitting elements LD in the pixel area PXA of each of the pixels PXL. Also, each of the first power line PL1 and the driving voltage line DVL may transfer a voltage of a corresponding driving power source to each pixel PXL after the light emitting elements LD are aligned, thereby driving the light emitting elements LD.

Each of the first power line PL1 and the driving voltage line DVL may include a conductive material. In an example, each of the first power line PL1 and the driving voltage line DVL may be formed in a single layer including one selected from the group consisting of copper (Cu), molybdenum (Mo), tungsten (W), aluminum neodymium (AlNd), titanium (Ti), aluminum (Al), silver (Ag), and any alloy thereof or a mixture thereof, or be formed in a double- or multi-layered structure including molybdenum (Mo), titanium (Ti), copper (Cu), aluminum (Al) or silver (Ag), which is a low-resistance material so as to decrease wiring resistance. In some example embodiments, each of the first power line PL1 and the driving voltage line DVL may be configured as a double layer in which titanium (Ti)/copper (Cu) are sequentially stacked.

The passivation layer PSV may be provided and/or formed over the transistors T and the driving voltage line DVL.

The passivation layer PSV may be provided in a form including an organic insulating layer, an inorganic insulating layer, or the organic insulating layer disposed on the inorganic insulating layer. The inorganic insulating layer may include, for example, at least one of silicon oxide (SiOx), silicon nitride (SiNx), silicon oxynitride (SiON), and metal oxide such as aluminum oxide (AlOx). For example, the organic insulating layer may include at least one of poly-acrylates resin, epoxy resin, phenolic resin, polyamides resin, polyimides resin, unsaturated polyesters resin, poly-phenylene ethers resin, poly-phenylene sulfides resin, and benzocyclobutenes resin.

The passivation layer PSV may include a first contact hole CH1 exposing the first terminal SE of the driving transistor Tdr and a second contact hole CH2 exposing the driving voltage line DVL.

The display element layer DPL may be provided on the passivation layer PSV.

The display element layer DPL may include a bank BNK, first and second electrodes EL1 and EL2, light emitting elements LD, first and second contact electrodes CNE1 and CNE2, intermediate electrodes CTE1, CTE2, and CTE3, and first to third insulating layers INS1 to INS3.

The bank BNK may be located in the peripheral area surrounding at least one side of the emission area of a corresponding pixel PXL. The peripheral area may include a non-emission area.

The bank BNK is a structure which defines (or partitions) the pixel area PXA (or the emission area EMA) of each of the corresponding pixel PXL and pixels PXL adjacent thereto, and may be, for example, a pixel defining layer. The bank BNK may include at least one light blocking material and/or at least one reflective material, to prevent a light leakage defect in which light (or beam) is leaked between each pixel PXL and pixels PXL adjacent thereto. In some embodiments, the bank BNK may include a transparent material (or substance). The transparent material may include, for example, polyamides resin, polyimides resin, etc., but the present disclosure is not limited thereto. In other embodiments, a reflective material layer may be formed over the bank BNK so as to further improve the efficiency of light emitted from each pixel PXL. The bank BNK may be provided and/or formed on the first insulating layer INS1, but the present disclosure is not limited thereto. In some embodiments, the bank BNK may be provided and/or formed on the passivation layer PSV.

The first electrode EL1 may be electrically connected a partial component, e.g., the driving transistor Tdr in the pixel circuit layer PCL of the corresponding pixel PXL through the first contact hole CH1. The second electrode EL2 may be electrically connected to a partial component, e.g., the driving voltage line DVL included in the pixel circuit layer PCL of the corresponding pixel PXL through the second contact hole CH2.

The first and second electrodes EL1 and EL2 may be provided at the same surface, e.g., one surface (or upper surface) of the passivation layer PSV, and may be spaced from each other. Hereinafter, in the specification and/or the claims, as those skilled in the art would appreciate, the terms first and second electrodes may be interchangeable with each other. In other words, the electrode EL1 may be referred to as a second electrode and the electrode EL2 may be referred to as a first electrode without being limited thereto. Similarly any parts or portions of the electrode EL1 may be referred to as parts or portions of the second electrode, and any parts or portions of the electrode EL2 may be referred to as parts or portions of the first electrode without being limited thereto. Further, the first and second designations may be interchanged in reference to other components (e.g., contact electrodes) throughout the specification and/or the claims.

Each of the first and second electrodes EL1 and EL2 may be made of a material having a constant reflexibility so as to allow light emitted from each of the light emitting elements LD to advance in an image display direction (or front direction) of the display device. Each of the first and second electrodes EL1 and EL2 may be made of a conductive material (or substance) having a constant reflexibility. The conductive material (or substance) may include an opaque metal suitable for in reflecting lights emitted from the light emitting elements LD in the image display direction of the display device. The opaque metal may include, for example, metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof. In some embodiments, each of the first and second electrodes EL1 and EL2 may include a transparent conductive material (or substance). The transparent conductive material (or substance) may include a conductive oxide such as indium tin oxide (ITO), indium zinc oxide (IZO), zinc oxide (ZnO), indium gallium zinc oxide (IGZO), or indium tin zinc oxide (ITZO), a conductive polymer such as (poly(3,4-ethylenedioxythiophene) PEDOT, and the like. When each of the first and second electrodes EL1 and EL2 includes the transparent conductive material, a separate conductive layer may be additionally included, which is made of an opaque metal for reflecting lights emitted from the light emitting elements LD in the image display direction of the display device. However, the material of each of the first and second electrodes EL1 and EL2 is not limited to the above-described materials.

Also, each of the first and second electrodes EL1 and EL2 may be provided and/or formed as a single layer, but the present disclosure is not limited thereto. In some embodiments, each of the first and second electrodes EL1 and EL2 may be provided and/or formed as a multi-layer in which two or more materials from among metals, alloys, conductive oxides, and conductive polymers are stacked. Each of the first and second electrodes EL1 and EL2 may be provided as a multi-layer including at least two layers so as to reduce or minimize distortion caused by a signal delay when a signal (or voltage) is transferred to both end portions of each of the light emitting elements LD. In some example embodiments, each of the first and second electrodes EL1 and EL2 may be provided as a multi-layer in which indium tin oxide (ITO)/silver (Ag)/indium tin oxide (ITO) are sequentially stacked.

In some embodiments of the present disclosure, the second electrode EL2 may have a quadrangular shape which is located in the middle (or core) of the pixel area PXA of the corresponding pixel PXL and may have first to fourth sides S1 to S4. In some example embodiments, the second electrode EL2 may have a square shape in which lengths of the first to fourth sides S1 to S4 are the same, or have a rectangular shape in which lengths of the two sides (e.g., the second side S2 and the fourth side S4) that are opposite each other from among the first to fourth sides S1 to S4 and lengths of the other two sides (e.g., the first side S1 and the second side S2) that are not opposite each other are different from each other. Also, the second electrode EL2 may have a rhombic shape as shown in FIG. 8B.

The first electrode EL1 may have a quadrangular ring shape or a rhombic ring shape and may surround the second electrode EL2 along the periphery (e.g., circumference (or edge)) of the second electrode EL2. The first electrode EL1 may have a certain shape and may not completely surround the second electrode EL2, e.g., the first electrode EL1 may have a quadrangular ring shape or rhombic ring shape that has an open portion A (e.g., an opening). The second electrode EL2 may be isolated from the first electrode EL1 and may be surrounded by the first electrode EL1, but the present disclosure is not limited thereto. The first electrode EL1 and the second electrode EL2 may be disposed on the passivation layer PSV to be spaced from each other.

The first electrode EL1 may include (1-1)th to (1-4)th electrodes EL1_1 to EL1_4. The (1-1)th to (1-4)th electrodes EL1_1 to EL1_4 may be integrally provided to be connected to each other, and be different areas of the first electrode EL1. In some example embodiments, the (1-1)th electrode EL1_1 may be one area of the first electrode EL1, which is adjacent to the first side S1 of the second electrode EL2, the (1-2)th electrode EL1_2 may be one area of the first electrode EL1, which is adjacent to the second side S2 of the second electrode EL2, the (1-3)th electrode EL1_3 may be one area of the first electrode EL1, which is adjacent to the third side S3 of the second electrode EL2, and the (1-4)th electrode EL1_4 may be one area of the first electrode EL1, which is adjacent to the fourth side S4 of the second electrode EL2.

One end of the (1-1)th electrode EL1_1 may be in contact with the (1-2)th electrode EL1_2, and the other end of the (1-1)th electrode EL1_1 may not be in contact with the (1-4)th electrode EL1_4. One end of the (1-2)th electrode EL1_2 may be in contact with the (1-1)th electrode EL1_1, and the other end of the (1-2)th electrode EL1_2 may be in contact with the (1-3)th electrode EL1_3. One end of the (1-3)th electrode EL1_3 may be in contact with the (1-2)th electrode EL1_2, and the other end of the (1-3)th electrode EL1_3 may be in contact with the (1-4)th electrode EL1_4. One end of the (1-4)th electrode EL1_4 may be in contact with the (1-3)th electrode EL1_3, and the other end of the (1-4)th electrode EL1_4 may not be in contact with the (1-1)th electrode EL1_1.

In the pixel area PXA of each pixel PXL, a plurality of light emitting elements LD may be aligned and/or provided each of between the (1-1)th electrode EL1_1 and one area of the second electrode EL2, which includes the first side S1, between the (1-2)th electrode EL1_2 and one area of the second electrode EL2, which includes the second side S2, between the (1-3)th electrode EL1_3 and one area of the second electrode EL2, which includes the third side S3, and between the (1-4)th electrode EL1_4 and one area of the second electrode EL2, which includes the fourth side S4. The first and second electrodes EL1 and EL2 and the light emitting elements LD may constitute a light emitting unit EMU of each pixel PXL.

The first electrode EL1 and the second electrode EL2 may receive an alignment signal (or alignment voltage) to serve as an alignment electrode (or alignment line) for aligning the light emitting elements LD. In some example embodiments, the first electrode EL1 may receive a first alignment signal (or a first alignment voltage) from the first power line PL1 to serve as a first alignment electrode (or a first alignment line), and the second electrode EL2 may receive a second alignment signal (or a second alignment voltage) from the driving voltage line DVL to serve as a second alignment electrode (or second alignment line). The first and second alignment signals (or alignment voltages) may be signals having a voltage difference and/or a phase difference to a degree to which the light emitting elements LD can be aligned between the first and second electrodes EL1 and EL2. At least one of the first and second alignment signals (or alignment voltages) may be an AC signal (or voltage), but the present disclosure is not limited thereto.

As described above, when the second electrode EL2 is located in the middle of the pixel area PXA of each pixel PXL and the first electrode EL1 surrounds the peripheral area of the second electrode EL2, an alignment signal (or alignment voltage) is applied to each of the first and second electrodes EL1 and EL2. Then, an electric field may be formed in the same direction along the periphery (e.g., circumference) of the second electrode EL2 between the first electrode EL1 and the second electrode EL2. The light emitting elements LD supplied to the pixel area PXA may be arranged in the same direction between the first electrode EL1 and the second electrode EL2. For example, one end portions from among both end portions of the light emitting elements LD may face the first electrode EL1 and the other end portions of the light emitting elements LD may face the second electrode EL2.

Each of the light emitting elements LD may be a light emitting diode having a micro size, e.g., a size small to a degree of a nano-scale to a micro-scale, which is fabricated using a material having an inorganic crystalline structure. For example, each of the light emitting elements LD may be a micro light emitting element fabricated through an etching process or a micro light emitting element fabricated through a growth process.

At least two or a few tens of the light emitting elements LD may be aligned and/or provided in the pixel area PXA of each pixel PXL, but the number of the light emitting elements LD is not limited thereto. In some embodiments, the number of the light emitting elements LD aligned and/or provided in the pixel area PXA may be variously changed.

Each of the light emitting elements LD may emit any one of colored light and/or white light. Each of the light emitting elements LD may be aligned on the first insulating layer INS1 between the first and second electrodes EL1 and EL2 such that the extending direction (or length L direction) of the light emitting element LD is parallel to the first direction DR1. The light emitting elements LD may be provided in a form in which they are dispersed in a solution, to be injected into the pixel area PXA of each pixel PXL.

The light emitting elements LD may be mixed with a volatile solvent to be supplied to the pixel area PXA through an inkjet printing process or a slit coating process. When an alignment signal corresponding to each of the first and second electrodes EL1 and EL2 provided in the pixel area PXA is applied, an electric field may be formed between the first and second electrodes EL1 and EL2. Therefore, the light emitting elements LD may be self-aligned between the first electrode EL1 and the second electrode EL2.

After the light emitting elements LD are aligned, the solvent is volatilized or removed through another process, so that the light emitting elements LD can be finally aligned and/or provided in the pixel area PXA of each pixel PXL.

In one or more embodiments of the present disclosure, the light emitting elements LD may include a plurality of first light emitting elements LD1, a plurality of second light emitting elements LD2, a plurality of third light emitting elements LD3, and a plurality of fourth light emitting elements LD4.

The first light emitting elements LD1 may be disposed between the (1-1)th electrode EL1_1 and the first side S1 of the second electrode EL2. The second light emitting elements LD2 may be disposed between the (1-2)th electrode EL1_2 and the second side S2 of the second electrode EL2. The third light emitting elements LD3 may be disposed between the (1-3)th electrode EL1_3 and the third side S3 of the second electrode EL2. The fourth light emitting elements LD4 may be disposed between the (1-4)th electrode EL1_4 and the fourth side S4 of the second electrode EL2.

The first light emitting elements LD may be aligned in the same direction between the (1-1)th electrode EL1_1 and one area of the second electrode EL2, which includes the first side S1. In some example embodiments, one end portion of each of the first light emitting elements LD1 may be connected to the (1-1)th electrode EL1_1, and the other end portion of the first light emitting element LD1 may be connected to the one area of the second electrode EL2, which includes the first side S1. In some embodiments of the present disclosure, the (1-1)th electrode EL1_1 and the one area of the second electrode EL2, which includes the first side S1, along with the first light emitting elements LD1 connected in parallel in the same direction therebetween may constitute a first serial stage SET1.

The second light emitting elements LD2 may be aligned in the same direction between the (1-2)th electrode EL1_2 and one area of the second electrode EL2, which includes the second side S2. In some example embodiments, one end portion of each of the second light emitting elements LD2 may be connected to the (1-2)th electrode EL1_2, and the other end portion of the second light emitting element LD2 may be connected to the one area of the second electrode EL2, which includes the second side S2. The (1-2)th electrode EL1_2 and the one area of the second electrode EL2, which includes the second side S2, along with the second light emitting elements LD2 connected in parallel in the same direction therebetween may constitute a second serial stage SET2.

The third light emitting elements LD3 may be aligned in the same direction between the (1-3)th electrode EL1_3 and one area of the second electrode EL2, which includes the third side S3. In some example embodiments, one end portion of each of the third light emitting elements LD3 may be connected to the (1-3)th electrode EL1_3, and the other end portion of the third light emitting element LD3 may be connected to the one area of the second electrode EL2, which includes the third side S3. The (1-3)th electrode EL1_3 and the one area of the second electrode EL2, which includes the third side S3, along with the third light emitting elements LD3 connected in parallel in the same direction therebetween may constitute a third serial stage SET3.

The fourth light emitting elements LD4 may be aligned in the same direction between the (1-4)th electrode EL1_4 and one area of the second electrode EL2, which includes the fourth side S4. In some example embodiments, one end portion of each of the fourth light emitting elements LD4 may be connected to the (1-4)th electrode EL1_4, and the other end portion of the fourth light emitting element LD4 may be connected to the one area of the second electrode EL2, which includes the fourth side S4. The (1-4)th electrode EL1_4 and the one area of the second electrode EL2, which includes the fourth side S4, along with the fourth light emitting elements LD4 connected in parallel in the same direction therebetween may constitute a fourth serial stage SET4.

The above-described first to fourth light emitting elements LD1 to LD4 may be provided and/or formed on the first insulating layer INS1.

The first insulating layer INS1 may include an inorganic insulating layer made of an inorganic material or an organic insulating layer made of an organic material. In some embodiments of the present disclosure, the first insulating layer INS1 may be configured as an inorganic insulating layer that is suitable for protecting the light emitting elements LD from the pixel circuit layer PCL of each pixel PXL. In some example embodiments, the first insulating layer INS1 may include at least one of silicon oxide (SiOx), silicon nitride (SiNx), silicon oxynitride (SiON), and metal oxide such as aluminum oxide (AlOx), but the present disclosure is not limited thereto. In some embodiments, the first insulating layer INS1 may be configured as an organic insulating layer that is suitable for planarizing a supporting surface of the light emitting elements LD.

The first insulating layer INS1 may include a first opening OPN1 exposing one area of the first electrode EL1 and a second opening OPN2 exposing one area of the second electrode EL2. The first insulating layer INS1 may cover the other areas except the one area of the first electrode EL1 and the one area of the second electrode EL2.

The second insulating layer INS2 may be provided and/or formed on each of the light emitting elements LD. The second insulating layer INS2 may be provided and/or formed on the light emitting elements LD to partially cover the outer peripheral surface (e.g., the outer circumferential surface) of each of the light emitting elements LD and to expose both end portions of each of the light emitting elements LD to the outside.

The second insulating layer INS2 may be configured in a single layer or a multi-layer, and include an inorganic insulating layer including at least one inorganic material or an organic insulating layer including at least one organic material. The second insulating layer INS2 may allow each of the light emitting elements LD to be further fixed. The second insulating layer INS2 may include an inorganic insulating layer that is suitable for protecting the active layer 12 of each of the light emitting elements LD from external oxygen, moisture, and the like. However, the present disclosure is not limited thereto. The second insulating layer INS2 may include an organic insulating layer including an organic material according to design conditions of the display device to which the light emitting elements LD are applied.

In some embodiments of the present disclosure, after the light emitting elements LD are completely aligned in the pixel area PXA of each pixel PXL, the second insulating layer INS2 is formed over the light emitting elements LD, so that the light emitting elements LD can be prevented from being separated from the position at which the light emitting elements LD are aligned. When a gap (or space) exists between the first insulating layer INS1 and the light emitting elements LD before the second insulating layer INS2 is formed, the gap may be filled with the second insulating layer INS2 in the process of forming the second insulating layer INS2. Accordingly, the light emitting elements LD may be configured with an organic insulating layer that is suitable for filling the gap between the first insulating layer INS1 and the light emitting elements LD.

First and second contact electrodes CNE1 and CNE2 and an intermediate electrode CTE may be provided and/or formed on the first and second electrodes EL1 and EL2.

The first and second electrodes CNE1 and CNE2 may be components which more stably and electrically connect each of the first and second electrodes EL1 and EL2 to the light emitting elements LD.

The first contact electrode CNE1 may be provided and/or formed on the (1-1)th electrode EL1_1. The first contact electrode CNE1 may be connected to the (1-1)th electrode EL1_1 by being in direct contact with the (1-1)th electrode EL1_1 through the first opening OPN1. Also, the first contact electrode CNE1 may be provided and/or formed on one end portion of each of the first light emitting elements LD1 to be connected to the one end portion of each of the first light emitting elements LD1. A signal of the driving transistor Tdr, which is applied to the (1-1)th electrode EL1_1, may be transferred to the one end portion of each of the light emitting elements LD1 through the first contact electrode CNE1.

The second contact electrode CNE2 may be provided and/or formed on one area of the second electrode EL2, which includes the fourth side S4. The second contact electrode CNE2 may be connected to the second electrode EL2 by being in direct contact with the second electrode EL2 through the second opening OPN2. Also, the second contact electrode CNE2 may be provided and/or formed on the other end portion of each of the fourth light emitting elements LD4 to be connected to the other end portion of each of the fourth light emitting elements LD4.

The first and second contact electrodes CNE1 and CNE2 may be made of various transparent conductive materials (or substances) so as to allow light which is emitted from each of the light emitting elements LD and then reflected by the first and second electrodes EL1 and EL2 to advance in the image display direction of the display device without loss of light. In some example embodiments, the first and second contact electrodes CNE1 and CNE2 may include at least one of various transparent conductive materials including indium tin oxide (ITO), indium zinc oxide (IZO), zinc oxide (ZnO), indium gallium zinc oxide (IGZO), and indium tin zinc oxide (ITZO), and may be substantially transparent or translucent to satisfy a transmittance (e.g., a set or predetermined transmittance or transmittancy). However, the material of the first and second contact electrodes CNE1 and CNE2 is not limited to the above-described embodiment. In some embodiments, the first and second contact electrodes CNE1 and CNE2 may be made of various opaque conductive materials. The opaque conductive material may include, for example, titanium (Ti), aluminum (Al), silver (Ag), and the like, but the present disclosure is not limited thereto. Also, the first and second contact electrodes CNE1 and CNE2 may be formed as a single layer or a multi-layer.

When viewed on a plane, each of the first and second contact electrodes CNE1 and CNE2 may have a bar-like shape extending in one direction, but the present disclosure is not limited thereto. In some embodiments, the shape of each of the first and second contact electrodes CNE1 and CNE2 may be variously changed within a range in which each of the first and second contact electrodes CNE1 and CNE2 is electrically stably connected to each of the light emitting elements LD. Also, the shape of each of the first and second contact electrodes CNE1 and CNE2 may be variously changed by considering a connection relationship with electrodes disposed on the bottom thereof.

When viewed on a plane, the intermediate electrode CTE may overlap with each of one area of the first electrode EL1 and one area of the second electrode EL2. The intermediate electrode CTE may be an electrode to which a signal (e.g., a set or predetermined signal or voltage) is not transferred from the outside. In some example embodiments of the present disclosure, the intermediate electrode CTE may include a first intermediate electrode CTE1, a second intermediate electrode CTE2, and a third intermediate electrode CTE3.

The first intermediate electrode CTE1 may be provided on each of one area of the second electrode EL2, which includes the first side S1, and the (1-2)th electrode EL1_2, to overlap with the one area of the second electrode EL2 and the (1-2)th electrode EL1_2. Also, the first intermediate electrode CTE1 may be provided on a first corner part CON1 of the second electrode EL2, at which the first side S1 and the second side S2 are in contact with (or meet) each other, to overlap with the first corner part CON1.

The first intermediate electrode CTE1 may be divided into a first area A1 and a second area A2. The first area A1 may be one area of the first intermediate electrode CTE1, which corresponds to or overlaps with) the (1-2)th electrode EL1_2, and the second area A2 may be one area of the first intermediate electrode CTE1, which corresponds to (or overlaps with) the one area of the second electrode EL2, which includes the first side S1. The first area A1 and the second area A2 may be integrally provided to be connected to each other.

The first intermediate electrode CTE1 may be disposed on the first insulating layer INS1 over the first and second electrodes EL1 and EL2 to be electrically insulated from the first and second electrodes EL1 and EL2. That is, the first area A1 of the first intermediate electrode CTE1 may be electrically insulated from the (1-2)th electrode EL1_2 by the first insulating layer INS1 disposed on the bottom thereof, and the second area A2 of the first intermediate electrode CTE1 may be electrically insulated from the one area of the second electrode EL2, which includes the first side S1.

In some embodiments of the present disclosure, the second area A2 of the first intermediate electrode CTE1 may be disposed on the other end portion of each of the first light emitting elements LD1 to be electrically and/or physically connected to the first light emitting elements LD1. The first area A1 of the first intermediate electrode CTE1 may be disposed on one end portion of each of the second light emitting elements LD2 to be electrically and/or physically connected to the second light emitting elements LD2. The first intermediate electrode CTE1 may serve as a first bridge electrode (or first connection electrode) connecting the first light emitting elements LD1 and the second light emitting elements LD2. In an example, the first intermediate electrode CTE1 may be the first bridge electrode (or first connection electrode) connecting the first serial stage SET1 and the second serial stage SET2.

The first intermediate electrode CTE1 may be provided throughout one area of the first electrode EL1 (e.g., the (1-2)th electrode EL1_2 and one area of the second electrode EL2 (e.g., the one area of the second electrode EL2, which includes the first side S1) to have a bar-like shape bent at least once. The shape of the first intermediate electrode CTE1 is not limited to the above-described embodiment. In some embodiments, the first intermediate electrode CTE1 may be changed in various shapes within a range in which the first intermediate electrode CTE1 stably connects the first serial stage SET1 and the second serial stage SET2, which are consecutive.

The second intermediate electrode CTE2 may be provided on each of the (1-3)th electrode EL1_3 and the one area of the second electrode EL2, which includes the second side S2, to overlap with the one area of the second electrode EL2 and the (1-3)th electrode EL1_3. Also, the second intermediate electrode CTE2 may be provided on a second corner part CON2 of the second electrode EL2, at which the second side S2 and the third side S3 are in contact with (or meet) each other, to overlap with the second corner part CON2.

The second intermediate electrode CTE2 may include a first area A1 corresponding to (or overlapping with) the (1-3)th electrode EL1_3 and a second area A2 corresponding to (or overlapping with) the one area of the second electrode EL2, which includes the second side S2. The first area A1 and the second area A2 may be different areas of the second intermediate electrode CTE2. The first area A1 and the second area A2 may be integrally provided to be connected to each other.

The second intermediate electrode CTE2 may be disposed on the first insulating layer INS1 to be electrically insulated from the first and second electrodes EL1 and EL2. In some example embodiments, the first area A1 of the second intermediate electrode CTE2 may be electrically insulated from the (1-3)th electrode EL1_3 by the first insulating layer INS1 disposed on the bottom thereof, and the second area A2 of the second intermediate electrode CTE2 may be electrically insulating from the one area of the second electrode EL2, which includes the second side S2, by the first insulating layer INS1.

In some example embodiments of the present disclosure, the second area A2 of the second intermediate electrode CTE2 may be disposed on the other end portion of each of the second light emitting elements LD2 to be electrically and/or physically connected to the second light emitting elements LD2. The first area A1 of the second intermediate electrode CTE2 may be disposed on one end portion of each of the third light emitting elements LD3 to be electrically and/or physically connected to the third light emitting elements LD3. The second intermediate electrode CTE2 may serve as a second bridge electrode (or second connection electrode) connecting the second light emitting elements LD2 and the third light emitting elements LD3. In an example, the second intermediate electrode CTE2 may be the second bridge electrode (or second connection electrode) connecting the second serial stage SET2 and the third serial stage SET3.

The second intermediate electrode CTE2 may be provided throughout one area of the first electrode EL1 (e.g., the (1-3)th electrode EL1_3) and one area of the second electrode EL2 (e.g., the one area of the second electrode EL2, which includes the second side S2) to have a bar-like shape bent at least once. The shape of the second intermediate electrode CTE2 is not limited to the above-described embodiments. In some embodiments, the second intermediate electrode CTE2 may be changed in various shapes within a range in which the second intermediate electrode CTE2 stably connects the second serial stage SET2 and the third serial stage SET3, which are consecutive.

The third intermediate electrode CTE3 may be provided on each of the (1-4)th electrode EL1_4 and the one area of the second electrode EL2, which includes the third side S3, to overlap with the one area of the second electrode EL2 and the (1-4)th electrode EL1_4. Also, the third intermediate electrode CTE3 may be provided on a third corner part CON3 of the second electrode EL2, at which the third side S3 and the fourth side S4 are in contact with (or meet) each other.

The third intermediate electrode CTE3 may include a first area A1 corresponding to the (1-4)th electrode EL1_4 and a second area A2 corresponding to the one area of the second electrode EL2, which includes the third side S3. The first area A1 and the second area A2 may be different areas of the third intermediate electrode CTE3. The first area A1 and the second area A2 may be integrally provided to be connected to each other.

The third intermediate electrode CTE3 may be disposed on the first insulating layer INS1 to be electrically insulating from the first and second electrodes EL1 and EL2. In some example embodiments, the first area A1 of the third intermediate electrode CTE3 may be electrically insulated from the (1-4)th electrode EL1_4 by the first insulating layer INS1 disposed on the bottom thereof, and the second area A2 of the third intermediate electrode CTE3 may be electrically insulated from the one area of the second electrode EL2, which includes the third side S3, by the first insulating layer INS1.

In some embodiments of the present disclosure, the second area A2 of the third intermediate electrode CTE3 may be disposed on the other end portion of each of the third light emitting elements LD3 to be electrically and/or physically connected to the third light emitting elements LD3. The first area A1 of the third intermediate electrode CTE3 may be disposed on one end portion of each of the fourth light emitting elements LD4 to be electrically and/or physically connected to the fourth light emitting elements LD4. The third intermediate electrode CTE3 may serve as a third bridge electrode (or third connection electrode) connecting the third light emitting elements LD3 and the fourth light emitting elements LD4. For example, the third intermediate electrode CTE3 may be the third bridge electrode (or third connection electrode) connecting the third serial stage SET3 and the fourth serial stage SET4.

The third intermediate electrode CTE3 may be provided throughout one area of the first electrode EL1 (e.g., the (1-4)th electrode EL1_4) and one area of the second electrode EL2 (e.g., the one area of the second electrode EL2, which includes the third side S3) to have a bar-like shape bent at least once. The shape of the third intermediate electrode CTE3 is not limited to the above-described embodiment. In some embodiments, the third intermediate electrode CTE3 may be changed in various shapes within a range in which the third intermediate electrode CTE3 stably connects the third serial stage SET3 and the fourth serial stage SET4, which are consecutive.

In the pixel area PXA of each of the pixels PXL, the first and second contact electrodes CNE1 and CNE2 and the first to third intermediate electrodes CTE1 to CTE3 may be disposed to be spaced from each other on a plane and a section.

The first contact electrode CNE1 may face the second area A2 of the first intermediate electrode CTE1, and extend in the same direction as the second area A2 of the first intermediate electrode CTE1, e.g., the first direction DR1. The first contact electrode CNE1 and the second area A2 of the first intermediate electrode CTE1 may be spaced from each other in the second direction DR2.

The first area A1 of the first intermediate electrode CTE1 may face the second area A2 of the second intermediate electrode CTE2, and extend in the same direction as the second area A2 of the second intermediate electrode CTE2, e.g., the second direction DR2. The first area A1 of the first intermediate electrode CTE1 and the second area A2 of the second intermediate electrode CTE2 may be spaced from each other in the first direction DR1.

The first area A1 of the second intermediate electrode CTE2 may face the second area A2 of the third intermediate electrode CTE3, and extend in the same direction as the second area A2 of the third intermediate electrode CTE3, e.g., the first direction DR1. The first area A1 of the second intermediate electrode CTE2 and the second area A2 of the third intermediate electrode CTE3 may be spaced from each other in the second direction DR2.

The first area A1 of the third intermediate electrode CTE3 may face the second contact electrode CNE2, and extend in the same direction as the second contact electrode CNE2, e.g., the second direction DR2. The first area A1 of the third intermediate electrode CTE3 and the second contact electrode CNE2 may be spaced apart from each other in the first direction DR1.

The first to third intermediate electrodes CTE1 to CTE3 may be made of various transparent conductive materials (or substances) so as to allow light which is emitted from each of the light emitting elements LD and then reflected by the first and second electrodes EL1 and EL2 to advance in the pixel display direction of the display device without loss of light. The first to third intermediate electrodes CTE1 to CTE3 may include the same material as the first and second contact electrodes CNE1 and CNE2, and be formed through the same process as the first and second contact electrodes CNE1 and CNE2.

The first to third intermediate electrodes CTE1 to CTE3 may be provided in the same layer as the first and second contact electrodes CNE1 and CNE2 to be formed through the same process. In an example, the first to third intermediate electrodes CTE1 to CTE3 and the first and second contact electrodes CNE1 and CNE2 may be provided and/or formed on the second insulating layer INS2. However, the present disclosure is not limited thereto. In some embodiments, the first to third intermediate electrodes CTE1 to CTE3 may be provided in a layer different from that of the first and second contact electrodes CNE1 and CNE2, and may be formed through a process different from that of the first and second contact electrodes CNE1 and CNE2. When the first and second contact electrodes CNE1 and CNE2 and the first to third intermediate electrodes CTE1 to CTE3 are provided in different layers and are formed through different processes, an auxiliary insulating layer AUINS may be provided and/or formed each of between the first contact electrode CNE1 and the first intermediate electrode CTE1 and between the third intermediate electrode CTE3 and the second contact electrode CNE2 as shown in FIGS. 13 and 14. The auxiliary insulating layer AUINS may be provided on each of the first and second contact electrode CNE1 and CNE2 to cover the first and second contact electrodes CNE1 and CNE2. The auxiliary insulating layer AUINS may include the same material as the first and second insulating layers INS1 and INS2, or include at least one material selected from the materials exemplified as the material consisting the first and second insulating layers INS1 and INS2. In some example embodiments, the auxiliary insulating layer AUINS may be an inorganic insulating layer including an inorganic material or an organic insulating layer including an organic material. As described above, when the auxiliary insulating layer AUINS is disposed on the first and second contact electrodes CNE1 and CNE2, the first to third intermediate electrodes CTE1 to CTE3 may be provided on the auxiliary insulating layer AUINS.

The third insulating layer INS3 may be provided and/or formed over the first and second contact electrodes CNE1 and CNE2 and the first to third intermediate electrodes CTE1 to CTE3. The third insulating layer INS3 may be an inorganic insulating layer including an inorganic material or an organic insulating layer including an organic material. In some example embodiments, the third insulating layer INS3 may have a structure in which at least one inorganic insulating layer and at least one organic insulating layer are alternately stacked. The third insulating layer INS3 may be an encapsulation layer which entirely covers the display element layer DPL to block moisture, humidity or the like from the outside from being introduced to the display element layer DPL including the light emitting elements LD.

In some embodiments, an upper substrate U_SUB may be provided on the third insulating layer INS3 as shown in FIG. 12.

The upper substrate U_SUB may be disposed on the display element layer DPL to cover the display area DA in which the pixels PXL are arranged. The upper substrate U_SUB may constitute an encapsulation substrate (or thin film encapsulation layer) and/or a window member of the display device. An intermediate layer CTL may be provided between the upper substrate U_SUB and the display element layer DPL. The intermediate layer CTL may be a transparent adhesive layer (or cohesive layer), e.g., an optically clear adhesive for reinforcing adhesion between the display element layer DPL and the upper substrate U_SUB, but the present disclosure is not limited thereto.

The upper substrate U_SUB may include a base layer BSL and a light conversion pattern layer LCP.

The base layer BSL may be a rigid substrate or a flexible substrate, and the material or property of the base layer BSL is not particularly limited. The base layer BSL may be made of the same material as the substrate SUB or may be made of a material different from that of the substrate SUB.

The light conversion pattern layer LCP may be disposed on one surface of the base layer BSL to face the pixels PXL of the substrate SUB. The light conversion pattern layer LCP may include a color conversion layer CCL and a color filter CF, which correspond to a suitable color (e.g., a predetermined color).

The color conversion layer CCL may include color conversion particles QD corresponding to a specific color. The color filter CF may allow light of the specific color to be selectively transmitted therethrough. One color conversion layer CCL may be disposed on one surface of the base layer BSL to face one pixel PXL (or one sub-pixel), and may include color conversion particles QD for converting light of a certain color, which is emitted from light emitting elements LD disposed in the one pixel PXL, into light of the specific color. In some example embodiments, when the one pixel PXL is a red pixel, the color conversion layer CCL may include color conversion particles QD of a red quantum dot for converting light emitted from the light emitting elements LD into red light. In another example embodiment, when the one pixel PXL is a green pixel, the color conversion layer CCL may include color conversion particles QD of a green quantum dot for converting light emitted from the light emitting elements LD into green light. In still another example embodiment, when the one pixel PXL is a blue pixel, the color conversion layer CCL may include color conversion particles QD of a blue quantum dot for converting light emitted from the light emitting elements LD into blue light.

The color filter CF may be disposed between the color conversion layer CCL and the base layer BSL, and may include a color filter material for allowing light of a specific color, which is converted by color conversion layer CCL to be selectively transmitted therethrough. The color filter CF may include a red color filter, a green color filter, and a blue color filter.

A first light blocking pattern LBP1 may be disposed between the color filter CF corresponding to the one pixel PXL and a color filter (not shown) corresponding to a pixel adjacent to the one pixel PXL. The first light blocking pattern LBP1 may be provided on the base layer BSL to overlap with a bank BNK provided in the pixel area PXA of a corresponding pixel PXL. In some embodiments, a second light blocking pattern LBP2 may be disposed on the first light blocking pattern LBP1. The first light blocking pattern LBP1 and the second light blocking pattern LBP2 may include the same material. In some example embodiments, the first light blocking pattern LBP1 and the second light blocking pattern LBP2 may correspond to a black matrix.

As shown in FIGS. 11-12, when assuming that a driving current flows from the first power line PL1 to the driving voltage line DVL by the driving transistor Tdr of the pixel circuit layer PCL included in each pixel PXL, the driving current may be introduced to the light emitting unit EMU of each pixel PXL through the first contact hole CH1.

In some example embodiments, a driving current is supplied to one area of the first electrode EL1, e.g., the (1-1)th electrode EL1_1 through the first contact hole CH1, and flows in the second area A2 of the first intermediate electrode CTE1 via the first light emitting elements LD1 through the first contact electrode CNE1 directly in contact with (or connected to) the (1-1)th electrode EL1_1. Accordingly, the first light emitting elements LD1 in the first serial stage SET1 can emit light with a luminance corresponding to a current divided and applied to each thereof.

A driving current flowing in the second area A2 of the first intermediate electrode CTE1 flows in the second area of the second intermediate electrode CTE2 via the first area A1 of the first intermediate electrode CTE1 and the second light emitting elements LD2. Accordingly, the second light emitting elements LD2 in the second serial stage SET2 can emit light with a luminance corresponding to a current divided and applied to each thereof.

A driving current flowing in the second area A2 of the second intermediate electrode CTE2 flows in the second area A2 of the third intermediate electrode CTE3 via the first area A1 of the second intermediate electrode CTE2 and the third light emitting elements LD3. Accordingly, the third light emitting elements LD3 in the third serial stage SET3 can emit light with a luminance corresponding to a current divided and applied to each thereof.

A driving current flowing in the second area A2 of the third intermediate electrode CTE3 flows in the second contact electrode CNE2 via the first area A1 of the third intermediate electrode CTE3 and the fourth light emitting elements LD4. Accordingly, the fourth light emitting elements LD4 in the fourth serial stage SET4 can emit light with a luminance corresponding to a current divided and applied to each thereof.

In the above-described manner, the driving current of each pixel PXL may flow while sequentially passing through the first light-emitting elements LD1 of the first series stage SET1, the second light-emitting elements LD2 of the second series stage SET2, the third light emitting elements LD3 of the third serial stage SET3 and the fourth light emitting elements LD4 of the fourth serial stage SET4. Accordingly, each pixel PXL may emit light with a luminance corresponding to the data signal supplied during each frame period.

The first contact electrode CNE1 and the second area A2 of the first intermediate electrode CTE1 along with the first light emitting elements LD1, the (1-1)th electrode EL1_1, and the one area of the second electrode EL2, which includes the first side S1, may constitute the first serial stage SET1.

The first area A1 of the first intermediate electrode CTE1 and the second area A2 of the second intermediate electrode CTE2 along with the second light emitting elements LD2, the (1-2)th electrode EL1_2, and the one area of the second electrode EL2, which includes the second side S2, may constitute the second serial stage.

The first area A1 of the second intermediate electrode CTE2 and the second area A2 of the third intermediate electrode CTE3 along with the third light emitting elements LD3, the (1-3)th electrode EL1_3, and the one area of the second electrode EL2, which includes the third side S3, may constitute the third serial stage SET3.

The first area A1 of the third intermediate electrode CTE3 and the second contact electrode CNE2 along with the fourth light emitting elements LD4, the (1-4)th electrode EL1_4, and the one area of the second electrode EL2, which includes the fourth side S4, may constitute the fourth serial stage SET4.

In some embodiments of the present disclosure, in a process of forming the first contact electrode CNE1 of the first serial stage SET1 and the second contact electrode CNE2 of the fourth serial stage SET4, the first intermediate electrode CTE1 connecting the first serial stage SET1 and the second serial stage SET2, the second intermediate electrode CTE2 connecting the second serial stage SET2 and the third serial stage SET3, and the third intermediate electrode CTE3 connecting the third serial stage SET3 and the fourth serial stage SET4 may be concurrently (e.g., simultaneously) formed. Accordingly, a manufacturing process of each pixel PXL and the display device including the same is simplified, and thus the yield of products can be improved.

In accordance with the above-described embodiments, when a second electrode EL2 including first to fourth sides S1 to S4 is disposed in the middle of the pixel area PXA of each pixel PXL, and a first electrode EL1 is disposed to surround (or enclose) the second electrode EL2 along the periphery (e.g. circumference) of the second electrode EL2, the light emitting elements LD may be radially arranged along the first to fourth sides S1 to S4 of the second electrode EL2 between the first electrode EL1 and the second electrode EL2. For example, the light emitting elements LD may be arranged in the same direction between the first electrode EL1 and the second electrode EL2 such that one end portions or the other end portions of the light emitting elements LD all face the second electrode EL2. When the second electrode EL2 is disposed in the middle of the pixel area PXA, the light emitting elements LD may be aligned to concentrate on the middle of the pixel area PXA. Light emitted from the light emitting elements LD and then reflected by the first and second electrodes EL1 and EL2 may concentrate on (or advance toward) the color conversion layer CCL located on the top of a corresponding pixel PXL without loss of light. Accordingly, a larger amount of light advances toward the color conversion layer CCL, and hence the amount (or intensity) of light finally emitted from the color conversion layer CCL increases. Thus, the light output efficiency of each pixel PXL can be improved.

Additionally, when the light emitting elements LD are radially aligned along the periphery (e.g., circumference) of the second electrode EL2, the alignment area of the light emitting elements LD can be further secured, and the light emitting elements LD in the pixel area PXA can be aligned to concentrate on a desired area (or wanted area). Accordingly, an abnormal alignment failure in which the light emitting elements LD are aligned in an unwanted area can be prevented.

Also, in accordance with the above-described embodiment, a second electrode having a quadrangular shape is disposed in the middle (or center) of the pixel area PXA of each pixel PXL, a first electrode EL1 is disposed to surround the second electrode EL2 along the periphery (e.g., circumference) of the second electrode EL2, and the above-described first to third intermediate electrodes CTE1 to CTE3 are disposed, so that four consecutive serial stages SET1 to SET4 are electrically connected in the pixel area PXA. Light emitting elements LD included in each of the four consecutive serial stages SET1 to SET4 may be electrically connected to each other via a corresponding intermediate electrode CTE (e.g., CTE1, CTE2, CTE3). In some example embodiments, the first light emitting elements LD1 included in the first serial stage SET1, the second light emitting elements LD2 included in the second serial stage SET2, the third light emitting elements LD3 included in the third serial stage SET3, and the fourth light emitting elements LD4 included in the fourth serial stage SET4 may be electrically connected to each other through a corresponding intermediate electrode CTE (e.g., CTE1, CTE2, CTE3). In this manner, the light emitting elements LD aligned in the pixel area PXA of each pixel PXL are connected in a serial/parallel hybrid structure, to constitute a light emitting unit EMU of each pixel PXL. Accordingly, the light emitting unit EMU can be configured in a serial/parallel hybrid structure including four serial stages while reducing or minimizing an area occupied by alignment electrodes EL1 and EL2 (or while not increasing a number of alignment electrodes), and thus a high-resolution and fine-pitch display device can be easily implemented.

In accordance with the above-described embodiments, the light emitting unit EMU having the serial/parallel hybrid structure is configured, so that each pixel PXL is stably driven. Thus, a driving current flowing in a display panel of the display device is lowered, so that power consumption efficiency can be improved.

Figure 15A:
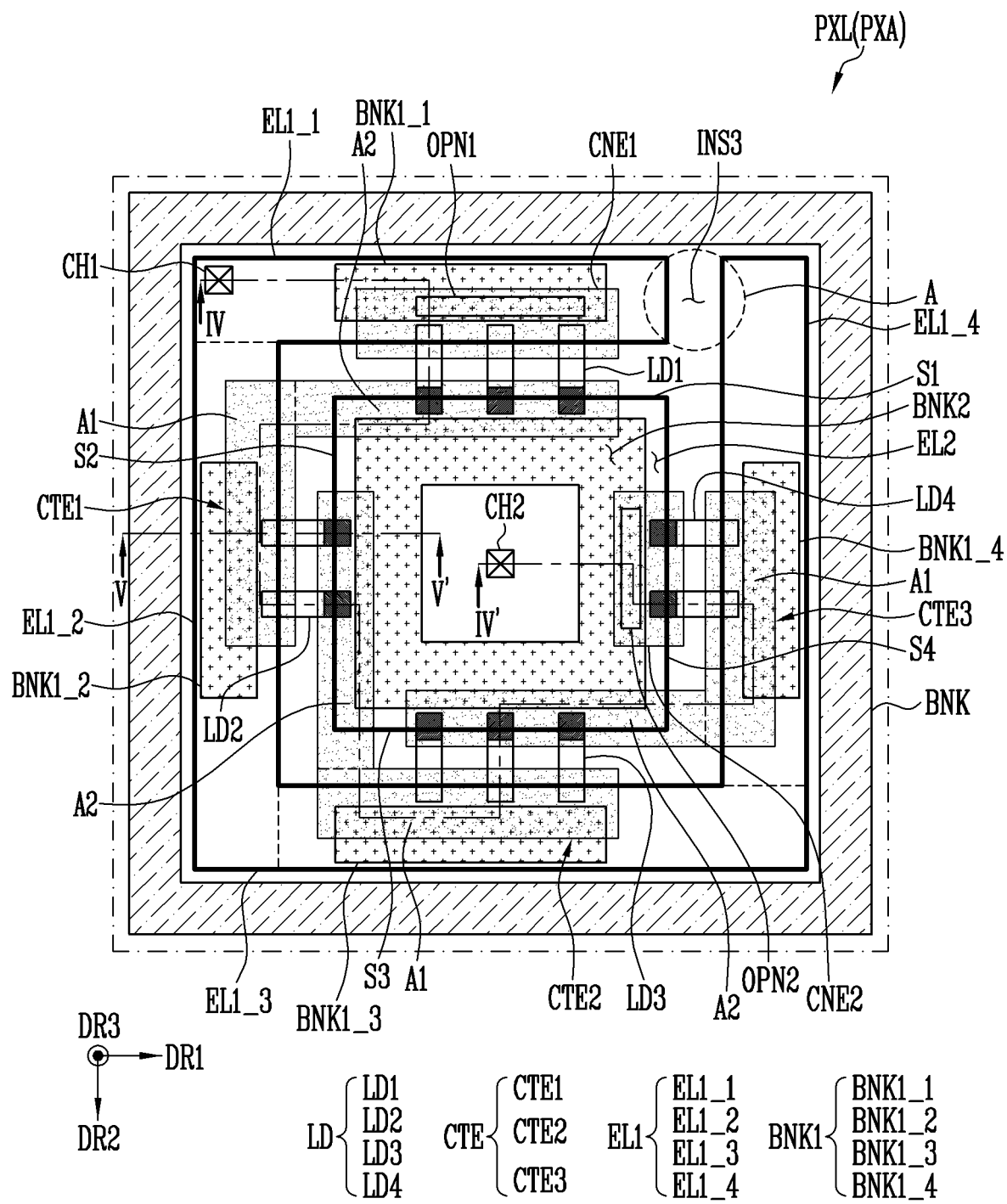
FIG. 15A is a plan view schematically illustrating a pixel in accordance with another example embodiment of the present disclosure.
Figure 15B:
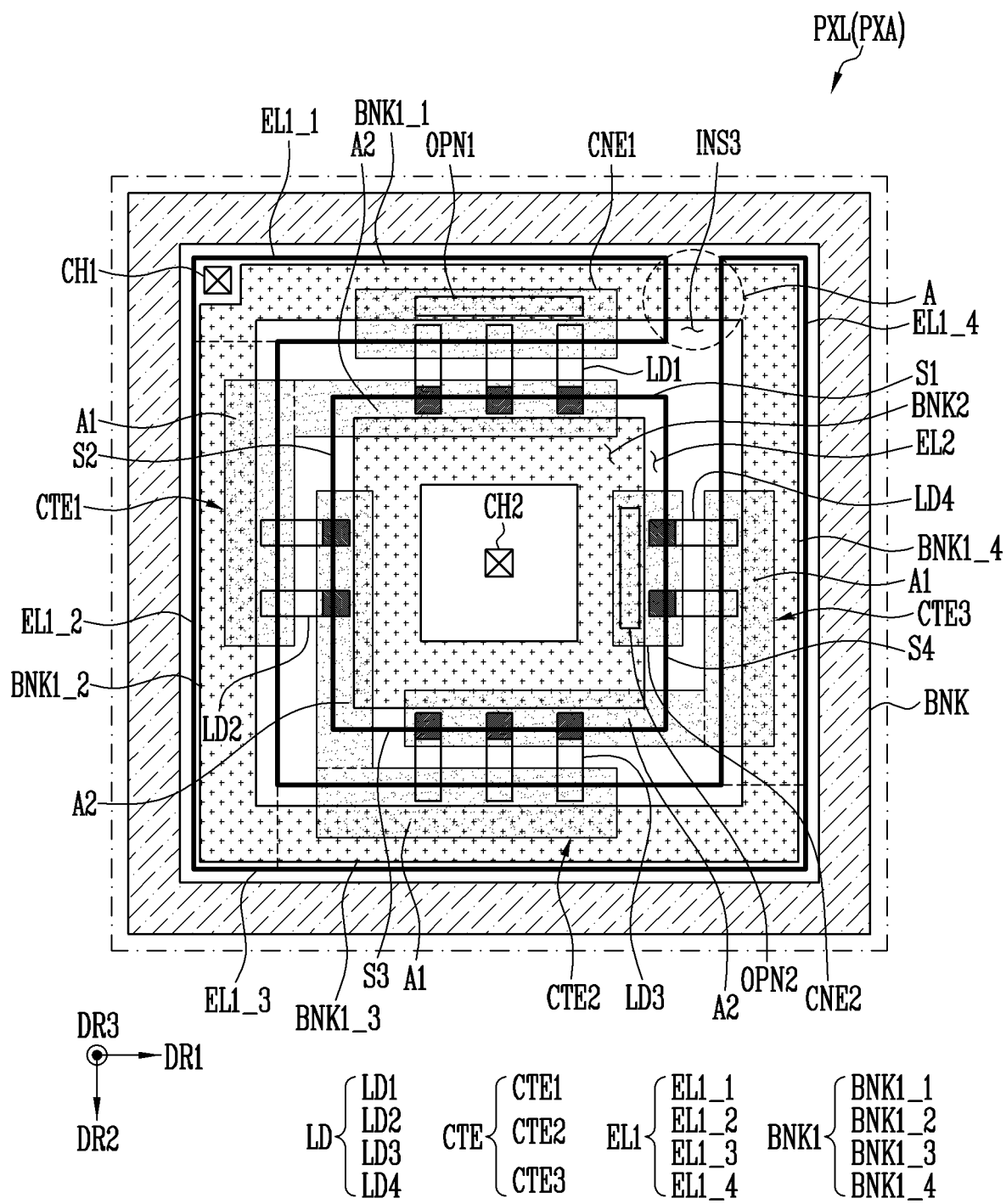
FIG. 15B is a schematic plan view illustrating another example embodiment of a first bank pattern shown in FIG. 15A.
Figure 16:
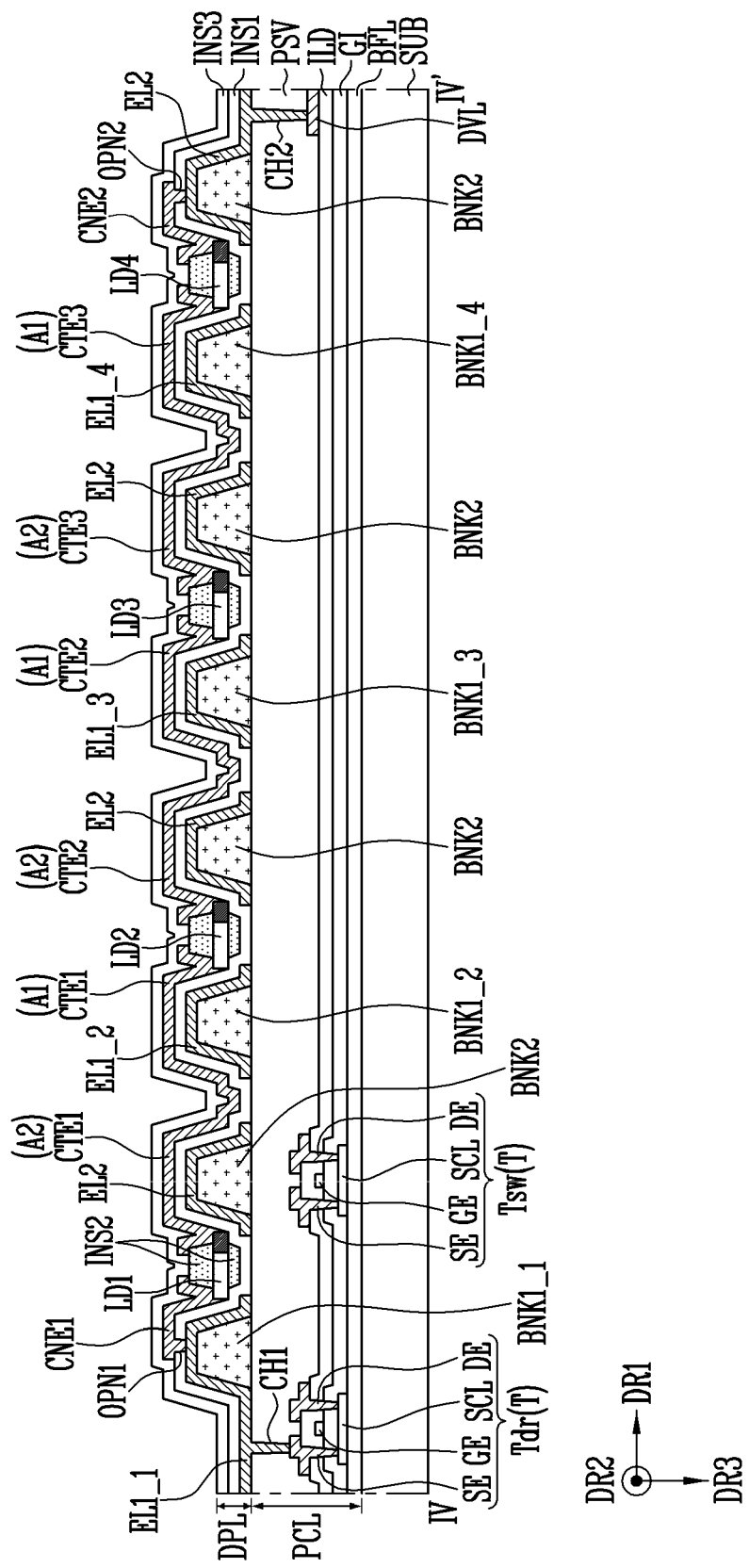
FIG. 16 is a sectional view taken along the line IV-IV' shown in FIG. 15A.
Figure 17:
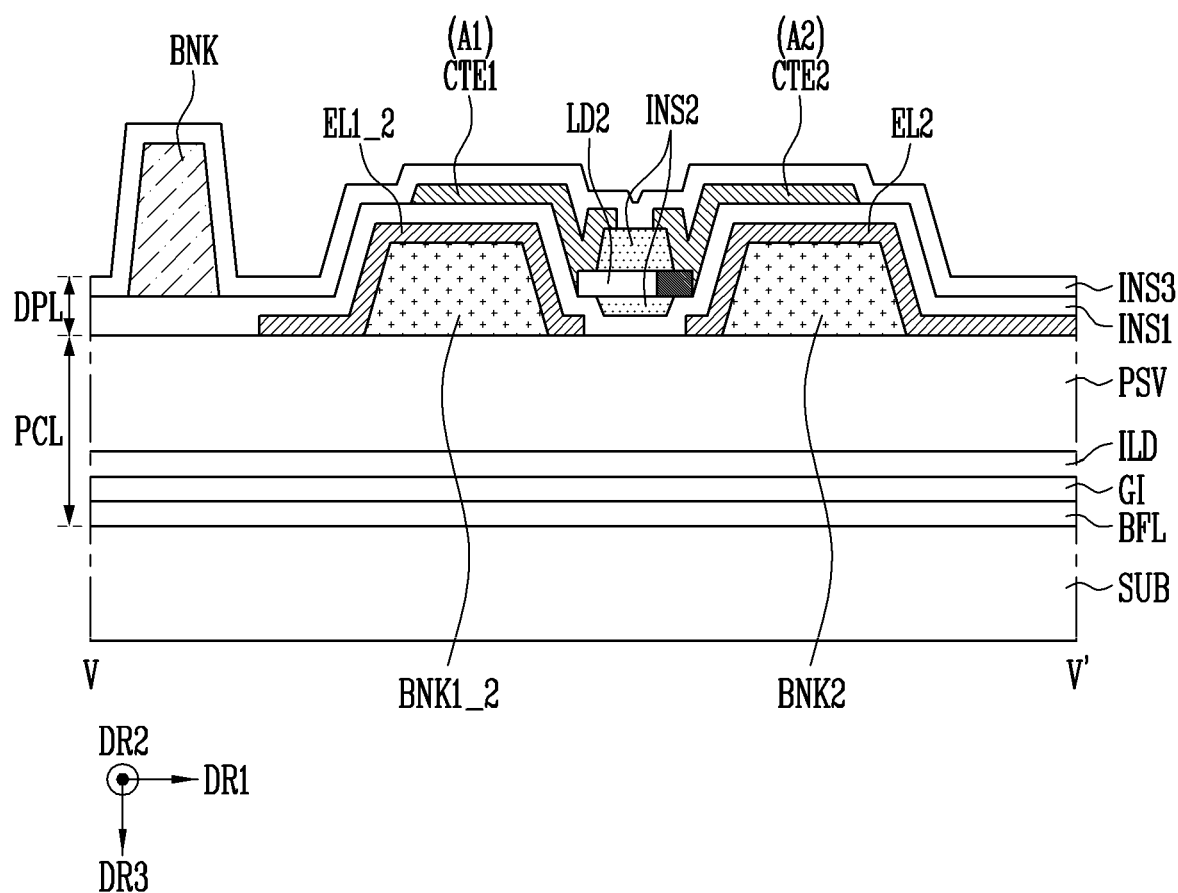
FIG. 17 is a sectional view taken along the line V-V' shown in FIG. 15A.
Figure 18:
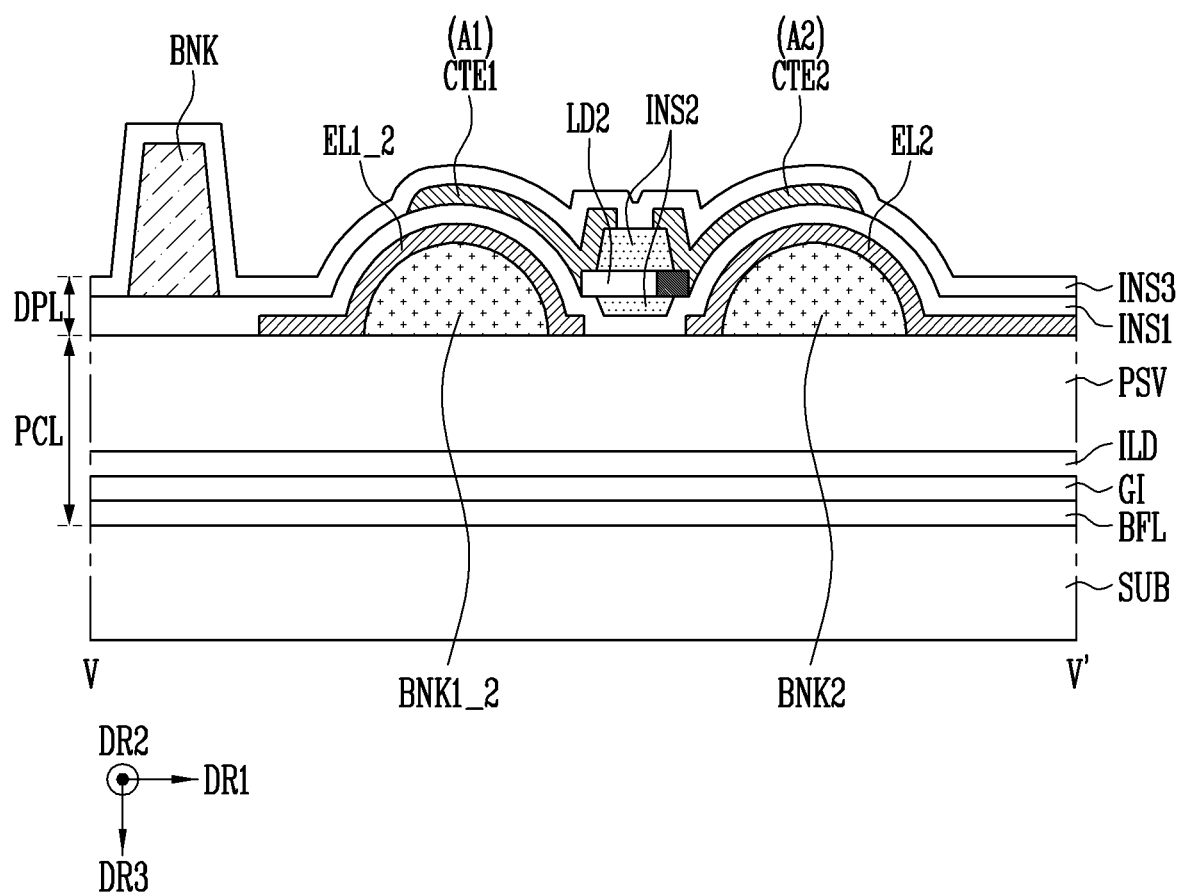
FIG. 18 illustrates another example embodiment of the first bank pattern shown in FIG. 17, and is a sectional view corresponding to the line V-V' shown in FIG. 15A.

FIG. 15A is a plan view schematically illustrating a pixel in accordance with another embodiment of the present disclosure. FIG. 15B is a schematic plan view illustrating another embodiment of a first bank pattern shown in FIG. 15A. FIG. 16 is a sectional view taken along the line IV-IV' shown in FIG. 15A. FIG. 17 is a sectional view taken along the line V-V' shown in FIG. 15A. FIG. 18 illustrates another embodiment of the first bank pattern shown in FIG. 17, and is a sectional view corresponding to the line V-V' shown in FIG. 15A.

In relation to the embodiments shown in FIGS. 15A-18, portions different from those of the above-described embodiment will be mainly described to avoid redundancy. Portions not particularly described in the present disclosure follow those of the above-described embodiment. Components similar and/or identical to those of the above-described embodiments are designated by like reference numerals.

Referring to FIGS. 1-6A and 15A to 18, a substrate SUB, a pixel circuit layer PCL, and a display element layer DPL may be disposed in a pixel area PXA of each pixel PXL.

In some embodiments of the present disclosure, the display element layer DPL may include first and second bank patterns BNK1 and BNK2, first and second electrodes EL1 and EL2, a bank BNK, light emitting elements LD, first and second contact electrodes CNE1 and CNE2, first to third intermediate electrodes CTE1 to CTE3, and first to third insulating layers INS1 to INS3.

The first and second bank patterns BNK1 and BNK2 may be located in an emission area from which light is emitted in the pixel area PXA of each pixel PXL. The first and second bank patterns BNK1 and BNK2 may correspond to a supporting member for supporting each of the first and second electrodes EL1 and EL2 to change a surface profile (or shape) of each of the first and second electrodes EL1 and EL2 such that light emitted from the light emitting elements LD is guided in the image display direction of the display device.

The first bank pattern BNK1 may be provided between a passivation layer PSV and the first electrode EL1 in the emission area of a corresponding pixel PXL. The first bank pattern BNK1 may include a (1-1)th bank pattern BNK1_1, a (1-2)th bank pattern BNK1_2, a (1-3)th bank pattern BNK1_3, and a (1-4)th bank pattern BNK1_4. The (1-1)th bank pattern BNK1_1 may be provided between one area of the first electrode EL1, e.g., a (1-1)th electrode EL1_1 and the passivation layer PSV. The (1-2)th bank pattern BNK1_2 may be provided between one area of the first electrode EL1, e.g., a (1-2)th electrode EL1_2 and the passivation layer PSV. The (1-3)th bank pattern BNK1_3 may be provided between one area of the first electrode EL1, e.g., a (1-3)th electrode EL1_3 and the passivation layer PSV. The (1-4)th bank pattern BNK1_4 may be provided between one area of the first electrode EL1, e.g., a (1-4)th electrode EL1_4 and the passivation layer PSV.

When viewed on a plane, each of the (1-1)th to (1-4)th bank patterns BNK1_1 to BNK1_4 may be provided in a form in which each of the (1-1)th to (1-4)th bank patterns BNK1_1 to BNK1_4 is spaced from an adjacent first bank pattern BNK1 of the (1-1)th to (1-4)th bank patterns BNK1_1 to BNK1_4. In some example embodiments, the (1-1)th bank pattern BNK1_1 may be spaced from each of the (1-2)th to (1-4)th bank patterns BNK1_2 to BNK1_4, the (1-2)th bank pattern BNK1_2 may be spaced from each of the (1-1)th bank pattern BNK1_1 and the (1-3)th and (1-4)th bank patterns BNK1_3 and BNK1_4, the (1-3)th bank pattern BNK1_3 may be spaced from each of the (1-1)th and (1-2)th bank patterns BNK1_1 and BNK1_2 and the (1-4)th bank pattern BNK1_4, and the (1-4)th bank pattern BNK1_4 may be spaced from each of the (1-1)th to (1-3)th bank patterns BNK1_1 to BNK1_3.

However, the present disclosure is not limited thereto. In some embodiments, the (1-1)th to (1-4)th bank patterns BNK1_1 to BNK1_4 may be connected to each other to be provided in a quadrangular ring shape forming a closed circuit surrounding the second electrode EL2 along the periphery (e.g., circumference) of the second electrode EL2 as shown in FIG. 15B. One end of the (1-1)th bank pattern BNK1_1 may be in contact with the (1-2)th bank pattern BNK1_2, and the other end of the (1-1)th bank pattern BNK1_1 may be in contact with the (1-4)th bank pattern BNK1_4. One end of the (1-2)th bank pattern BNK1_2 may be in contact with the (1-1)th bank pattern BNK1_1, and the other end of the (1-2)th bank pattern BNK1_2 may be in contact with the (1-3)th bank pattern BNK1_3. One end of the (1-3)th bank pattern BNK1_3 may be in contact with the (1-2)th bank pattern BNK1_2, and the other end of the (1-3)th bank pattern BNK1_3 may be in contact with the (1-4)th bank pattern BNK1_4. One end of the (1-4)th bank pattern BNK1_4 may be in contact with the (1-3)th bank pattern BNK1_3, and the other end of the (1-4)th bank pattern BNK1_4 may be in contact with the (1-1)th bank pattern BNK1_1. As described above, the first bank pattern BNK1 includes the (1-1)th to (1-4)th bank patterns BNK1_1 to BNK1_4 which are integrally provided to be connected to each other, to overlap with the first electrode EL1 on a plane and a section while being implemented in a quadrangular ring shape forming a closed circuit surrounding the second electrode EL2 along the periphery (e.g., circumference) of the second electrode EL2.

The second bank pattern BNK2 may be provided between the passivation layer PSV and the second electrode EL2 in the emission area.

The first and second bank patterns BNK1 and BNK2 may be an inorganic insulating layer including an inorganic material or an organic insulating layer including an organic material. In some embodiments, the first and second bank patterns BNK1 and BNK2 may include a single-layered organic insulating layer and/or a single-layered inorganic insulating layer, but the present disclosure is not limited thereto. However, the material of the first and second bank patterns BNK1 and BNK2 is not limited to the above-described embodiments. In some embodiments, the first and second bank patterns BNK1 and BNK2 may include a conductive material.

Each of the first and second bank patterns BNK1 and BNK2 may have a section having a trapezoidal shape of which width becomes narrower toward the top thereof along the third direction DR3 from one surface (e.g., an upper surface) of the passivation layer PSV, but the present disclosure is not limited thereto. In some embodiments, as shown in FIG. 18, the first and second bank patterns BNK1 and BNK2 may include a curved surface having a section of a semi-elliptical shape, a semicircular shape (or hemispherical shape), or the like, of which width becomes narrower toward the top thereof along the third direction DR3 from one surface of the passivation layer PSV. When viewed on a section, the shape of the first and second bank patterns BNK1 and BNK2 is not limited to the above-described embodiments, and may be variously changed within a range in which the efficiency of light emitted from each of the light emitting elements LD can be improved. The first and second bank patterns BNK1 and BNK2 adjacent to each other in the first direction DR1 may be disposed on the same surface on the passivation layer PSV, and may have the same height (or thickness) in the third direction DR3.

The bank BNK may be provided and/or formed in a peripheral area of the pixel area PXA of each pixel PXL. The bank BNK may be the same component as the bank BNK described with reference to FIGS. 7-14.

The second electrode EL2 may be provided on the second bank pattern BNK2, and may be located in the middle of the pixel area PXA of each pixel PXL. The second electrode EL2 may have a quadrangular shape having first to fourth sides S1 to S4. The first electrode EL1 may be provided on the first bank pattern BNK1, and may have a shape surrounding the second electrode EL2 along the periphery (or circumference) of the second electrode EL2. The first electrode EL1 may have a ring shape which does not completely surround the second electrode EL2 but has any one portion A which is opened.

The first electrode EL1 and the second electrode EL2 may be disposed on the passivation layer PSV to be spaced from each other at a distance (e.g., a set or predetermined distance). Because each of the first and second electrodes EL1 and EL2 has a surface profile corresponding to the shape of the first and second bank patterns BNK1 and BNK2 disposed on the bottom thereof, light emitted from each of the light emitting elements LD may be reflected by the first and second electrodes EL1 and EL2, to further advance in the image display direction of the display device. The first and second bank patterns BNK1 and BNK2 and the first and second electrodes EL1 and EL2 may serve as a reflective member which improves the light efficiency of the display device by guiding light emitted from the light emitting elements LD in a desired direction.

A first insulating layer INS1 may be provided over the first and second electrodes EL1 and EL2. The first insulating layer INS1 may include a first opening OPN1 exposing one area of the first electrode EL1, e.g., a portion of the (1-1)th electrode EL1_1 to the outside and a second opening OPN2 exposing one area of the second electrode EL2 to the outside. Also, the first insulating layer INS1 may completely cover a portion of the (1-1)th electrode EL1_1 and the other areas except the one area of the second electrode EL2.

The first contact electrode CNE1 may be provided on the first insulating layer INS1 over the (1-1)th electrode EL1_1, and may be electrically connected to the (1-1)th electrode EL1_1 by the first opening OPN1.

The first intermediate electrode CTE1 may include a first area A1 and a second area A2. The second area A2 may be one area of the first intermediate electrode CTE1, which is located on the first insulating layer INS1 over one area of the second electrode EL2, which includes the first side S1, and the first area A1 may be one area of the first intermediate electrode CTE1, which is located on the first insulating layer INS1 over the (1-2)th electrode EL1_2.

The first contact electrode CNE1 and the second area A2 of the first intermediate electrode CTE1 may be disposed on the second insulating layer INS2 over first light emitting elements LD1 to be spaced from each other. The first light emitting elements LD1 may be light emitting elements LD disposed between the (1-1)th electrode EL1_1 and the one area of the second electrode EL2, which includes the first side S1, from among the light emitting elements LD.

The second intermediate electrode CTE2 may include a first area A1 and a second area A2. The second area A2 may be one area of the second intermediate electrode CTE2, which is located on the first insulating layer INS1 over one area of the second electrode EL2, which includes the second side S2, and the first area A1 may be one area of the second intermediate electrode CTE2, which is located on the first insulating layer INS1 over the (1-3)th electrode EL1_3.

The first area A1 of the first intermediate electrode CTE1 and the second area A2 of the second intermediate electrode CTE2 may be disposed on the second insulating layer INS2 over second light emitting elements LD2 to be spaced from each other. The second light emitting elements LD2 may be light emitting elements LD disposed between the (1-2)th electrode EL1_2 and the one area of the second electrode EL2, which includes the second side S2, from among the light emitting elements LD.

The third intermediate electrode CTE3 may include a first area A1 and a second area A2. The second area A2 may be one area of the third intermediate electrode CTE3, which is located on the first insulating layer INS1 over one area of the second electrode EL2, which includes the third side S3, and the first area A1 may be one area of the third intermediate electrode CTE3, which is located on the first insulating layer INS1 over the (1-4)th electrode EL1_4.

The first area A1 of the second intermediate electrode CTE2 and the second area A2 of the third intermediate electrode CTE3 may be disposed on the second insulating layer INS2 over third light emitting elements LD3 to be spaced from each other. The third light emitting elements LD3 may be light emitting elements LD disposed between the (1-3)th electrode EL1_3 and the one area of the second electrode EL2, which includes the third side S3, from among the light emitting elements LD.

The second contact electrode CNE2 may be provided on the first insulating layer INS1 over one area of the second electrode EL2, which includes the fourth side S4, and be electrically connected to the one area of the second electrode EL2 by the second opening OPN2.

The first area A1 of the third intermediate electrode CTE3 and the second contact electrode CNE2 may be disposed on the second insulating layer INS2 over fourth light emitting elements LD4. The fourth light emitting elements LD4 may be light emitting elements LD disposed between the (1-4)th electrode EL1_4 and the one area of the second electrode EL2, which includes the fourth side S4, from among the light emitting elements LD.

The first light emitting elements LD1 and the second light emitting elements LD2 may be electrically connected to each other through the first intermediate electrode CTE1, the second light emitting elements LD2 and the third light emitting elements LD3 may be electrically connected to each other through the second intermediate electrode CTE2, and the third light emitting elements LD3 and the fourth light emitting elements LD4 may be electrically connected to each other through the third intermediate electrode CTE3. The first to fourth light emitting elements LD1 to LD4 may be radially arranged along the first to fourth sides S1 to S4 of the second electrode EL2 between the first electrode EL1 and the second electrode EL2 to be located to concentrate on the middle (or center) of the pixel area PXA of each pixel PXL.

As described above, an intermediate electrode CTE (e.g., CTE1, CTE2, CTE3) is disposed between consecutive serial stages, a second electrode EL2 is disposed in the middle of the pixel area PXA, and a first electrode EL1 is disposed to surround the second electrode EL2 along the periphery of the second electrode, so that a light emitting unit EMU of each pixel PXL can be configured in a serial/parallel hybrid structure including four serial stages while reducing or minimizing an area occupied by alignment electrodes.

FIGS. 19A-19E are schematic plan views illustrating another embodiment of the first and second electrodes shown in FIG. 7.

In relation to first and second electrodes shown in FIGS. 19A-19E, portions different from those of the above-described embodiments will be mainly described to avoid redundancy.

Referring to FIGS. 1-6A, 7, and 19A-19E, first and second electrodes EL1 and EL2, first and second contact electrodes CNE1 and CNE2, and first to third intermediate electrodes CTE1 to CTE3 may be disposed in a pixel area PXA of each pixel PXL.

The second electrode EL2 may be located in the middle of the pixel area PXA, and may have a quadrangular shape including first to fourth sides S1 to S4.

The first electrode EL1 may be provided in a shape surrounding the first to fourth sides S1 to S4 of the second electrode EL2. The first electrode EL1 may include a (1-1)th electrode EL1_1 adjacent to the first side S1 of the second electrode EL2, a (1-2)th electrode EL1_2 adjacent to the second side S2 of the second electrode EL2, a (1-3)th electrode EL1_3 adjacent to the third side S3 of the second electrode EL2, and a (1-4)th electrode EL1_4 adjacent to the fourth side S4 of the second electrode EL2.

Figure 19A:
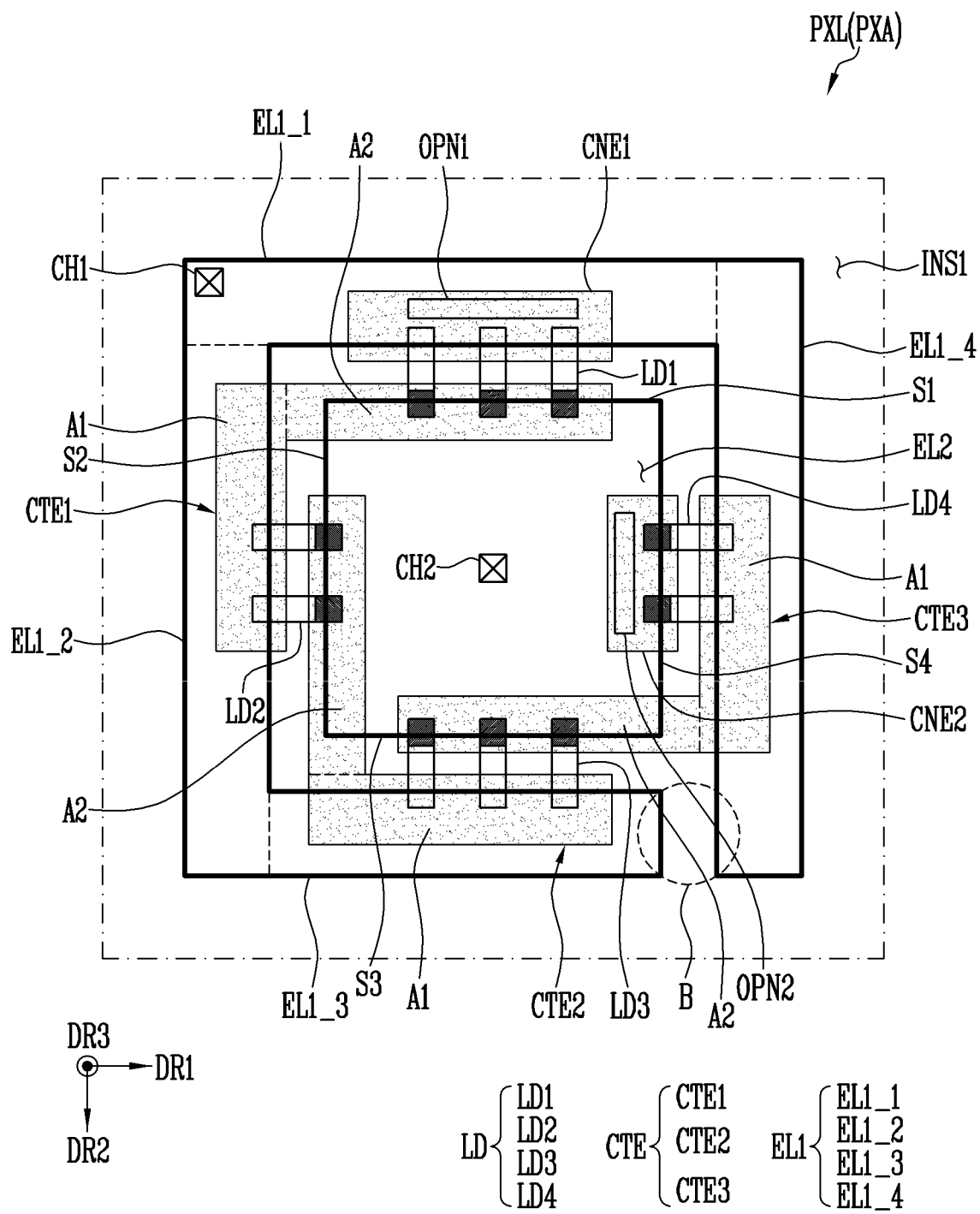
FIGS. 19A-19E are schematic plan views illustrating another example embodiment of the first and second electrodes shown in FIG. 7.

The first electrode EL1 surrounds the first to fourth sides S1 to S4 of the second electrode EL2, but, as shown in FIG. 19A, a portion of the first electrode EL1 may be removed between the (1-3)th electrode EL1_3 and the (1-4)th electrode EL1_4 not to completely surround the periphery (e.g., circumference) of the second electrode EL2. The first electrode EL1 may have a quadrangular ring shape in which one area B is opened. The (1-3)th electrode EL1_3 and the (1-4)th electrode EL1_4 may not be in contact with each other (or may be spaced from each other).

Figure 19B:
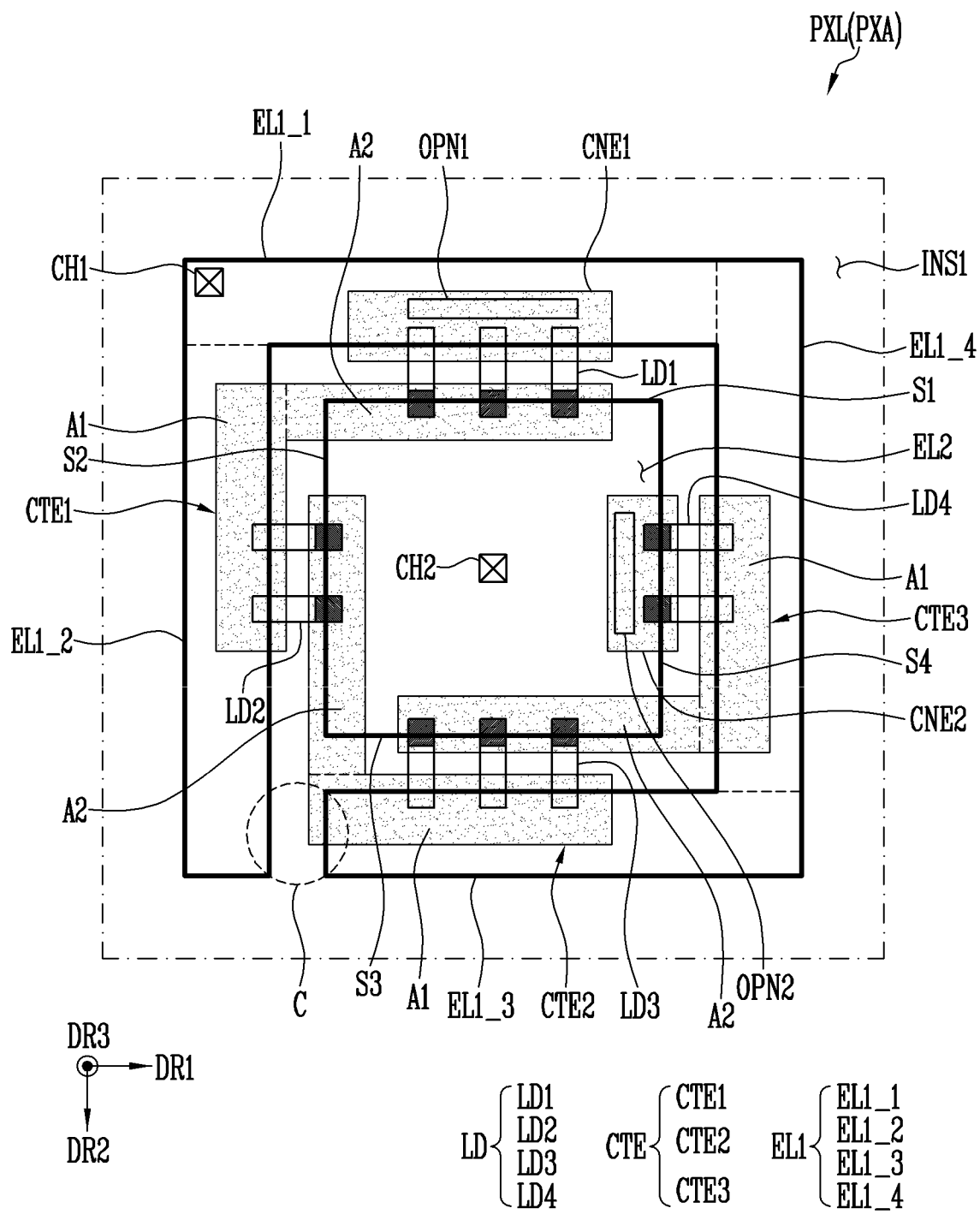

In some embodiments, the first electrode EL1 surrounds the first to fourth sides S1 to S4 of the second electrode EL2, but, as shown in FIG. 19B, a portion of the first electrode EL1 may be removed between the (1-2)th electrode EL1_2 and the (1-3)th electrode EL1_3 not to completely surround the periphery (e.g., circumference) of the second electrode EL2. The first electrode EL1 may have a quadrangular ring shape in which one area C is opened. The (1-2)th electrode EL1_2 and the (1-3)th electrode EL1_3 may not be in contact with each other (or may be spaced from each other at a predetermined distance).

Figure 19C:
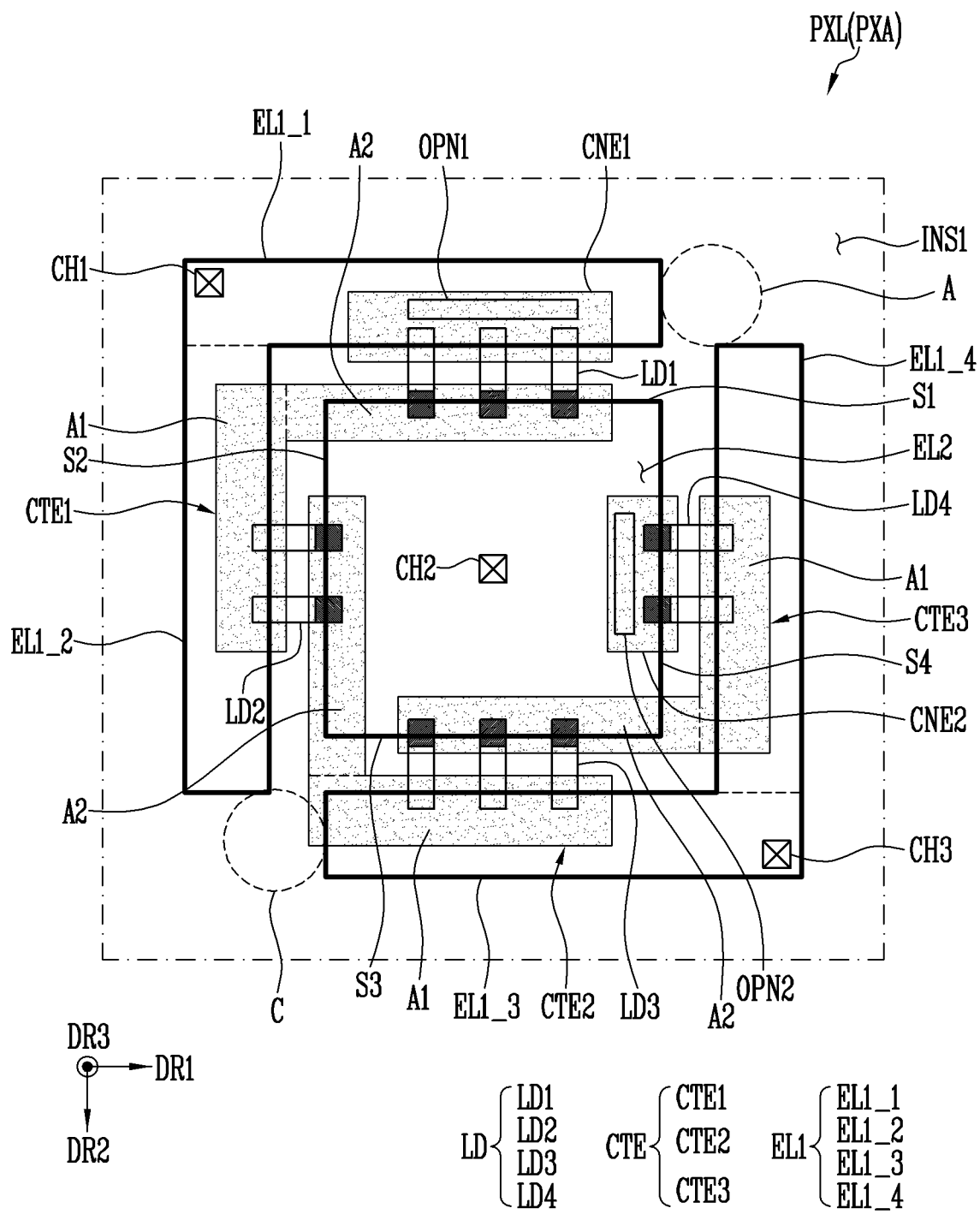

In another embodiment, the first electrode EL1 surrounds the first to fourth sides S1 to S4 of the second electrode EL2, but, as shown in FIG. 19C, a portion of the first electrode EL1 may be removed between the (1-1)th electrode EL1_1 and the (1-4)th electrode EL1_4 and a portion of the first electrode EL1 may be removed between the (1-2)th electrode EL1_2 and the (1-3)th electrode EL1_3, not to completely surround the periphery (or circumference) of the second electrode EL2. For example, the first electrode EL1 may have a quadrangular ring shape in which two areas A and C are opened. The (1-1)th electrode EL1_1 and the (1-4)th electrode EL1_4 may not be in contact with each other (or may be spaced from each other at a predetermined distance), the (1-2)th electrode EL1_2 and the (1-3)th electrode EL1_3 may not be in contact with each other (or may be spaced from each other at a predetermined distance), the (1-1)th electrode EL1_1 and the (1-2)th electrode EL1_2 may be in contact with each other, and the (1-3)th electrode EL1_3 and the (1-4)th electrode EL1_4 may be in contact with each other. The (1-1)th electrode EL1_1 may be electrically connected to a partial component, e.g., a driving transistor (see 'Tdr' shown in FIG. 9) of a pixel circuit layer (see 'PCL' shown in FIG. 9) through a first contact hole CH1. The (1-3)th electrode EL1_3 may be electrically connected to the driving transistor Tdr through a third contact hole CH3.

Figure 19D:
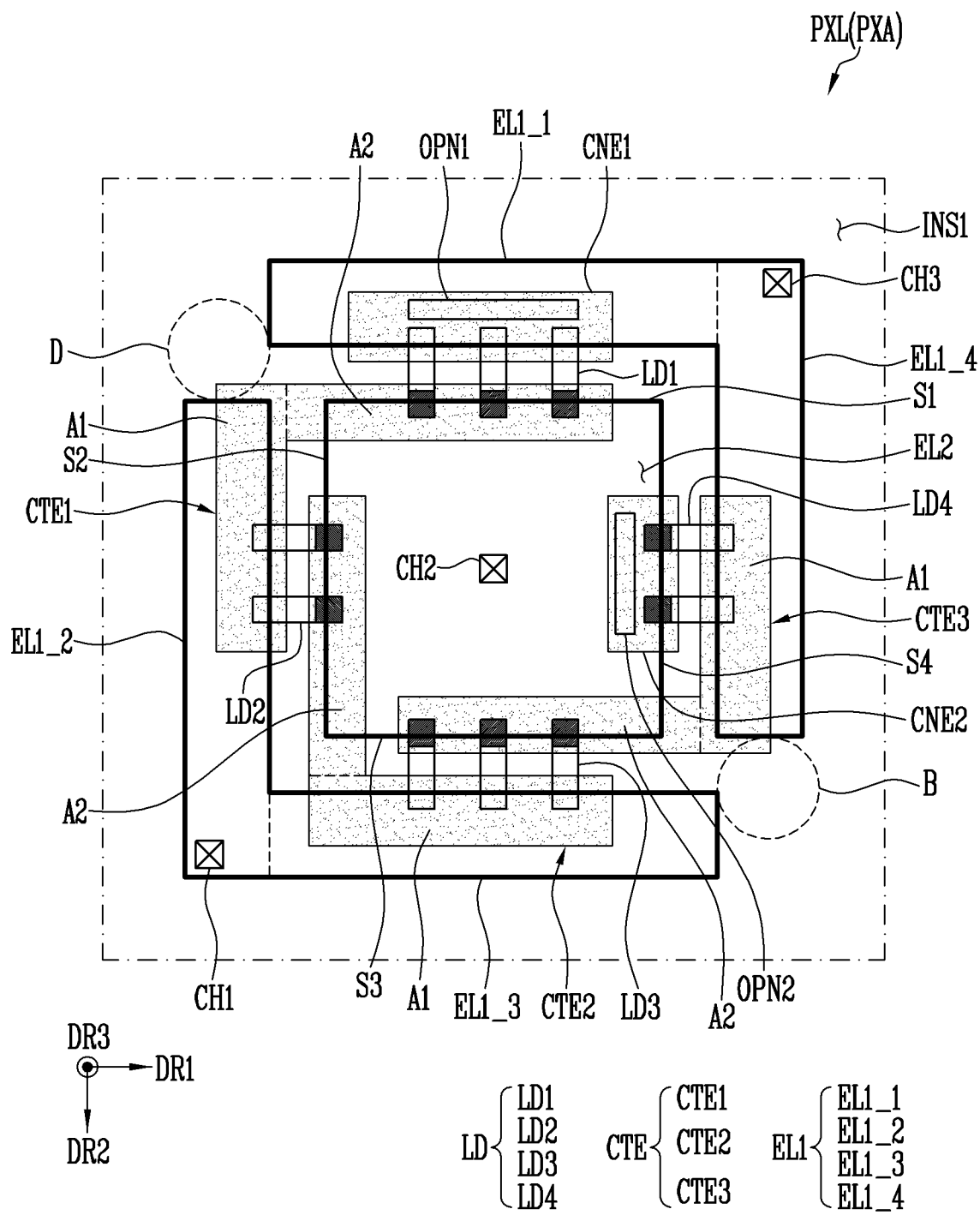

In still another embodiment, the first electrode EL1 surrounds the first to fourth sides S1 to S4 of the second electrode EL2, but, as shown in FIG. 19D, a portion of the first electrode EL1 may be removed between the (1-1)th electrode EL1_1 and the (1-2)th electrode EL1_2 and a portion of the first electrode EL1 may be removed between the (1-3)th electrode EL1_3 and the (1-4)th electrode EL1_4, not to completely surround the periphery (e.g., circumference) of the second electrode EL2. The first electrode EL1 may have a quadrangular ring shape in which two areas D and B are opened. The (1-1)th electrode EL1_1 and the (1-2)th electrode EL1_2 may not be in contact with each other (or may be spaced from each other at a predetermined distance), the (1-3)th electrode EL1_3 and the (1-4)th electrode EL1_4 may not be in contact with each other (or may be spaced from each other at a predetermined distance), the (1-2)th electrode EL1_2 and the (1-3)th electrode EL1_3 may be in contact with each other, and the (1-1)th electrode EL1_1 and the (1-4)th electrode EL1_4 may be in contact with each other. The (1-2)th electrode EL1_2 may be electrically connected to the driving transistor Tdr through a first contact hole CH1, and the (1-4)th electrode EL1_4 may be electrically connected to the driving transistor Tdr through a third contact hole CH3.

Figure 19E:
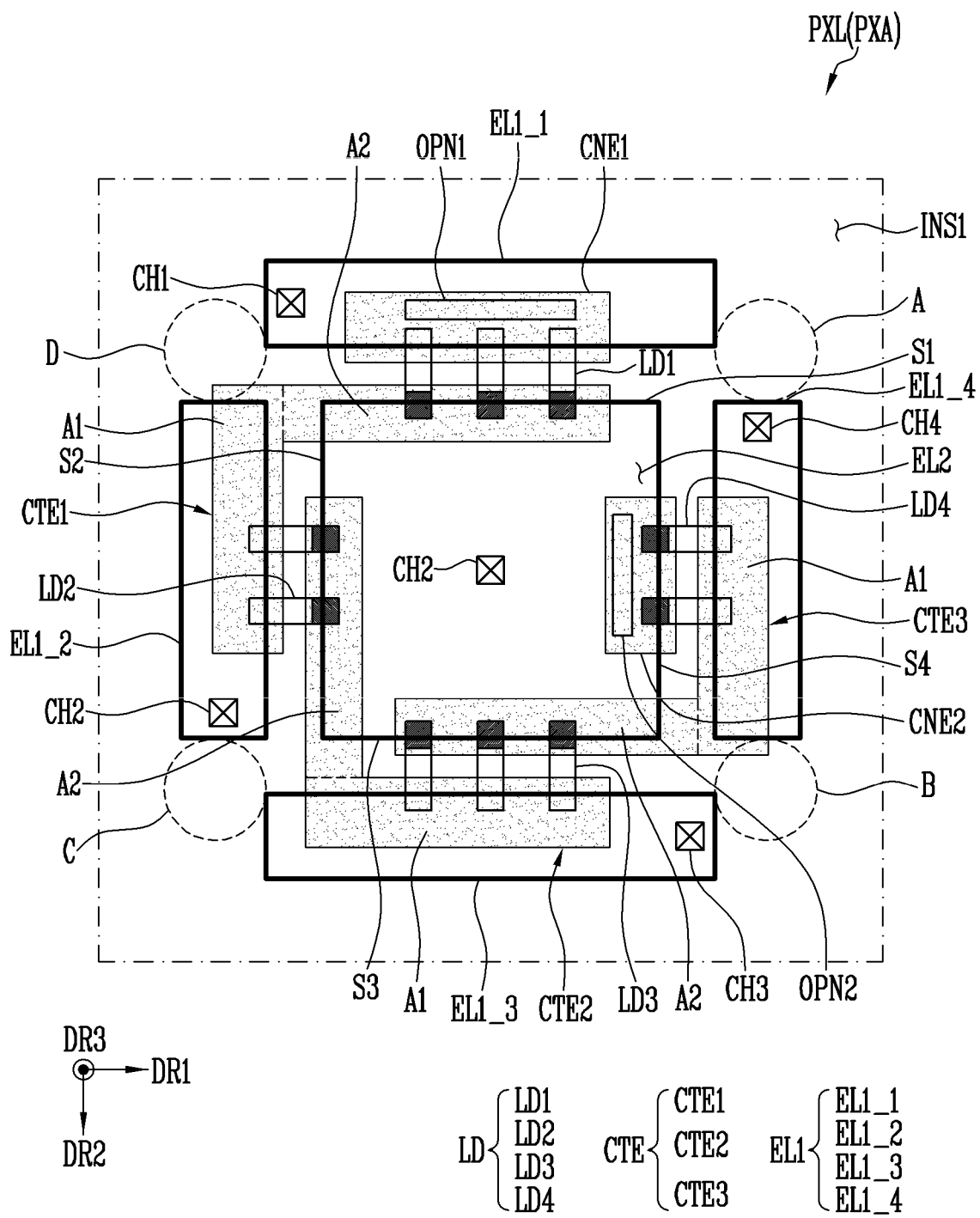

In still another embodiment, the first electrode EL1 surrounds the first to fourth sides S1 to S4 of the second electrode EL2, but, as shown in FIG. 19E, a portion D of the first electrode EL1 may be removed between the (1-1)th electrode EL1_1 and the (1-2)th electrode EL1_2, a portion C of the first electrode EL1 may be removed between the (1-2)th electrode EL1_2 and the (1-3)th electrode EL1_3, a portion B of the first electrode EL1 may be removed between the (1-3)th electrode EL1_3 and the (1-4)th electrode EL1_4, a portion A of the first electrode EL1 may be removed between the (1-4)th electrode EL1_4 and the (1-1)th electrode EL1_1, not to completely surround the periphery (e.g., circumference) of the second electrode EL2. The first electrode EL1 may have a quadrangular ring shape in which four areas A, B, C, and D are opened. The (1-1)th electrode EL1_1 and the (1-2)th electrode EL1_2 may not be in contact with each other (or may be spaced from each other at a predetermined distance), the (1-2)th electrode EL1_2 and the (1-3)th electrode EL1_3 may not be in contact with each other (or may be spaced from each other at a predetermined distance), the (1-3)th electrode EL1_3 and the (1-4)th electrode EL1_4 may not be in contact with each other (or may be spaced from each other at a predetermined distance), and the (1-4)th electrode EL1_4 and the (1-1)th electrode EL1_1 may not be in contact with each other (or may be spaced from each other at a predetermined distance). The (1-1)th electrode EL1_1 may be electrically connected to a partial component of the pixel circuit layer PCL through a first contact hole CH1, the (1-2)th electrode EL1_2 may be electrically connected to a partial component of the pixel circuit layer PCL through a second contact hole CH2, the (1-3)th electrode EL1_3 may be electrically connected to a partial component of the pixel circuit layer PCL through a third contact hole CH3, and the (1-4)th electrode EL1_4 may be electrically connected to a partial component of the pixel circuit layer PCL through a fourth contact hole CH4. A partial component of the pixel circuit layer PCL may be the driving transistor Tdr.

The shape of the first electrode EL1 is not limited to the above-described embodiments. In some embodiments, the first electrode EL1 may be changed in various shapes within a range in which the alignment area of light emitting elements LD located between the first electrode EL1 and the second electrode EL2 while surrounding at least a portion of the second electrode EL2 can be further secured.

Figure 20:
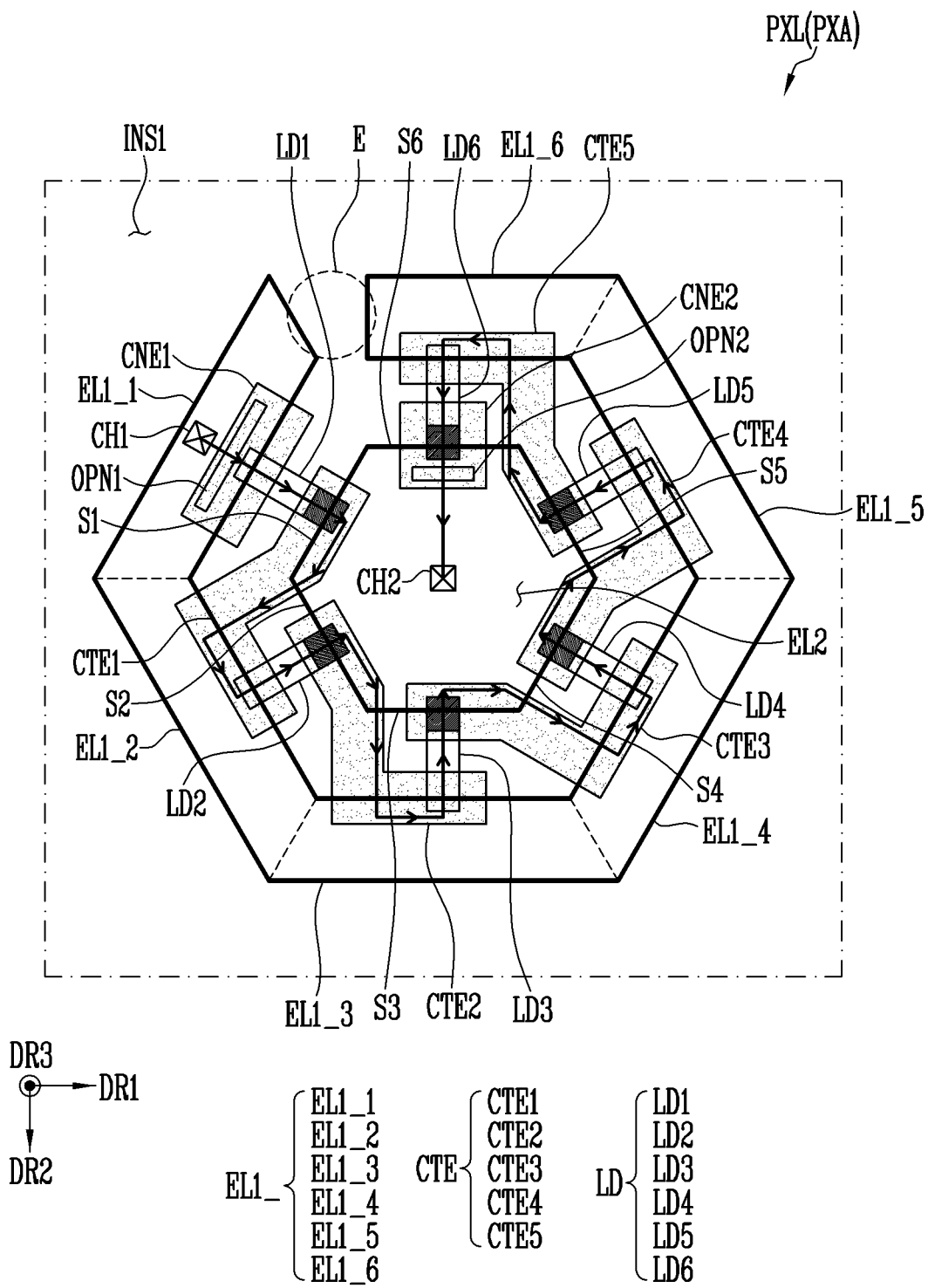
FIG. 20 schematically illustrates a pixel in accordance with still another example embodiment of the present disclosure, and is a schematic plan view of the pixel including only a partial configuration of a display element layer.

FIG. 20 schematically illustrates a pixel in accordance with still another embodiment of the present disclosure, and is a schematic plan view of the pixel including only a partial configuration of a display element layer.

Referring to FIGS. 1-6A and 20, first and second electrodes EL1 and EL2, an intermediate electrode CTE, and the light emitting elements LD may be disposed in a pixel area PXA of each pixel PXL.

The second electrode EL2 may have a hexagonal shape which is located in the middle (or center) of the pixel area PXA and is surrounded by first to sixth sides S1 to S6. In some example embodiments, the second electrode EL2 may have a regular hexagonal shape in which the first to sixth sides S1 to S6 have the same length. The second electrode EL2 may be electrically connected to a second contact electrode CNE2 by a second opening OPN2 of a first insulating layer INS1. Also, the second electrode EL2 may be electrically connected to a partial component of a pixel circuit layer (see 'PCL' shown in FIG. 9), e.g., a driving voltage line (see DVL' shown in FIG. 9) through a second contact hole CH2.

The first electrode EL1 may have a certain shape (e.g., a hexagonal ring shape) and may surround the second electrode EL2 along the periphery (e.g., circumference (or edge)) of the second electrode EL2. In some example embodiments, the first electrode EL1 may have a shape that does not completely surround the periphery (e.g., circumference) of the second electrode EL2, e.g., a hexagonal ring shape that does not form a complete hexagonal ring shape but has any one portion E that is opened. However, the present disclosure is not limited thereto, and the first electrode EL1 may be changed to have a shape corresponding to that of the second electrode EL2. For example, when the second electrode EL2 has a pentagonal shape having five sides, the first electrode EL1 may have a polygonal ring shape such as a pentagonal ring shape having an opened portion while surrounding the periphery (e.g., circumference) of the second electrode EL2. When the second electrode EL2 has an octagonal shape having eight sides, the first electrode EL1 may have an octagonal ring shape such as an octagonal ring shape having an open portion while surrounding the second electrode EL2 along the periphery (e.g., circumference) of the second electrode.

The first electrode EL1 and the second electrode EL2 may be spaced from each other at a predetermined distance. The first electrode EL1 may be electrically connected to a first contact electrode CNE1 by a first opening OPN1 of the first insulating layer INS1. Also, the first electrode EL1 may be electrically connected to a driving transistor (see 'Tdr' shown in FIG. 9) of the pixel circuit layer PCL through a first contact hole CH1.

The first electrode EL1 may include (1-1)th to (1-6)th electrodes EL1_1 to EL1_6. The (1-1)th to (1-6)th electrodes EL1_1 to EL1_6 may be integrally provided to be connected to each other, and may be different areas of the first electrode EL1. In an example, the (1-1)th electrode EL1_1 may be one area of the first electrode EL1, which is adjacent to the first side S1 of the second electrode EL2, the (1-2)th electrode EL1_2 may be one area of the first electrode EL1, which is adjacent to the second side S2 of the second electrode EL2, the (1-3)th electrode EL1_3 may be one area of the first electrode EL1, which is adjacent to the third side S3 of the second electrode EL2, the (1-4)th electrode EL1_4 may be one area of the first electrode EL1, which is adjacent to the fourth side S4 of the second electrode EL2, the (1-5)th electrode EL1_5 may be one area of the first electrode EL1, which is adjacent to the fifth side S5 of the second electrode EL2, and the (1-6)th electrode EL1_6 may be one area of the first electrode EL1, which is adjacent to the sixth side S6 of the second electrode EL2.

In the pixel area PXA, a plurality of light emitting elements LD may be aligned and/or provided each of between the (1-1)th electrode EL1_1 and one area of the second electrode EL2, which includes the first side S1, between the (1-2)th electrode EL1_2 and one area of the second electrode EL2, which includes the second side S2, between the (1-3)th electrode EL1_3 and one area of the second electrode EL2, which includes the third side S3, between the (1-4)th electrode EL1_4 and one area of the second electrode EL2, which includes the fourth side S4, between the (1-5)th electrode EL1_5 and one area of the second electrode EL2, which includes the fifth side S5, and between the (1-6)th electrode EL1_6 and one area of the second electrode EL2, which includes the sixth side S6.

When the second electrode EL2 is located in the middle of the pixel area PXA, and the first electrode EL1 surrounds the second electrode EL2 along the periphery of the second electrode EL2, an alignment signal (or alignment voltage) is applied to each of the first and second electrodes EL1 and EL2. Then, an electric field may be formed in the same direction along the periphery (e.g., circumference) of the second electrode EL2 between the first electrode EL1 and the second electrode EL2. Light emitting elements LD supplied to the pixel area PXA may be arranged in the same direction between the first electrode EL1 and the second electrode EL2. For example, one end portion of each of the light emitting elements LD may face the first electrode EL1, and the other end portion of each of the light emitting elements LD may face the second electrode EL2.

The light emitting elements LD may include at least one first light emitting element LD1 aligned between the (1-1)th electrode EL1_1 and the one area of the second electrode EL2, which includes the first side S1, at least one second light emitting element LD2 aligned between the (1-2)th electrode EL1_2 and the one area of the second electrode EL2, which includes the second side S2, at least one third light emitting element LD3 aligned between the (1-3)th electrode EL1_3 and the one area of the second electrode EL2, which includes the third side S3, at least one fourth light emitting element LD4 aligned between the (1-4)th electrode EL1_4 and the one area of the second electrode EL2, which includes the fourth side S4, at least one fifth light emitting element LD5 aligned between the (1-5)th electrode EL1_5 and the one area of the second electrode EL2, which includes the fifth side S5, and at least one sixth light emitting element LD6 aligned between the (1-6)th electrode EL1_6 and the one area of the second electrode EL2, which includes the sixth side S6.

The (1-1)th electrode EL1_1 and the one area of the second electrode EL2, which includes the first side S1, along with the first light emitting element LD1 aligned (or connected) therebetween may constitute a first serial stage SET1 of a light emitting unit EMU of each pixel PXL.

The (1-2)th electrode EL1_2 and the one area of the second electrode EL2, which includes the second side S2, along with the second light emitting element LD2 aligned (or connected) therebetween may constitute a second serial stage SET2 of the light emitting unit EMU.

The (1-3)th electrode EL1_3 and the one area of the second electrode EL2, which includes the third side S3, along with the third light emitting element LD3 aligned (or connected) therebetween may constitute a third serial stage SET3 of the light emitting unit EMU.

The (1-4)th electrode EL1_4 and the one area of the second electrode EL2, which includes the fourth side S4, along with the fourth light emitting element LD4 aligned (or connected) therebetween may constitute a fourth serial stage SET4 of the light emitting unit EMU.

The (1-5)th electrode EL1_5 and the one area of the second electrode EL2, which includes the fifth side S5, along with the fifth light emitting element LD5 aligned (or connected) therebetween may constitute a fifth serial stage SET5 of the light emitting unit EMU.

The (1-6)th electrode EL1_6 and the one area of the second electrode EL2, which includes the sixth side S6, along with the sixth light emitting element LD6 aligned (or connected) therebetween may constitute a sixth serial stage SET6 of the light emitting unit EMU.

The first contact electrode CNE1 may be provided on each of the (1-1)th electrode EL1_1 and one end portion of the first light emitting element LD1. The first contact electrode CNE1 may be electrically connected to each of the (1-1)th electrode EL1_1 and the first light emitting element LD1.

The second contact electrode CNE2 may be provided on each of the one area of the second electrode EL2, which includes the sixth side S6, and the other end portion of the sixth light emitting element LD6. The second contact electrode CNE2 may be electrically connected to each of the one area of the second electrode EL2, which includes the sixth side S6, and the sixth light emitting element LD6.

In some example embodiments of the present disclosure, the intermediate electrode CTE may include first to fifth intermediate electrodes CTE1 to CTE5. The intermediate electrode CTE may be provided in the same layer as the first and second contact electrodes CNE1 and CNE2, include the same material as the first and second contact electrodes CNE1 and CNE2, and may be formed through the same process as the first and second contact electrodes CNE1 and CNE2. However, the present disclosure is not limited thereto. In some embodiments, the intermediate electrode CTE may be provided in a layer different from that of the first and second contact electrodes CNE1 and CNE2, and may be formed through a process different from that of the first and second contact electrodes CNE1 and CNE2.

The first intermediate electrode CTE1 may be provided on each of the one area of the second electrode EL2, which includes the first side S1, and the (1-2)th electrode EL1_2, to overlap with the one area of the second electrode EL2 and the (1-2)th electrode EL1_2. The first intermediate electrode CTE1 may be provided on a first corner part of the second electrode EL2, at which the first side S1 and the second side S2 are in contact with (or meet) each other, to overlap with the first corner part. Also, the first intermediate electrode CTE1 may be provided on each of the other end portion of the first light emitting element LD1 and one end portion of the second light emitting element LD2. The first intermediate electrode CTE1 may serve as a first bridge electrode (or first connection electrode) electrically connecting the first light emitting element LD1 and the second light emitting element LD2. The first intermediate electrode CTE1 may be the first bridge electrode (or first connection electrode) connecting the first serial stage SET1 and the second serial stage SET2.

The second intermediate electrode CTE2 may be provided on each of the one area of the second electrode EL2, which includes the second side S2, and the (1-3)th electrode EL1_3, to overlap with the one area of the second electrode EL2 and the (1-3)th electrode EL1_3. The second intermediate electrode CTE2 may be provided on a second corner part of the second electrode EL2, at which the second side S2 and the third side S3 are in contact with (or meet) each other, to overlap with the second corner part. Also, the second intermediate electrode CTE2 may be provided on each of the other end portion of the second light emitting element LD2 and one end portion of the third light emitting element LD3. The second intermediate electrode CTE2 may serve as a second bridge electrode (or second connection electrode) electrically connecting the second light emitting element LD2 and the third light emitting element LD3. The second intermediate electrode CTE2 may be the second bridge electrode (or second connection electrode) connecting the second serial stage SET2 and the third serial stage SET3.

The third intermediate electrode CTE3 may be provided on each of the one area of the second electrode EL2, which includes the third side S3, and the (1-4)th electrode EL1_4, to overlap with the one area of the second electrode EL2 and the (1-4)th electrode EL1_4. The third intermediate electrode CTE3 may be provided on a third corner part of the second electrode EL2, at which the third side S3 and the fourth side S4 are in contact with (or meet) each other, to overlap with the third corner part. Also, the third intermediate electrode CTE3 may be provided on each of the other end portion of the third light emitting element LD3 and one end portion of the fourth light emitting element LD4. The third intermediate electrode CTE3 may serve as a third bridge electrode (or third connection electrode) electrically connecting the third light emitting element LD3 and the fourth light emitting element LD4. The third intermediate electrode CTE3 may be the third bridge electrode (or third connection electrode) connecting the third serial stage SET3 and the fourth serial stage SET4.

The fourth intermediate electrode CTE4 may be provided on each of the one area of the second electrode EL2, which includes the fourth side S4, and the (1-5)th electrode EL1_5, to overlap with the one area of the second electrode EL2 and the (1-5)th electrode EL1_5. The fourth intermediate electrode CTE4 may be provided on a fourth corner part of the second electrode EL2, at which the fourth side S4 and the fifth side S5 are in contact with (or meet) each other, to overlap with the fourth corner part. Also, the fourth intermediate electrode CTE4 may be provided on each of the other end portion of the fourth light emitting element LD4 and one end portion of the fifth light emitting element LD5. The fourth intermediate electrode CTE4 may serve as a fourth bridge electrode (or fourth connection electrode) electrically connecting the fourth light emitting element LD4 and the fifth light emitting element LD5. The fourth intermediate electrode CTE4 may be the fourth bridge electrode (or fourth connection electrode) connecting the fourth serial stage SET4 and the fifth serial stage SET5.

The fifth intermediate electrode CTE5 may be provided on each of the one area of the second electrode EL2, which includes the fifth side S5, and the (1-6)th electrode EL1_6, to overlap with the one area of the second electrode EL2 and the (1-6)th electrode EL1_6. The fifth intermediate electrode CTE5 may be provided on a fifth corner part of the second electrode EL2, at which the fifth side S5 and the sixth side S6 are in contact with (or meet) each other, to overlap with the fifth corner part. Also, the fifth intermediate electrode CTE5 may be provided on each of the other end portion of the fifth light emitting element LD5 and one end portion of the sixth light emitting element LD6. The fifth intermediate electrode CTE5 may serve as a fifth bridge electrode (or fifth connection electrode) electrically connecting the fifth light emitting element LD5 and the sixth light emitting element LD6. The fifth intermediate electrode CTE5 may be the fifth bridge electrode (or fifth connection electrode) connecting the fifth serial stage SET5 and the sixth serial stage SET6.

A sixth corner part of the second electrode EL2, at which the sixth side S6 and the first side S1 are in contact with (or meet) each other, may not overlap with the above-described first to fifth intermediate electrodes CTE1 to CTE5.

In the pixel area PXA of each pixel PXL, the first and second contact electrodes CNE1 and CNE2 and the first to fifth intermediate electrodes CTE1 to CTE5 may be disposed to be spaced from each other when viewed on a plane.

When assuming that a driving current flows from a first power line PL1 to the driving voltage line DVL by the driving transistor Tdr of the pixel circuit layer PCL included in each pixel PXL, the driving current may be introduced to the light emitting unit EMU of each pixel PXL through the first contact hole CH1.

In an example, a driving current is supplied to the (1-1)th electrode EL1_1 through the first contact hole CH1, and flows in the first intermediate electrode CTE1 via the first light emitting element LD1 through the first contact electrode CNE1. Accordingly, the first light emitting element LD1 in the first serial stage SET1 can emit light with a luminance corresponding to a current divided and applied thereto.

The driving current flowing in the first intermediate electrode CTE1 flows in the second intermediate electrode CTE2 via the second light emitting element LD2. Accordingly, the second light emitting element LD2 in the second serial stage SET2 can emit light with a luminance corresponding to a current divided and applied thereto.

The driving current flowing in the second intermediate electrode CTE2 flows in the third intermediate electrode CTE3 via the third light emitting element LD3. Accordingly, the third light emitting element LD3 in the third serial stage SET3 can emit light with a luminance corresponding to a current divided and applied thereto.

The driving current flowing in the third intermediate electrode CTE3 flows in the fourth intermediate electrode CTE4 via the fourth light emitting element LD4. Accordingly, the fourth light emitting element LD4 in the fourth serial stage SET4 can emit light with a luminance corresponding to a current divided and applied thereto.

The driving current flowing in the fourth intermediate electrode CTE4 flows in the fifth intermediate electrode CTE5 via the fifth light emitting element LD5. Accordingly, the fifth light emitting element LD5 in the fifth serial stage SET5 can emit light with a luminance corresponding to a current divided and applied thereto.

The driving current flowing in the fifth intermediate electrode CTE5 flows in the second contact electrode CNE2 via the sixth light emitting element LD6. Accordingly, the sixth light emitting element LD6 in the sixth serial stage SET6 can emit light with a luminance corresponding to a current divided and applied thereto.

In the above-described manner, a driving current of each pixel PXL flows by sequentially passing through the first light emitting element LD1 of the first serial stage SET1, the second light emitting element LD2 of the second serial stage SET2, the third light emitting element LD3 of the third serial stage SET3, the fourth light emitting element LD4 of the fourth serial stage SET4, the fifth light emitting element LD5 of the fifth serial stage SET5, and the sixth light emitting element LD6 of the sixth serial stage SET6. Accordingly, each pixel PXL can emit light with a luminance corresponding to a data signal supplied during each frame period.

In accordance with the present disclosure, there can be provided a pixel in which a first electrode having a quadrangular shape is disposed in the middle (or center) of a pixel area of each pixel and a second electrode surrounding the first electrode is disposed, so that the alignment area of light emitting elements between the first and second electrodes can be sufficiently secured.

Further, in accordance with the present disclosure, there can be provided a pixel and a display device including the same, in which a light emitting unit configured with a plurality of serial stages is implemented by disposing an intermediate electrode overlapping with each of one area of a first electrode and one area of a second electrode, so that the light output efficiency of light emitting elements can be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A pixel comprising:
   a first electrode;
   a second electrode surrounding at least a portion of the first electrode;
   a plurality of light emitting elements between the first electrode and the second electrode;
   a first contact electrode on the first electrode, the first contact electrode electrically connecting the first electrode and the plurality of light emitting elements;
   a second contact electrode on the second electrode, the second contact electrode electrically connecting the second electrode and the plurality of light emitting elements; and
   an intermediate electrode on the first electrode and the second electrode, the intermediate electrode comprising a first area overlapping the first electrode and a second area overlapping the second electrode,
   the first area and the second area being integrally connected to each other.

2. The pixel of claim 1, wherein the first contact electrode, the second contact electrode, and the intermediate electrode are spaced from each other,
   wherein the intermediate electrode is at a same layer as the first and second contact electrodes or is provided in a layer different from that of the first and second contact electrodes.

3. The pixel of claim 2, wherein the first electrode has a quadrangular shape comprising a first side, a second side, a third side and a fourth side,
   wherein the second electrode comprises a (2-1)th electrode adjacent to the first side of the first electrode, a (2-2)th electrode adjacent to the second side of the first electrode, a (2-3)th electrode adjacent to the third side of the first electrode, and a (2-4)th electrode adjacent to the fourth side of the first electrode.

4. The pixel of claim 3, wherein the second electrode has a quadrangular ring shape and surrounds the first to fourth sides of the first electrode and has at least an opening.

5. The pixel of claim 4, wherein the (2-1)th electrode and the (2-4)th electrode are spaced from each other.

6. The pixel of claim 4, wherein the (2-2)th electrode and the (2-3)th electrode are spaced from each other.

7. The pixel of claim 4, wherein the (2-1)th electrode and the (2-2)th electrode are spaced from each other,
   the (2-3)th electrode and the (2-4)th electrode are spaced from each other,
   the (2-1)th electrode and the (2-4)th electrode are connected to each other, and
   the (2-2)th electrode and the (2-3)th electrode are connected to each other.

8. The pixel of claim 3, wherein the intermediate electrode comprises a first intermediate electrode, a second intermediate electrode, and a third intermediate electrode that are spaced from each other,
   wherein each of the first intermediate electrode, the second intermediate electrode, and the third intermediate electrode overlaps with one area of the first electrode and one area of the second electrode.

9. The pixel of claim 8, wherein the first intermediate electrode comprises a first area corresponding to the first side of the first electrode and a second area corresponding to the (2-2)th electrode,
   the second intermediate electrode comprises a first area corresponding to the second side of the first electrode and a second area corresponding to the (2-3)th electrode, and
   the third intermediate electrode comprises a first area corresponding to the third side of the first electrode and a second area corresponding to the (2-4)th electrode.

10. The pixel of claim 9, wherein, when in a plan view, the first intermediate electrode overlaps with each of the first side of the first electrode, a first corner part at which the first side and the second side of the first electrode are in contact with each other, and the (2-2)th electrode,
    in a plan view, the second intermediate electrode overlaps with each of the second side of the first electrode, a second corner part at which the second side and the third side of the first electrode are in contact with each other, and the (2-3)th electrode, and
    in a plan view, the third intermediate electrode overlaps with each of the third side of the first electrode, a third corner part at which the third side and the fourth side of the first electrode are in contact with each other, and the (2-4)th electrode.

11. The pixel of claim 9, wherein the first contact electrode overlaps with the fourth side of the first electrode, and the second contact electrode overlaps with the (2-1)th electrode.

12. The pixel of claim 11, further comprising an insulating layer over the first and second electrodes,
    wherein the insulating layer includes a first opening exposing one area of the first electrode, which corresponds to the fourth side of the first electrode, and a second opening exposing one area of the (2-1)th electrode.

13. The pixel of claim 12, wherein the insulating layer covers an other area of the first electrode, which corresponds to each of the first to third sides of the first electrode, the (2-2)th electrode, the (2-3)th electrode, and the (2-4)th electrode.

14. The pixel of claim 12, wherein the light emitting elements comprise:
a plurality of first light emitting elements located between the first side of the first electrode and the (2-1)th electrode;
a plurality of second light emitting elements located between the second side of the first electrode and the (2-2)th electrode;
a plurality of third light emitting elements located between the third side of the first electrode and the (2-3)th electrode; and
a plurality of fourth light emitting elements located between the fourth side of the first electrode and the (2-4)th electrode.

15. The pixel of claim 14, wherein:
the first light emitting elements constitute a first serial stage connected in parallel between the first side of the first electrode and the (2-1)th electrode,
the second light emitting elements constitute a second serial stage connected in parallel between the second side of the first electrode and the (2-2)th electrode,
the third light emitting elements constitute a third serial stage connected in parallel between the third side of the first electrode and the (2-3)th electrode, and
the fourth light emitting elements constitute a fourth serial stage connected in parallel between the fourth side of the first electrode and the (2-4)th electrode.

16. The pixel of claim 1, wherein, in a plan view, the plurality of light emitting elements are placed along a periphery of the first electrode between the first electrode and the second electrode.

17. The pixel of claim 16, wherein the first electrode has a hexagonal shape comprising a first side, a second side, a third side, a fourth side, a fifth side, and a sixth side,
wherein the second electrode comprises:
a (2-1)th electrode adjacent to the first side of the first electrode;
a (2-2)th electrode adjacent to the second side of the first electrode;
a (2-3)th electrode adjacent to the third side of the first electrode;
a (2-4)th electrode adjacent to the fourth side of the first electrode;
a (2-5)th electrode adjacent to the fifth side of the first electrode; and
a (2-6)th electrode adjacent to the sixth side of the first electrode.

18. The pixel of claim 17, wherein the light emitting elements comprise:
at least one first light emitting element between the first side of the first electrode and the (2-1)th electrode;
at least one second light emitting element between the second side of the first electrode and the (2-2)th electrode;
at least one third light emitting element between the third side of the first electrode and the (2-3)th electrode;
at least one fourth light emitting element between the fourth side of the first electrode and the (2-4)th electrode;
at least one fifth light emitting element between the fifth side of the first electrode and the (2-5)th electrode; and
at least one sixth light emitting element between the sixth side of the first electrode and the (2-6)th electrode.

19. A display device comprising:
a substrate comprising a plurality of pixel areas; and
a pixel in each of the pixel areas,
the pixel comprising:
a first electrode on the substrate and a second electrode surrounding at least a portion of the first electrode;
a plurality of light emitting elements between the first electrode and the second electrode;
a first contact electrode on the first electrode, the first contact electrode electrically connecting the first electrode and the light emitting elements;
a second contact electrode on the second electrode, the second contact electrode electrically connecting the second electrode and the light emitting elements; and
an intermediate electrode on the first and second electrodes, the intermediate electrode comprising a first area overlapping the first electrode and a second area overlapping the second electrode,
the first area and the second area being integrally connected to each other,
and the first contact electrode, the second contact electrode, and the intermediate electrode are at a same layer.

20. The display device of claim 19, wherein the first electrode has a quadrangular shape comprising first to fourth sides,
wherein the second electrode comprises a (2-1)th electrode adjacent to the first side of the first electrode, a (2-2)th electrode adjacent to the second side of the first electrode, a (2-3)th electrode adjacent to the third side of the first electrode, and a (2-4)th electrode adjacent to the fourth side of the first electrode.

* * * * *